US008674764B2

(12) United States Patent
Kondo

(10) Patent No.: US 8,674,764 B2
(45) Date of Patent: Mar. 18, 2014

(54) HIGH-FREQUENCY POWER AMPLIFYING DEVICE

(75) Inventor: Masao Kondo, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 30 days.

(21) Appl. No.: 13/557,643

(22) Filed: Jul. 25, 2012

(65) Prior Publication Data

US 2013/0057343 A1 Mar. 7, 2013

(30) Foreign Application Priority Data

Sep. 6, 2011 (JP) .................................. 2011-193675

(51) Int. Cl.
*H03F 3/45* (2006.01)
(52) U.S. Cl.
USPC ......................................... 330/252; 330/165
(58) Field of Classification Search
USPC .................... 330/252, 165, 276, 69
See application file for complete search history.

(56) References Cited

U.S. PATENT DOCUMENTS

| 7,728,661 | B2 * | 6/2010 | Bockelman et al. | ............. 330/51 |
| 7,936,215 | B2 * | 5/2011 | Lee et al. | ....................... 330/195 |
| 7,944,296 | B1 * | 5/2011 | Lee et al. | ....................... 330/195 |
| 8,461,927 | B2 * | 6/2013 | Kawakami et al. | ........... 330/276 |

* cited by examiner

*Primary Examiner* — Henry Choe
(74) *Attorney, Agent, or Firm* — Mattingly & Malur, PC

(57) ABSTRACT

The present invention provides a high-frequency power amplifying device capable of transmitting output power at high efficiency. For example, a high-frequency power amplifying device has first and second differential amplifiers and a transformer for matching output impedances of the differential amplifiers. Between differential output nodes of the first differential amplifier, an inductor, a switch, and an inductor are coupled in series. When the second differential amplifier is in an operating state and the first differential amplifier is in a non-operating state, the switch is controlled to be on. In this case, due to "off capacitance" in transistors of a differential pair included in the first differential amplifier, impedance on the first differential amplifier side seen from both ends of primary coils becomes a high impedance state (parallel resonance state) and, equivalently, the primary coils do not exert influence on the operation of the second differential amplifier.

17 Claims, 34 Drawing Sheets

HIGH-FREQUENCY POWER AMPLIFYING DEVICE

CROSS-REFERENCE TO RELATED APPLICATIONS

The disclosure of Japanese Patent Application No. 2011-193675 filed on Sep. 6, 2011 including the specification, drawings and abstract is incorporated herein by reference in its entirety.

BACKGROUND

The present invention relates to a high-frequency power amplifying device and, more particularly, to a technique effectively applied to a high-frequency power amplifying device used for a transmitter of a cellular phone.

For example, Patent Literature 1 discloses a configuration having an amplifier for a high-output mode, an amplifier for an intermediate-output mode, an amplifier for a low-output mode, and a transformer for combining outputs of the amplifiers. For example, in operation in the high-output mode, the amplifier for the intermediate-output mode and the amplifier for the low-output mode are controlled in a high-impedance state or a low-impedance state.

RELATED ART LITERATURE

Patent Literature

U.S. Pat. No. 7,728,661

SUMMARY

In recent years, reduction in size and cost of a wireless communication device typified by a cellular phone is accelerating. In a high-frequency power amplifying device which outputs predetermined transmission power to an antenna, for smaller size and lower cost, decrease in the number of parts is demanded. For example, in the case of using a high-frequency power amplifying device using a transformer as an output matching circuit as disclosed in Patent Literature 1, there is a case such that the output matching circuit and a power amplifier can be formed in the same semiconductor chip. It is advantageous from the view of reduction in the number of parts.

FIG. 1 is a circuit diagram showing an example of the configuration of a high-frequency power amplifying device examined as a precondition of the present invention. A high-frequency power amplifying device illustrated in FIG. 1 has three differential amplifiers AD11, AD12, and AD13 and three transformers TR11, TR12, and TR13. Output of AD11, AD12, and AD13 are supplied to primary coils LD11 and LD12, LD13 and LD14, and LD15 and LD16 of the transformers TR11, TR12, and TR13, respectively, and secondary coils LD21, LD22, and LD23 of the transformers TR11, TR12, and TR13 are coupled in series.

The differential amplifiers AD11, AD12, and AD13 correspond to different power modes (for example, a high-power mode, an intermediate-power mode, and a low-power mode). In the case where a specific power mode (for example, the high-power mode) is selected, the corresponding differential amplifier (for example, AD11) is set to an operating state, and the other differential amplifiers (AD12 and AD13) are set to a non-operating state. In the non-operating state, the differential amplifier is controlled either in the high-impedance state or the low-impedance state. Concretely, in the high-imped-ance state, a transistor as a component of the differential amplifier is set to the off state. In the low-impedance state, a transistor in the differential amplifier is set to the on state. The inventors of the present invention have found out, through their examination, that when such a method is used, a problem to be described may occur.

FIG. 2 is a circuit diagram showing an example of an equivalent circuit of a differential amplifier which is controlled in the high-impedance state in association with the non-operating state and the transformer corresponding to the differential amplifier in the high-frequency power amplifying device of FIG. 1. In FIG. 2, it is regarded that, for example, the differential amplifier AD11 in FIG. 1 is controlled in the high impedance state and is constructed by a differential pair of MOSFETs. In the high impedance state, the differential pair (MOSFETs) of AD11 is controlled to be off. In reality, however, parasitic capacitances CP11 and CP12 remain between the source and drain of the MOSFETs. For impedance adjustment, a capacitance CD11 is coupled to outputs of AD11.

By the capacitances, both ends of the primary coils LD11 and LD12 of the transformer TR11 are coupled at higher frequencies, and a closed circuit is constructed. Consequently, the impedance seen from the secondary coil of TR11 to the primary coil side is not in a complete open state but has some value. As a result, the some impedance disturbs impedance matching between the differential amplifier which is in the operating state and a load (R1 in FIG. 1), so that the efficiency of transmitting output power of the power amplifier may deteriorate. To prevent the deterioration, there is the possibility that the circuit configuration of the power amplifier may be complicated. In particular, in the case of setting a differential amplifier for the high-power mode to the non-operating state, since the size of the transistors of the differential amplifier is large, the parasite capacitance is large, and the value of the capacitance for impedance matching is also large, those problems may be more conspicuous.

FIG. 3 is a circuit diagram showing an example of an equivalent circuit of a differential amplifier which is controlled in the low-impedance state in association with the non-operating state and the transformer corresponding to the differential amplifier in the high-frequency power amplifying device of FIG. 1. In FIG. 3, like in FIG. 2, it is regarded that, for example, the differential amplifier AD11 in FIG. 1 is controlled in the low impedance state and is constructed by a differential pair of MOSFETs. In the low impedance state, the MOSFETs of AD11 are controlled to be on, so that the power supply voltage VDD coupled to the midpoint of the primary coils LD11 and LD12 of the transformer TR11 is coupled to the ground power supply voltage VSS. As a result, current penetrates between them and power consumption may increase. To prevent it, for example, it is considered to control VDD in the transformer which is set to the non-operating state to 0V. In this case, however, a circuit for controlling VDD becomes unnecessary, and it may cause increase in the circuit area and complication of control.

The present invention is achieved in view of the circumstances and an object of the invention is to provide a high-frequency power amplifying device capable of transmitting output power at high efficiency. The above and other objects and novel features of the present invention will become apparent from the description of the specification and the appended drawings.

Outline of representative embodiments of the invention disclosed in the application will be briefly described as follows.

A high-frequency power amplifying device according to an embodiment has a first primary coil, a first secondary coil, a first differential amplifier, a first reactance element, and a first switch. The first primary coil (LD1/LD2) is coupled between a first node A (N1) and a first node B (N2). The first secondary coil (LD3) is magnetically coupled to the first primary coil. The first differential amplifier (AD1) uses the first node A and the first node B as differential output nodes and includes a differential pair of transistors (MN1 and MN2). The first reactance element (L1, L2, and the like) and the first switch (S1 and the like) are coupled in series between the first node A and the first node B. The first switch is controlled to be on when the first differential amplifier is controlled to be in a non-operating state and is controlled to be off when the first differential amplifier is controlled to be in an operating state.

With such a configuration, when the first differential amplifier is in the non-operating state, the influence exerted by the "off capacitance" of the differential transistor pair on another differential amplifier which is in the operating state can be reduced. As a result, the differential amplifier in the operating state can transmit output to a load at high efficiency. At this time, the differential transistor pair of the first differential amplifier is equivalently expressed as "off capacitance", and the first reactance element is set to, for example, a reactance value by which a circuit when the first differential amplifier side expressed as the "off capacitance" is seen from both ends of the first primary coil looks like a parallel resonance circuit. Alternatively, the first reactance element is set to, for example, a reactance value by which a circuit when the second coil side is seen from both ends of the first secondary coil looks like a parallel resonance circuit.

A high-frequency power amplifying device according to another embodiment has a first primary coil, a first secondary coil, a first differential amplifier, and a first switch. The first primary coil (LD1/LD2) is coupled between a first node A (N1) and a first node B (N2) and having a midpoint to which power supply voltage (VDD) is supplied. The first secondary coil (LD3) is magnetically coupled to the first primary coil. The first differential amplifier (AD1) uses the first node A and the first node B as differential output nodes and includes a differential transistor pair. A first switch (S3) is coupled between the first node A and the first node B. The first switch is controlled to be on when the first differential amplifier is controlled in the non-operating state and is controlled to be off when the first differential amplifier is controlled in the operating state. The differential transistor pair of the first differential amplifier is controlled to be off when the first differential amplifier is controlled in the non-operating state.

With such a configuration, when the first differential amplifier is in the non-operating state, the differential transistor pair is off and through-feed current does not flow, so that the first secondary coil can be equivalently almost short-circuited. In this case as well, the influence exerted by the capacitance in the differential transistor pair which is off on another differential amplifier in the operating state can be reduced. As a result, the differential amplifier in the operating state can transmit output power to a load at high efficiency.

An effect obtained by the representative embodiments of the invention disclosed in the application is that a high-frequency power amplifying device capable of transmit output power at high efficiency is realized.

DETAILED DESCRIPTION

Figure 1:
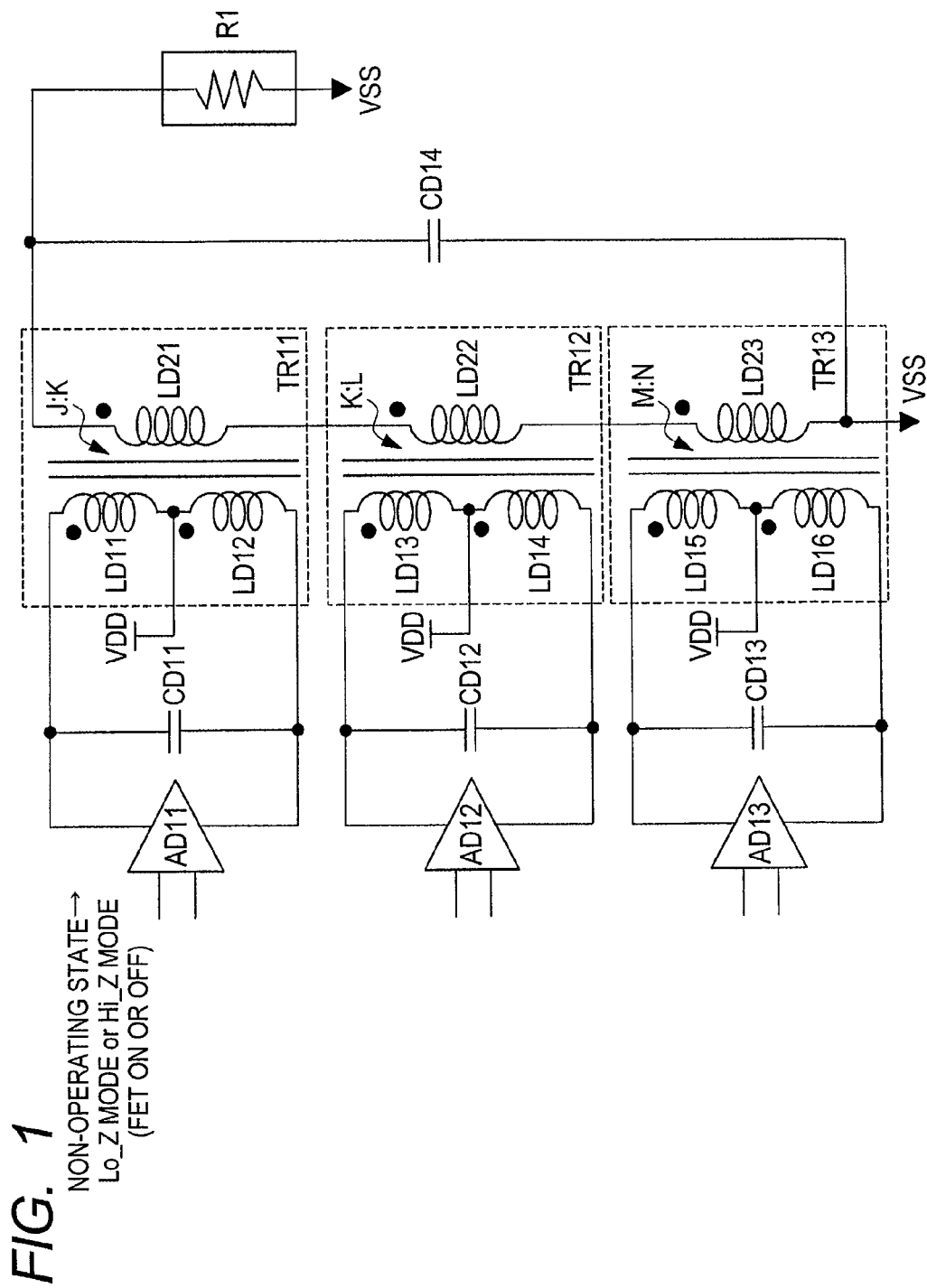
FIG. 1 is a circuit diagram showing an example of the configuration of a high-frequency power amplifying device examined as a precondition of the present invention.

In following embodiments, when necessary for convenience, the invention will be described by being divided in a plurality of sections or embodiments. Unless otherwise specified, they are not unrelated but each of them has a relation of a modification, details, supplementation, or the like of a part or all of another. In the following embodiments, in the case of referring to the number of elements or the like (including the number, numerical value, quantity, and range), unless otherwise specified or unless otherwise clearly limited to a specific number in principle, the number is not limited to a specific number but may be any number.

Further, in the following embodiments, except for the case such that a component (including a step and the like) is specified or clearly essential in principle, obviously, the component is not always essential. Similarly, in the following embodiments, in the case of referring to the shape, positional relation, and the like of a component or the like, unless otherwise specified or clearly understood, the invention includes shapes and the like close to or similar to the shape. Numbers and ranges close to or similar to those described in the embodiments are also included.

Circuit elements constructing each of function blocks of the embodiments are, although not limited, formed on a semiconductor substrate made of single crystal silicon or the like by the known integrated circuit technology of the CMOS (Complementary MOS transistor) and the like. Although a MOSFET (Metal Oxide Semiconductor Field Effect Transistor) (referred to as MOS transistor) is used as an example of the MISFET (Metal Insulator Semiconductor Field Effect Transistor) in the embodiments, a non-oxide film is not excluded as a gate insulating film.

Hereinafter, embodiments of the present invention will be described in detail with reference to the drawings. In all of the drawings for explaining the embodiments, the same reference numeral is used for the same member and its repetitive description will not be given.

First Embodiment

Figure 4:
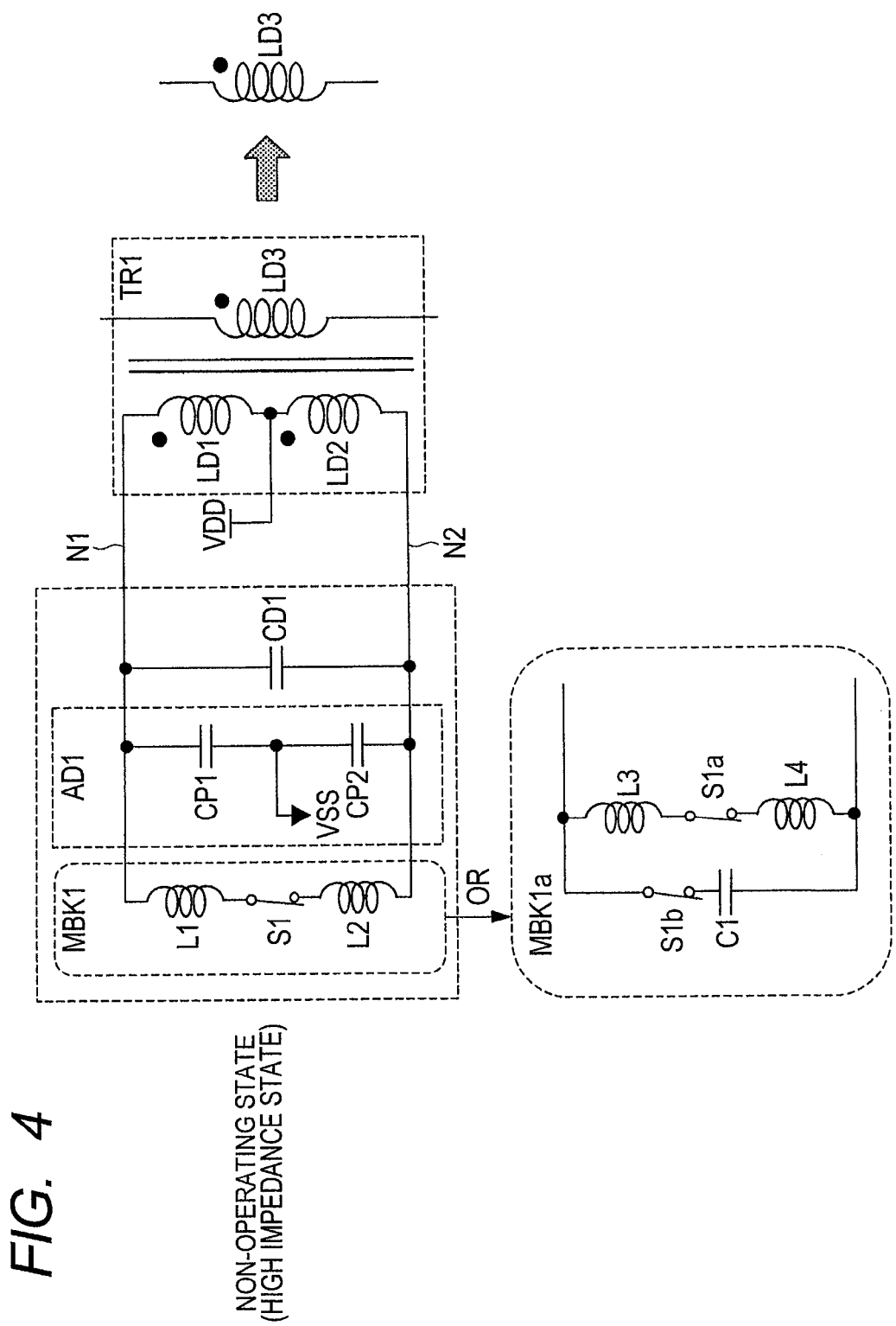
FIG. 4 is a circuit diagram showing an example of an equivalent circuit of a differential amplifier which is controlled in the non-operating state in a high-frequency power amplifying device according to a first embodiment of the invention, and a transformer corresponding to the differential amplifier.

Basic Configuration (Type 1) of Main Part of High-Frequency Power Amplifying Device FIG. 4 is a circuit diagram showing an example of a differential amplifier in a high-frequency power amplifying device according to a first embodiment of the invention, which is controlled in a non-operating state and an equivalent circuit including a transformer corresponding to the differential amplifier. FIG. 4 shows a differential amplifier AD1, a transformer TR1, and a capacitance CD1 for impedance adjustment and, in addition, an impedance correction block MBK1. The differential amplifier AD1 is constructed by, for example, a pair of differential MOSFETs (not shown) and the MOSFETs are turned off in the non-operating state. In this case, the differential amplifier AD1 is equivalently expressed by source-drain parasitic capacitances CP1 and CP2 of the MOSFETs as a differential pair. One ends of the parasite capacitances CP1 and CP2 (the source side of the MOSFETs) are commonly coupled to a ground power supply voltage VSS. The non-operating state denotes a state in which a corresponding differential amplifier does not amplify power. On the contrary, the operating state denotes a state where a corresponding differential amplifier amplifies power.

The transformer TR1 has primary coils LD1 and LD2 whose one ends are commonly coupled to a power supply voltage VDD and a secondary coil LD3. A node N1 as the other end of LD1 is coupled to the other end (the drain side of the MOSFET) of CP1, and a node N2 as the other end of LD2 is coupled to the other end (the drain side of the MOSFET) of CP2. The capacitance CD1 for impedance adjustment is coupled between N1 and N2. The capacitance CD1 is provided mainly for cancelling out a reactance component which can be actually included in TR1.

The impedance correction block MBK1 has an inductor (reactance element) L1, a switch S1, and an inductor (reactance element) L2 which are coupled in order from the node N1 and in series between the nodes N1 and N2. The block MBK1 is a part different from the above-described configuration of FIG. 2. In the case of setting the differential amplifier AD1 in the non-operating state, the switch S1 is controlled to be on. The inductors L1 and L2 have the same inductance value. An admittance value of the series coupling of L1 and L2 when S1 is on is adjusted to cancel out the admittance of a capacitance network constructed by the parasitic capacitances CP1 and CP2 and the capacitance CD1. That is, the values of the inductors L1 and L2 are adjusted so that a parallel resonance circuit (high-impedance state) is seen in the case of viewing the AD1 side from both ends of the primary coils LD1 and LD2 at a predetermined frequency.

The reason why the admittance can be cancelled out will now be described. In the case where the switch S1 is turned on, the inductors L1 and L2 have the same value. Consequently, the node between the inductors is coupled to a virtual ground for differential signals. When it is assumed that the capacitance CD1 has a configuration that, equivalently, two capacitances having a capacitance value twice as large as that of the capacitance CD1 are coupled in series, it can be regarded that a node between the capacitances is coupled to a virtual ground for differential signals. The common node between the parasite capacitances ("off capacitances") CP1 and CP2 of the differential amplifier AD1 is coupled to the actual ground. That is, one of the inductors L1 and L2, one of the two capacitances coupled in series constructing the capacitance CD1, and one of the "off capacitances" CP1 and CP2 of the differential amplifier AD1 are coupled in parallel between one of the differential output nodes (N1 and N2) of AD1 and the ground. Therefore, by setting the admittance value of L1 to the same admittance value as the sum of one of the two capacitances coupled in series of CD1 and one of the capacitances CP1 and CP2, the admittance values can be cancelled out each other.

As a result, for the differential signals, a closed circuit formed between the primary coils LD1 and LD2 of the transformer TR1 can be opened. Consequently, the primary coils of the transformer and elements coupled to the primary coils become electrically inactive and, as shown in FIG. 4, only the secondary coil LD3 substantially remains. On the other hand, in the case of setting the differential amplifier AD1 to the operating state, the switch S1 is controlled to be off. In this case, the effect of the inductors L1 and L2 disappears, and the differential amplifier AD1 can operate almost in a state where the inductors L1 and L2 are not added.

The impedance correction block MBK1 can be also replaced with another impedance correction block MBK1a as shown in FIG. 4. The block MBK1a has an inductor L3, a switch S1a and an inductor L4 coupled in order from the node N1 and in series between the nodes N1 and N2, and a switch S1b and a capacitance (reactance element) C1 coupled in series between the nodes N1 and N2. In the case of setting the differential amplifier AD1 in the non-operating state, both of the switches S1a and S1b are controlled to be on. In the case of setting the differential amplifier AD1 to the operating state, both of the switches S1a and S1b are controlled to be off. By using a configuration that the capacitance C1 is coupled in parallel to L3 and L4 in the non-operating state, the circuit area of L3 and L4 can be reduced. That is, the admittance of the series coupling of L3 and L4 and that of C1 have opposite signs. As a result, the inductance value of L3 and L4 can be made smaller than that of L1 and L2 in MBK1. Since larger circuit area for inductance than that for capacitance is usually necessary, by using MBK1a, the circuit area can be reduced as compared with the case of using MBK1.

Figure 5:
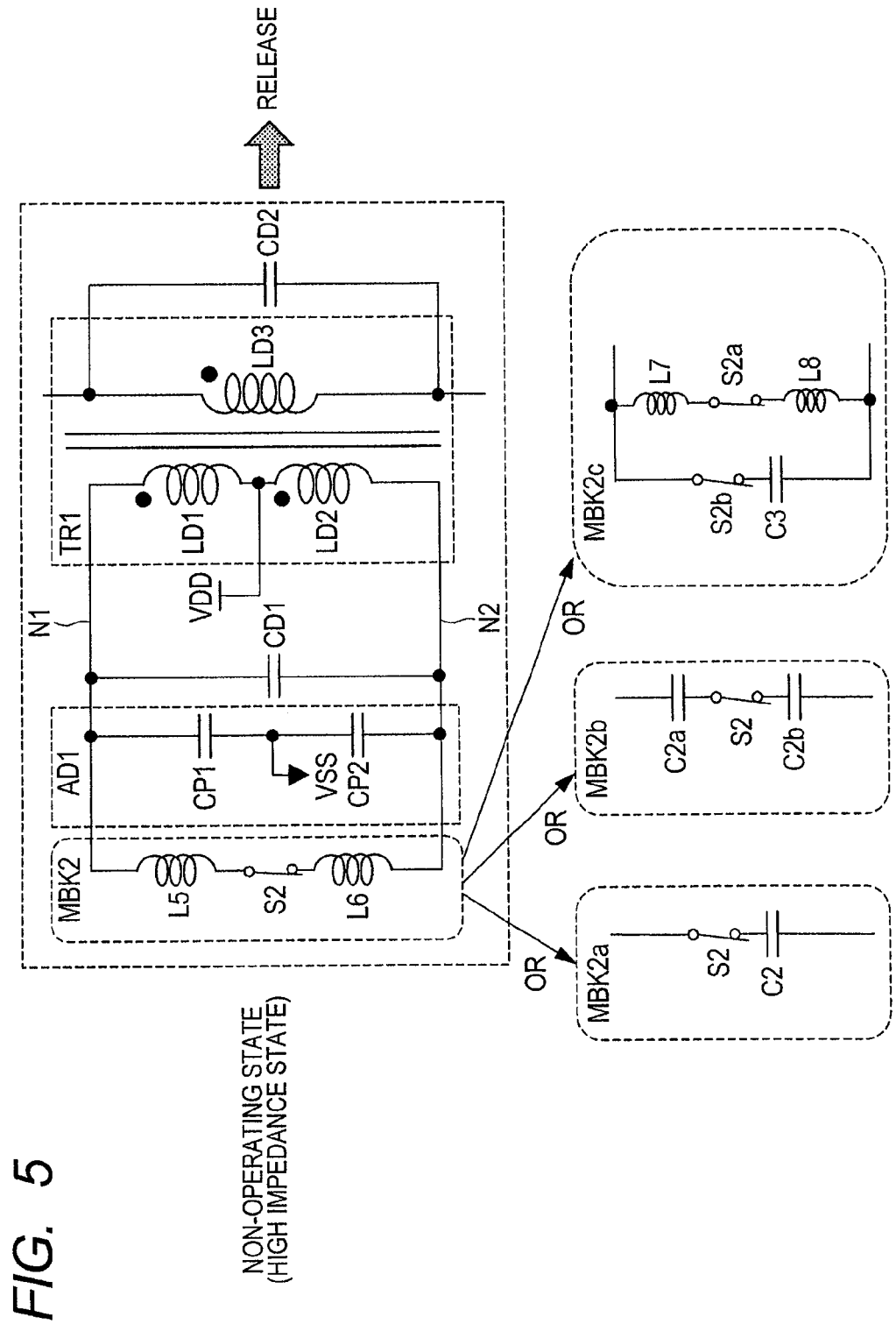
FIG. 5 is a circuit diagram showing another example of an equivalent circuit of a differential amplifier which is controlled in the non-operating state in the high-frequency power amplifying device according to the first embodiment of the invention, and a transformer corresponding to the differential amplifier.

Basic Configuration (Type 2) of Main Part of High-Frequency Power Amplifying Device FIG. 5 is a circuit diagram showing another example of a differential amplifier in a high-frequency power amplifying device according to the first embodiment of the invention, which is controlled in a non-operating state and an equivalent circuit including a transformer corresponding to the differential amplifier. The configuration example of FIG. 5 is different from that of FIG. 4 with respect to the points that the impedance correction block MBK1 of FIG. 4 is replaced with an impedance correction block MBK2 of FIG. 5, and a capacitance CD2 for impedance adjustment is coupled to both ends of the secondary coil LD3 of the transformer TR1. Like the capacitance CD1, the capacitance CD2 is provided to mainly cancel out the reactance component which may be included in the transformer TR1 in practice.

The impedance correction block MBK2 has an inductor (reactance element) L5, a switch S2, and an inductor (reactance element) L6 which are coupled in order from the node N1 and in series between the nodes N1 and N2. The block MBK2 has a circuit configuration similar to that of the block MBK1 of FIG. 4. In a manner similar to FIG. 4, in the case of setting the differential amplifier AD1 in the non-operating state, the switch S2 is controlled to be on. In the case of setting the differential amplifier AD1 in the operating state, the switch S2 is controlled to be off. The difference between MBK2 and MBK1 is the values of L5 and L6 and those of L1 and L2. The inductors L5 and L6 have the same inductance value. An admittance value of the series coupling of L5 and L6 when S2 is on is adjusted so as to cancel out the admittance of a passive element network constructed by the parasitic capacitances CP1 and CP2, the capacitance CD1, the transformer TR1, and the capacitance CD2. That is, the values of the inductors L5 and L6 are adjusted so that a circuit seen from both ends of the secondary coil LD3 toward the secondary coil LD3 looks like a parallel resonance circuit (high-impedance state) at a predetermined frequency.

As described above, the difference of MBK2 of FIG. 5 from MBK1 of FIG. 4 is that the range in which the admittance is canceled out is extended to the secondary coil LD3 of the transformer and the capacitance CD2 coupled to the secondary coil LD3. The reason why the admittance can be canceled out is similar to that in the case of FIG. 4. Like the capacitance CD1, the capacitance CD2 can be also divided equivalently to two capacitive elements, and an intermediate node between the capacitive elements can be regarded as a virtual ground. Consequently, by adjusting the values of the inductors L5 and L6, the sum of the admittances of the "off capacitances" CP1 and CP2 of AD1, CD1, TR1, and CD2 can be cancelled out.

The impedance correction block MBK2 can be replaced with any of other impedance correction blocks MBK2a, MBK2b, and MBK2c illustrated in FIG. 5. MBK2a has the switch S2 and a capacitance (reactance element) C2 coupled in series between the nodes N1 and N2, MBK2b has a capacitance (reactance element) C2a, the switch S2, and a capacitance (reactance element) C2b which are coupled in order from N1 and in series. In the method of FIG. 5, different from the method of FIG. 4, there is a case that the sum of admittances to be cancelled out in MBK2 has an inductance characteristic. In such a case, by using a capacitance as shown in MBK2a or MBK2b, the admittance can be cancelled out.

In the case of MBK2b, balance between the parasitic capacitances (C2a and C2b) at the nodes N1 and N2 can be maintained when S2 is turned off in accordance with the operation state of AD1. There is, however, the possibility that when S2 is turned on, since the capacitances are coupled in series, a large capacitance value is necessary for C2a and C2b. On the other hand, in the case of MBK2a, the capacitance value of C2 can be set to be smaller than that in the case of MBK2b. The block MBK2c has an inductor (reactance element) L7, a switch S2a, and an inductor (reactance element) L8 coupled in order from N1 and in series between N1 and N2 and a switch S2b and a capacitance (reactance element) C3 coupled in series between N1 and N2. In the case of setting the differential amplifier AD1 in the non-operating state, both of S2a and S2b are controlled to be on. In the case of setting AD1 in the operating state, both of S2a and S2b are controlled to be off. As described above, by using the configuration that C3 is coupled in parallel to L7 and L8 in the non-operating state, in a manner similar to the case of FIG. 4, the circuit area of L7 and L8 can be reduced.

When the configuration example as shown in FIG. 5 is employed, by cancelling out the admittance, the elements coupled to the primary coils LD1 and LD2 of the transformers TR1 and TR and the entire capacitance CD2 coupled to the secondary coil LD3 of TR1 can be electrically made inactive to the differential signals. That is, as illustrated in FIG. 5, the circuit part becomes substantially an open state, and can be prevented from exerting any influence on an external circuit. On the other hand, in the case of setting the differential amplifier AD1 in the operating state, the switch S2 is controlled to be off. In this case, the effect of the inductors L5 and L6 in MBK2 disappears, and the differential amplifier AD1 can operate almost in a state where the inductors L5 and L6 are not added.

As described above, by using the high-frequency power amplifying device (type 1) of FIG. 4 or the high-frequency power amplifying device (type 2) of FIG. 5, a problem as described with reference to FIG. 2 that the differential amplifier which is in the non-operating state and having some impedance exerts an adverse influence on the differential amplifier in the operating state can be solved. As a result, the differential amplifier in the operating state can transmit output power at high efficiency toward a load.

Figure 6:
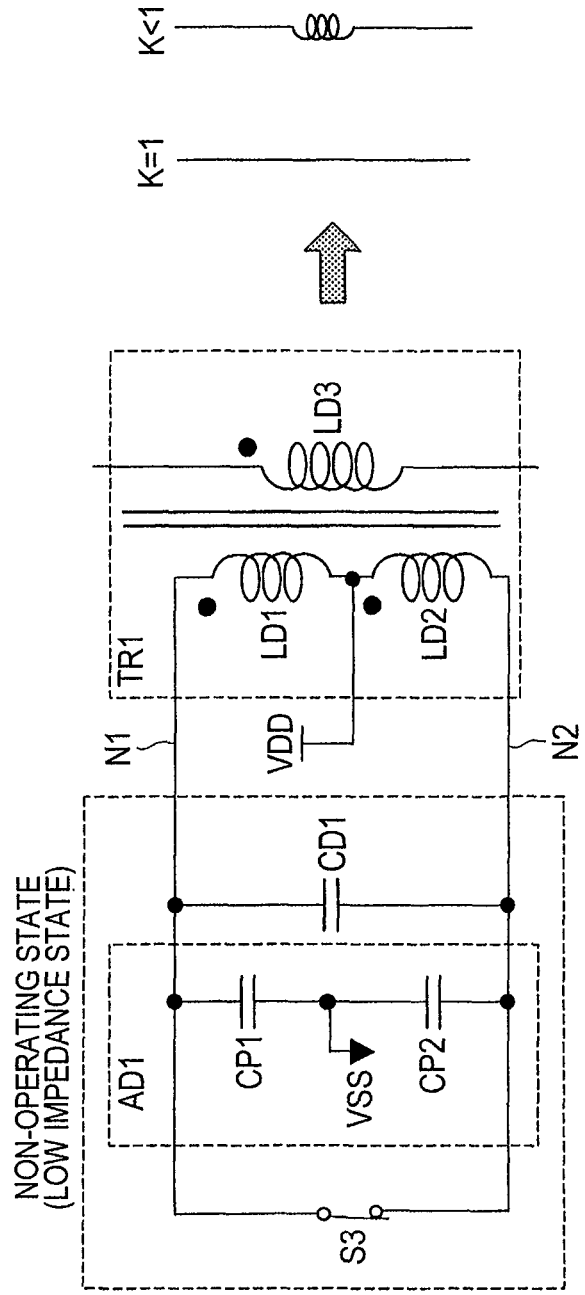
FIG. 6 is a circuit diagram showing another example of an equivalent circuit of a differential amplifier which is controlled in the non-operating state in the high-frequency power amplifying device according to the first embodiment of the invention, and a transformer corresponding to the differential amplifier.

Basic Configuration (Type 3) of Main Part of High-Frequency Power Amplifying Device FIG. 6 is a circuit diagram showing another example of a differential amplifier in a high-frequency power amplifying device according to the first embodiment of the invention, which is controlled in a non-operating state, and an equivalent circuit including a transformer corresponding to the differential amplifier. The configuration example of FIG. 6 is different from that of FIG. 4 with respect to the point that the impedance correction block MBK1 of FIG. 4 is replaced with a switch S3 coupled between the nodes N1 and N2. In FIG. 6, different from the method of FIG. 4, in the case of setting the differential amplifier AD1 to the non-operating state, a control is performed so that the impedance seen from both ends of the primary coils LD1 and LD2 to the differential amplifier AD1 side becomes low impedance.

In FIG. 6, in the case of setting the differential amplifier AD1 to the non-operating state, the switch S3 is controlled to be on. In this case, differential outputs (nodes N1 and N2) of AD1 are short-circuited, and both ends of the primary coils LD1 and LD2 of the transformer TR1 are also short-circuited. As a result, as shown in FIG. 6, in the case where TR1 is ideal and its combined multiplier K=1, the secondary coil LD3 is also short-circuited. In reality, since K<1 is satisfied, a small inductance component remains in LD3. On the other hand, in the case of setting the differential amplifier AD1 to the operating state, the switch S3 is controlled to be off. In this case, the differential amplifier AD1 performs operation similar to that in the case where the switch S3 does not exist.

Figure 3:
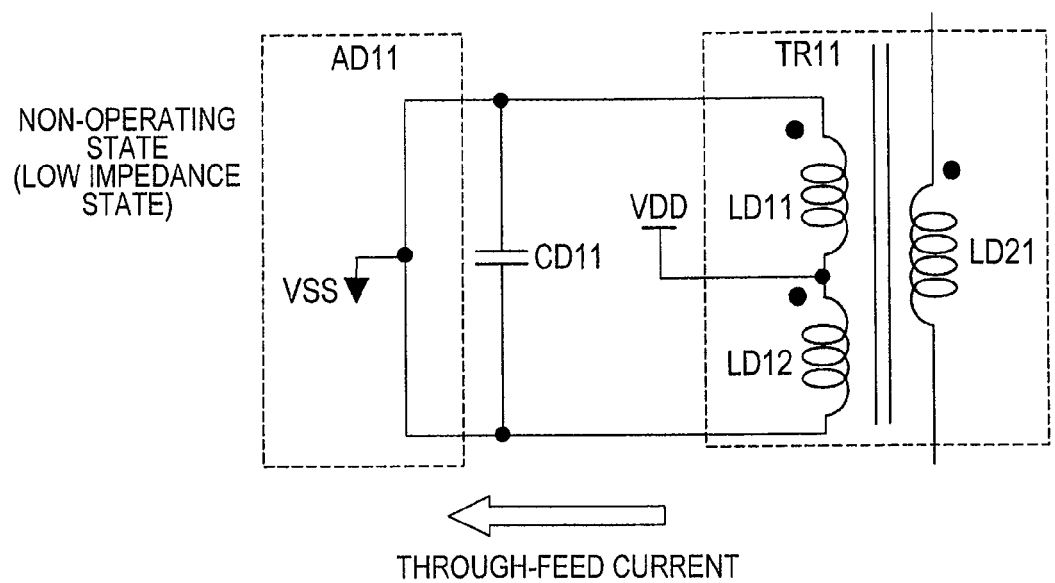
FIG. 3 is a circuit diagram showing an example of an equivalent circuit of a differential amplifier which is controlled in the low-impedance state in association with the non-operating state and a transformer corresponding to the differential amplifier in the high-frequency power amplifying device of FIG. 1.

As described above, when the high-frequency power amplifying device (type 3) of FIG. 6 is used, different from the case of FIG. 3, the control to lower impedance is performed in a state where the transistor of the differential amplifier AD1 is off. Consequently, DC coupling is eliminated between the power supply voltage VDD as the intermediate node of the primary coils LD1 and LD2 and the ground power supply voltage VSS. As a result, increase in power consumption caused by through current between VDD and GND can be prevented. Further, as described above, a secondary coil corresponding to the differential amplifier in the non-operating state can be regarded as a wire or small inductance. Consequently, in a differential amplifier in the operating state, output impedance matching can be easily realized, and the differential amplifier can transmit output power toward a load at high efficiency.

As stated above, the configurations of the types 1 and 2 of making the differential amplifier in the non-operating state seen in the high-impedance state and the configuration of the type 3 of making the differential amplifier in the non-operating state seen in the low impedance state are properly used according to the configurations of the primary coil and the secondary coil in the transformer and the combination method of the primary coil and the secondary coil. For example, in the case of using a transformer in which a plurality of primary coils are magnetically coupled to a single secondary coil, the configuration of the type 1 is suitable. In the case of using a transformer in which secondary coils are coupled in parallel with each other, the configuration of the type 2 is suitable. Further, in the case of using a transformer in which a plurality of secondary coils are coupled in series, the configuration of the type 3 is suitable and, in some cases, the configuration of the type 1 can be used. The details will be properly described in the following embodiments.

Second Embodiment

1. Circuit Configuration and Operation of High-Frequency Power Amplifying Device in Plural Power Modes (Type 1)

Figure 7:
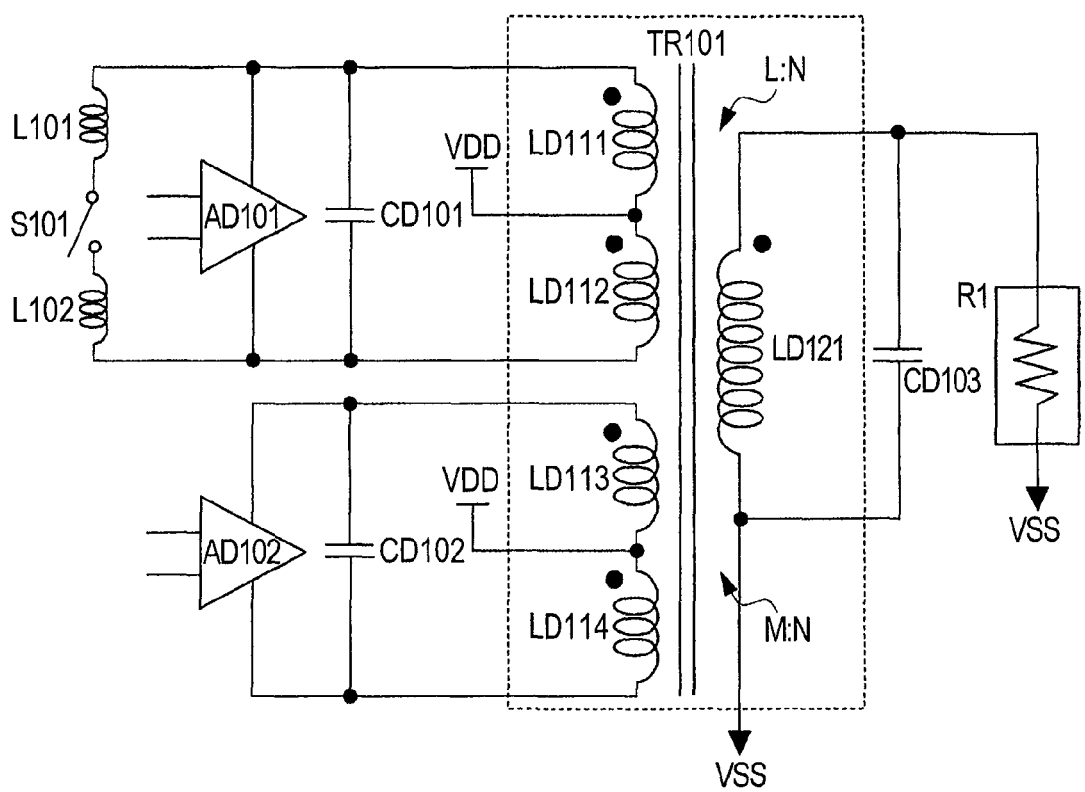
FIG. 7 is a circuit diagram showing an example of the configuration of a high-frequency power amplifying device according to a second embodiment of the invention.

FIG. 7 is a circuit diagram showing an example of the configuration of a high-frequency power amplifying device according to a second embodiment of the invention. The high-frequency power amplifying device shown in FIG. 7 has two differential amplifiers AD101 and AD102 and a transformer TR101 having two primary coils and one secondary coil. One of the two primary coils of TR101 is constructed by two coils LD111 and LD112, and the other primary coil is also constructed by two coils LD113 and LD114. LD111 is coupled in series to LD112 via a center tap, and LD113 is coupled in series to LD114 via a center tap. To the center tap, the power supply voltage VDD is supplied.

The two primary coils of TR101 are magnetically coupled to the common secondary coil LD121 of TR101. The gate width (or emitter area) of a transistor as a component of the differential amplifier AD101 is larger than that of a transistor as a component of the differential amplifier AD102. Differential outputs of AD101 are coupled to the primary coils LD111 and LD112, and differential outputs of AD102 are coupled to the primary coils LD113 and LD114. The turn ratio L/N between the primary coils LD111 and LD112 and the secondary coil LD121 is lower than the turn ratio M/N of the primary coils LD113 and LD114 and the secondary coil LD121 as the difference between the output impedances of AD101 and AD102 is reflected.

A capacitance CD101 is coupled between differential outputs of AD101, and a capacitance CD102 is coupled between differential outputs of AD102. Between the differential outputs of AD101, further, an inductor L101, a switch S101, and an inductor L102 are coupled in series. The inductors L101 and L102 have the same inductance value. One of terminals of a secondary coil LD121 is coupled to VSS, and the other terminal is coupled to a load R1. A capacitance CD103 is coupled between the terminals of LD121. In the high output mode, AD101 is in the operating state, and AD102 is in the non-operating state. In the low output mode, AD102 is in the operating state, and AD101 is in the non-operating state. Transistors as components of AD101 and AD102 may be MOSFETs, compound FETs, bipolar transistors, or the like. Each of internal circuits of AD101 and AD102 may be a simple differential pair of transistors or a circuit obtained by combining a plurality of transistors to the differential pair.

Figure 8A:
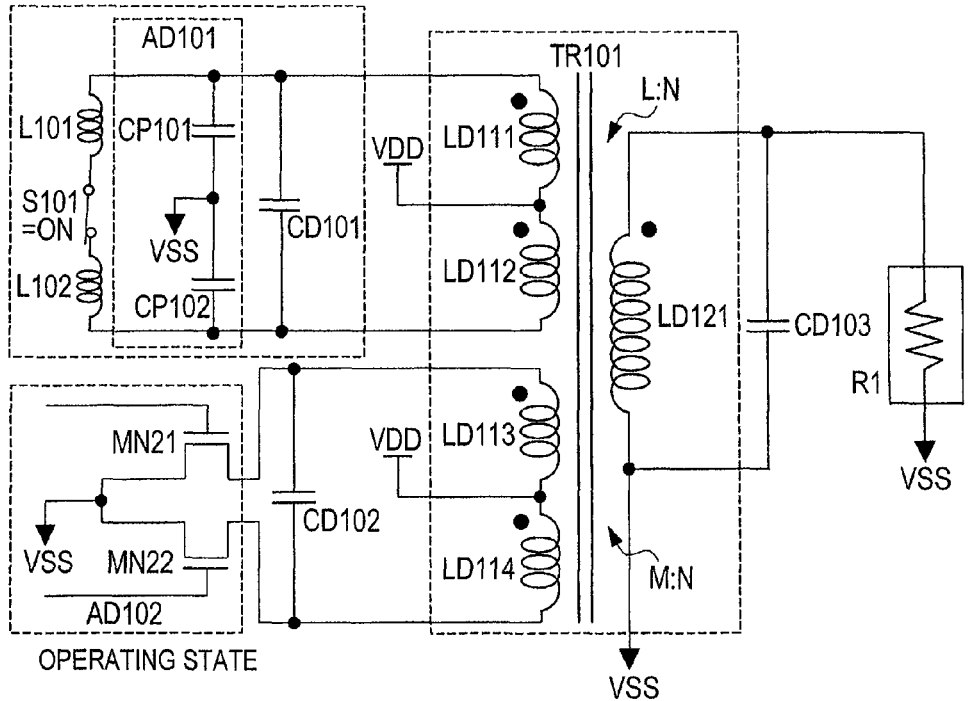
FIG. 8A is a circuit diagram showing a state of the case of operating the high-frequency power amplifying device of FIG. 7 in a low output mode.
Figure 8B:
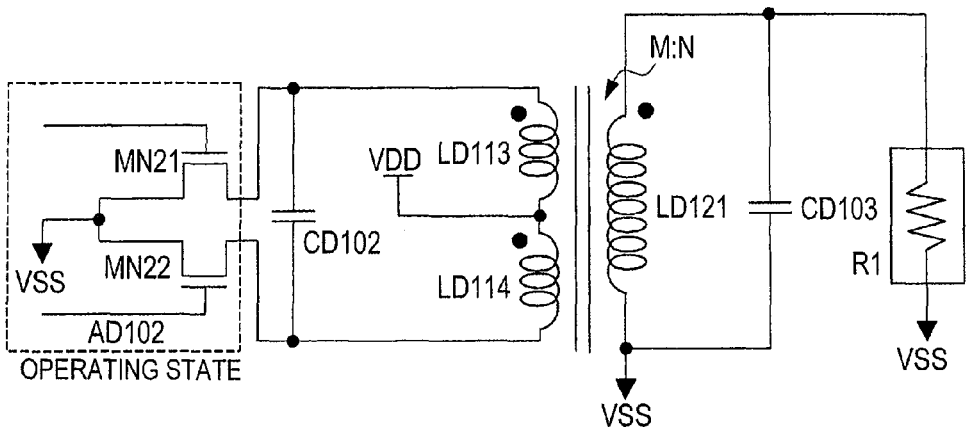
FIG. 8B is a circuit diagram showing a substantial equivalent circuit of the circuit of FIG. 8A.
Figure 9A:
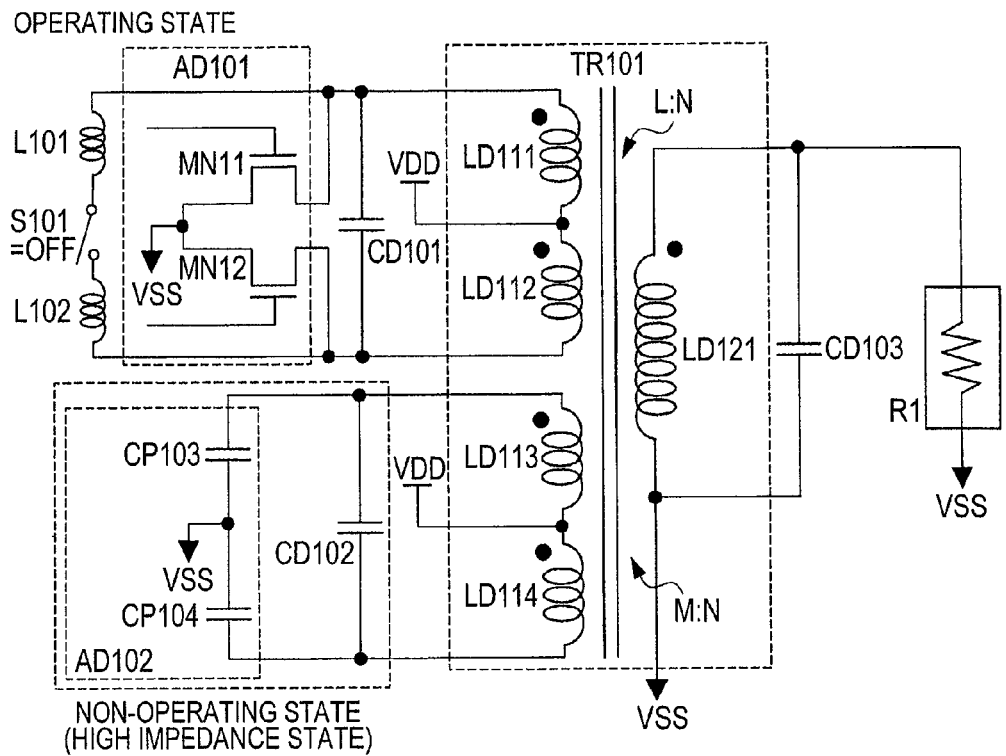
FIG. 9A is a circuit diagram showing a state of the case of operating the high-frequency power amplifying device of FIG. 7 in a high output mode.
Figure 9B:
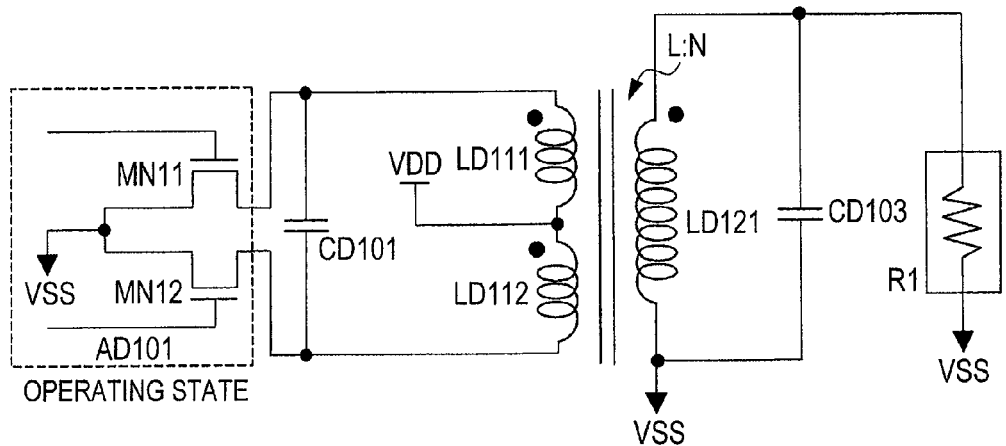
FIG. 9B is a circuit diagram showing a substantial equivalent circuit of the circuit of FIG. 9A.

FIG. 8A is a circuit diagram showing a state of a case where the high-frequency power amplifying device of FIG. 7 is operated in the low output mode. FIG. 8B is a circuit diagram of a substantially equivalent circuit of FIG. 8A. FIG. 9A is a circuit diagram showing a state of a case where the high-frequency power amplifying device of FIG. 7 is operated in the high output mode. FIG. 9B is a circuit diagram of a substantially equivalent circuit of FIG. 9A. A case of constructing each of the differential amplifiers AD101 and AD102 by a differential pair of MOSFETs will be described as an example. The gate width of the differential pair of MOSFETs (the NMOS transistors MN11 and MN12 of FIG. 9) constructing AD101 is larger than that of a differential pair of MOSFETs (the NMOS transistors MN21 and MN22 of FIG. 8) constructing AD102.

As shown in FIG. 8A, in the low output mode, a differential pair of MOSFETs of AD101 are set to the off state. The differential pair becomes an equivalent circuit that "off capacitances" CP101 and CP102 are left between differential output terminals (drain nodes of the MOSFETs) and the ground power supply voltage VSS. The switch S101 is controlled to be on, and the inductors L101 and L102 are coupled in series between the differential outputs. The inductance values of L101 and L102 are set to values to cancel out the sum of admittances of the series-coupled capacitance of CP101 and CP102 coupled in parallel to L101 and L102 and the capacitance CD101 for impedance adjustment. That is, the configuration around AD101 is the configuration of type 1 shown in FIG. 4, and a broken-line part including AD101 is in the high impedance state as shown in FIG. 8A.

As a result, as shown in FIG. 8B, the differential amplifier AD101 and the part of the primary coils LD111 and LD112 as one of the primary coils in the transformer TR101 coupled to the differential amplifier AD101 are extinguished, and only the secondary coil LD12 remains substantially. The differential amplifier AD102 is in the operating state and its output power is magnetically coupled to the secondary coil LD121 via the other primary coils LD113 and LD114 in TR101 and supplied to the load R1. In such a manner, the "off capacitances" (CP101 and CP102) of the differential amplifier AD101 and CD101 do not exert large influence on the operation of the differential amplifier AD102.

On the other hand, in the high output mode, as shown in FIG. 9A, a differential pair of MOSFETs of AD102 are controlled to be off, and the differential pair becomes an equivalent circuit that "off capacitances" CP103 and CP103 are left between differential output terminals and VSS. Since AD102 is a differential amplifier for the low output mode, the "off capacitances" CP103 and CP104 and the capacitance CD102 for impedance adjustment are smaller than the "off capacitances" (CP101 and CP102 in FIG. 8) for the high output mode and CD101. As a result, a broken-line part including AD102 is in the high impedance state as shown in FIG. 9A.

When the configuration around AD102 enters the high impedance state, equivalently, as shown in FIG. 9B, the part of the primary coils LD113 and LD114 on the side coupled to AD102 in the transformer TR101 is extinguished, and only the secondary coil LD121 remains substantially. The differential amplifier AD101 is in the operating state and its output power is magnetically coupled to the secondary coil LD121 via the other primary coils LD111 and LD112 on the side coupled to AD101 in TR101 and supplied to the load R1. In such a manner, the "off capacitances" (CP103 and CP104) of the differential amplifier AD102 and CD102 do not exert large influence on the operation of the differential amplifier AD101.

By using the fact that the transistor size of AD102 is small, the configuration that the impedance correction block MBK1 as shown in FIG. 4 is not provided on the side of AD102 is employed. In the case where the "off capacitance" or the like is small in association with small transistor size, to cancel it out, an inductor having a value which is larger by the amount corresponding to the small size is necessary. To reduce the circuit area, it is useful to omit the impedance correction block in a part as described above. However, obviously, a configuration including the impedance correction block can be also employed.

As obviously understood from the above description, according to the second embodiment, in both of the high output mode and the low output mode, as compared with the precondition techniques described with reference to FIGS. 1 to 3, the influence of the differential amplifier which is in the non-operating mode can be further reduced and, as a result, the efficiency and gain of a power amplifier (in each of the power modes can be further increased.

Circuit Configuration and Operation of High-Frequency Power Amplifying Device in Plural Power Modes (Type 1 (1A))

Figure 10A:
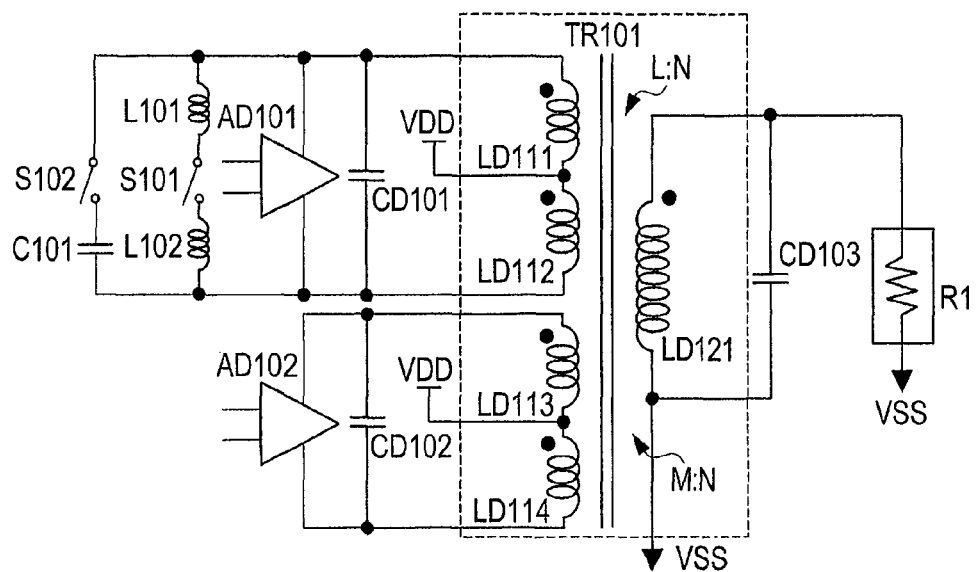
FIG. 10A is a circuit diagram showing a configuration example of a modification of FIG. 7.
Figure 10B:
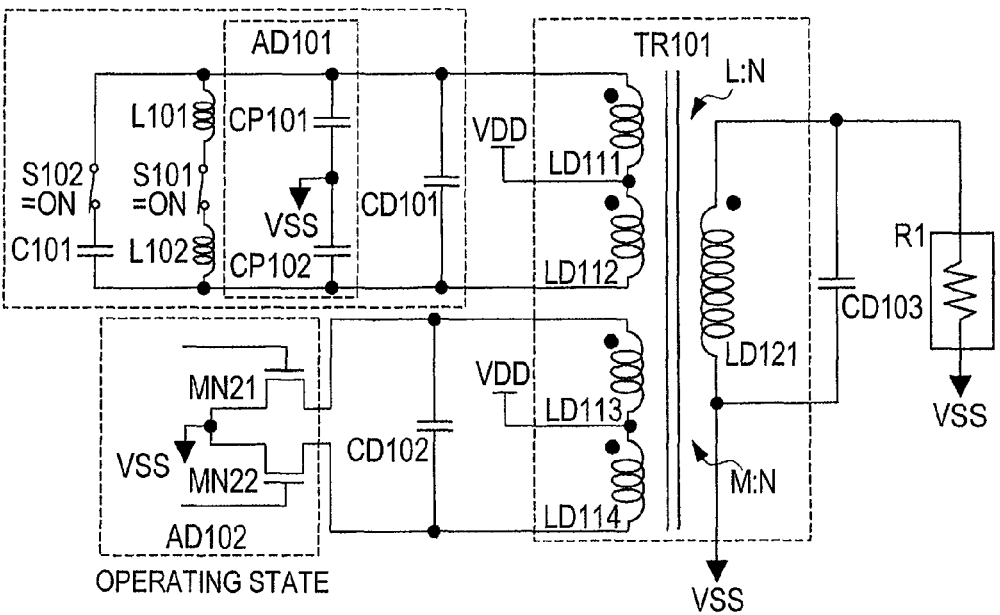
FIG. 10B is a circuit diagram showing a state of the case of operating the modification of FIG. 10A in the low output mode.

FIG. 10A is a circuit diagram showing a configuration example as a modification of FIGS. 7, and 10B is a circuit diagram showing a state of the case where the device of FIG. 10A is operated in the low output mode. The high-frequency power amplifying device shown in FIG. 10A is different from that of FIG. 7 with respect to the point that a switch S102 and a capacitance C101 are further coupled in series between the differential outputs of the differential amplifier AD101. The switch S102 is controlled to be on/off like the switch S101. By employing such a configuration example, as described by the impedance correction block MBK1a of FIG. 4, the circuit area of the inductors L101 and L102 can be reduced.

When the case of constructing each of the differential amplifiers AD101 and AD102 by a differential pair of MOSFETs is taken as an example, in the low output mode, as shown in FIG. 10B, the differential pair of MOSFETs of AD101 is set to the off state, and the differential pair becomes an equivalent circuit in which the "off capacitances" CP101 and CP102 are left between the differential output terminals and VSS. Both of the switches S101 and S102 are controlled to be on, the inductors L101 and L102 are coupled in series between the differential outputs, and the capacitances C101 and CD101 are coupled in parallel. The inductance values of L101 and L102 and the capacitance value of C101 are set to values to cancel out, by the sum of their admittances, the sum of admittances of CP101, CP102, and CD101 coupled in parallel to them. As a result, as shown in FIG. 10B, the broken-line part including AD101 enters the high impedance state.

Layout of High-Frequency Power Amplifying Device in Plural Power Modes (Type 1 [1])

Figure 11:
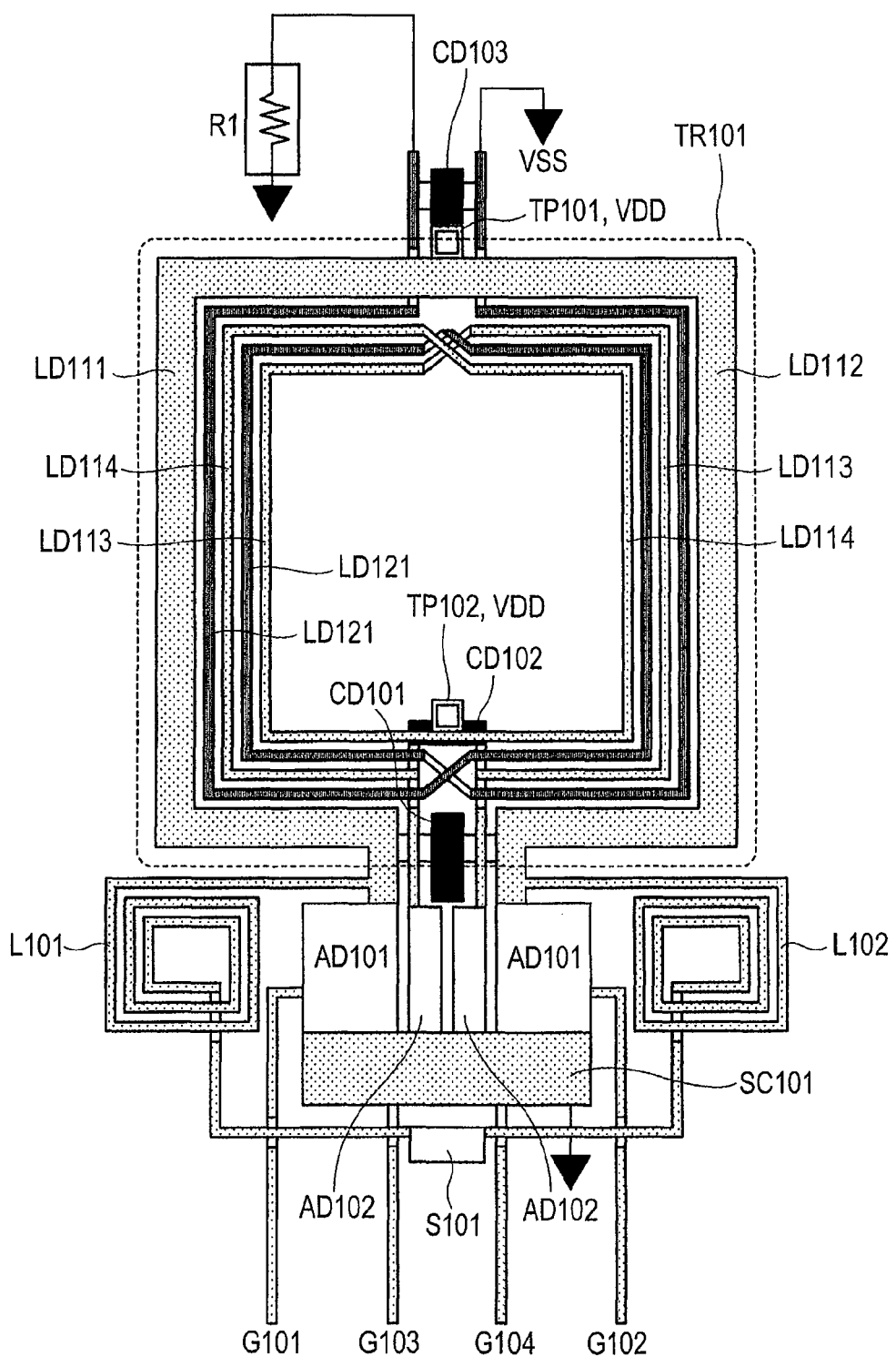
FIG. 11 is a plan view showing a schematic layout configuration example of the high-frequency power amplifying device of FIG. 7.

FIG. 11 is a plan view showing an example of a schematic layout of the high-frequency power amplifying device of FIG. 7. The names of parts to which reference numerals are designated in the diagram are the same as those in FIG. 7. TP101 denotes a center tap of the primary coils LD111 and LD112 of the transformer TR101, and TP102 denotes a center tap of the primary coils LD113 and LD114 of TR101. To the center tap, VDD is supplied. SC101 denotes a common source line of the differential pair of MOSFETs constructing the differential amplifiers AD101 and AD102, and VSS is supplied to the common source line. G101 and G102 are gate input lines (differential input lines) of the differential pair of MOSFETs (MN11 and MN12 in FIG. 9) in AD101, and G103 and G104 are gate input lines (differential input lines) of the differential pair of MOSFETs (MN21 and MN22 in FIG. 8) in AD102.

In such a configuration, each of the capacitances CD101, CD102, and CD103 is realized by, for example, the MIM (Metal-Insulator-Metal) structure. The transformer TR101 has a primary coil made by LD111 and LD112, the other primary coil made by LD113 and LD114, and the secondary coil LD121. The two primary coils are disposed in parallel in proximity of the common secondary coil LD121 and are magnetically coupled to LD121. The primary coil made by LD111 and LD112 has one turn, and the primary coil made by LD113 and LD114 has two turns. Between the differential outputs of AD101, the inductor L101, the switch S101, and the inductor L102 are coupled in series. The capacitance CD101 is coupled between the differential outputs and, further, the primary coil made by LD111 and LD112 is coupled.

Between the differential outputs of AD102, the capacitance CD102 is coupled and, further, the primary coil made by LD113 and LD114 is coupled. The secondary coil LD121 of TR101 has two turns. One end of the secondary coil LD121 is coupled to VSS, and the other end is coupled to the load R1. The capacitance CD103 is coupled between both ends of LD121. Each of the coils is formed by, for example, a metal film wire and realized by a so-called on-chip inductor structure. As described above, the high-frequency power amplifying device of FIG. 7 can be realized by a single semiconductor chip as understood from FIG. 11 and, thus, downsizing of the high-frequency power amplifying device can be realized.

Third Embodiment

1. Circuit Configuration and Operation of High-Frequency Power Amplifying Device in Plural Power Modes (Type 2[1])

Figure 12:
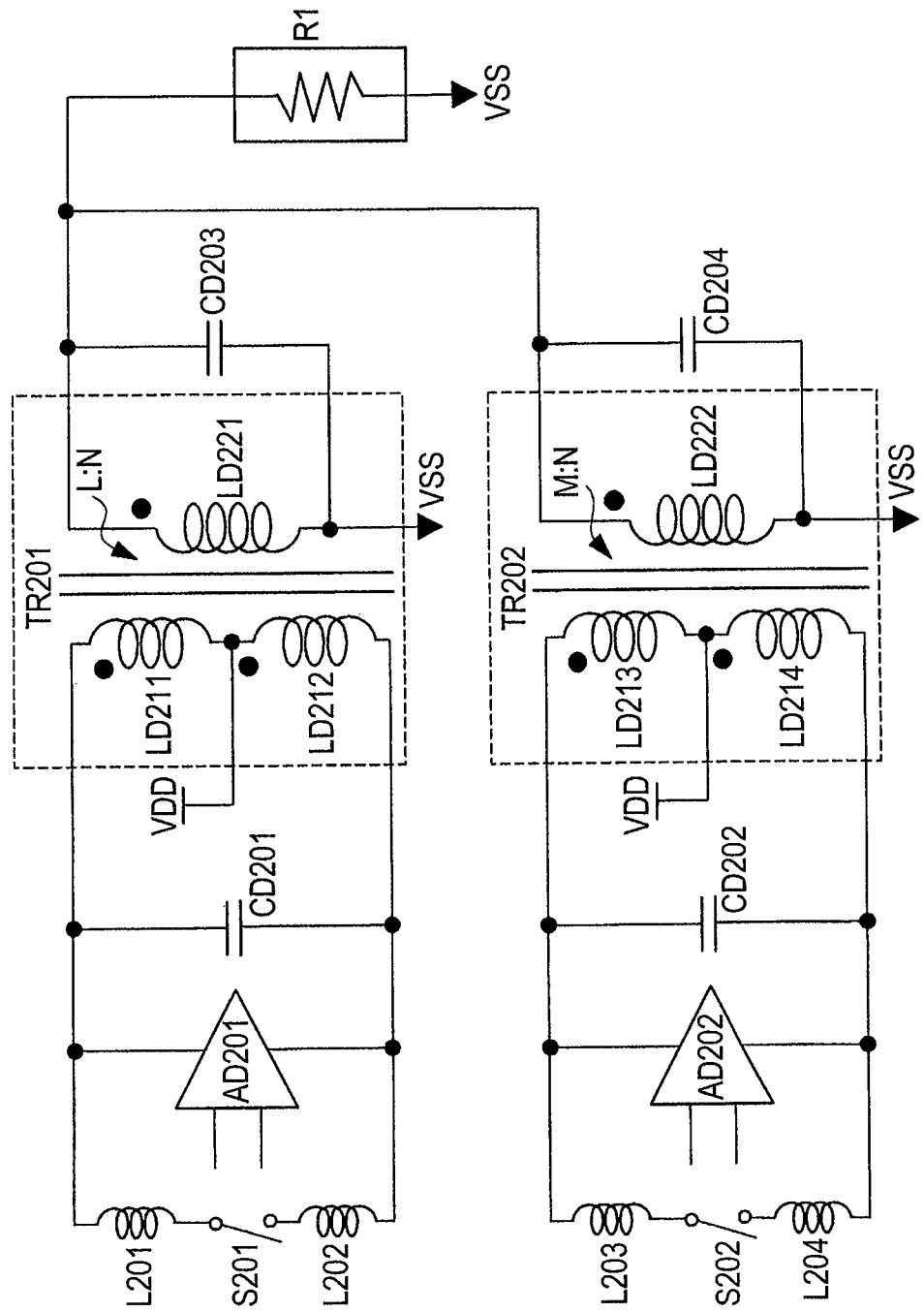
FIG. 12 is a circuit diagram showing an example of the configuration of a high-frequency power amplifying device according to a third embodiment of the invention.

FIG. 12 is a circuit diagram showing an example of the configuration of a high-frequency power amplifying device according to a third embodiment of the invention. The high-frequency power amplifying device shown in FIG. 12 has two differential amplifiers AD201 and AD202 and two transformers TR201 and TR202. A primary coil of TR201 has a configuration that two coils LD211 and LD212 are coupled in series via a center tap. Similarly, a primary coil of TR202 has a configuration that two coils LD213 and LD214 which are coupled in series via a center tap. To the center tap, the power supply voltage VDD is supplied.

Differential outputs of AD201 are coupled to the primary coils LD211 and LD212 of the transformer TR201 and, further, magnetically coupled to a secondary coil LD221 of TR201. Differential outputs of AD202 are coupled to the primary coils LD213 and LD214 of the transformer TR202 and, further, magnetically coupled to a secondary coil LD222 of TR202. The secondary coils LD221 and LD222 are coupled in parallel between one end of the load R1 and the ground power supply voltage VSS. A capacitance CD203 for impedance adjustment is coupled between both ends of LD221, and a capacitance CD204 for impedance adjustment is coupled between both ends of LD222. The gate width of a transistor as a component of AD201 is larger than that of a transistor as a component of AD202.

The turn ratio (L/N) between the primary coil and the secondary coil of the transformer TR201 is lower than the turn ratio (M/N) of the transformer TR202 as the difference between the output impedances of AD201 and AD202 is reflected. A capacitance CD201 is coupled between differential outputs of AD201, to which an inductor L201, a switch S201, and an inductor L202 which are coupled in series are coupled in parallel. A capacitance CD202 is coupled between differential outputs of AD202, to which an inductor L203, a switch S202, and an inductor L204 which are coupled in series are coupled in parallel. The inductors L201 and L202 have the same inductance value and, similarly, the inductors L203 and L204 have the same inductance value.

In such a configuration, in the high output mode, AD201 is in the operating state, and AD102 is in the non-operating state. On the other hand, in the low output mode, AD202 is in the operating state, and AD201 is in the non-operating state. Transistors as components of the differential amplifiers AD201 and AD202 may be MOSFETs, compound FETs, bipolar transistors, or the like. Each of internal circuits of the differential amplifiers may be a simple differential pair of transistors or a circuit obtained by combining a plurality of transistors to the differential pair.

Figure 13A:
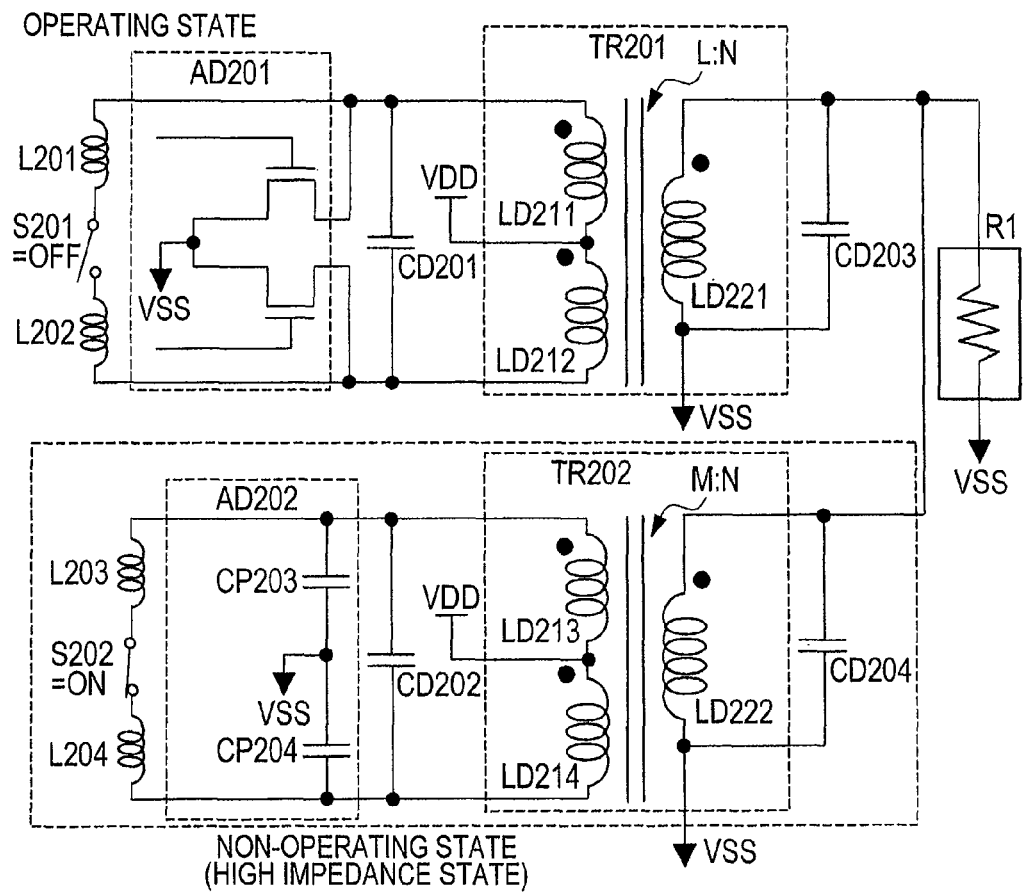
FIG. 13A is a circuit diagram showing a state of the case of operating the high-frequency power amplifying device of FIG. 12 in a high output mode.
Figure 13B:
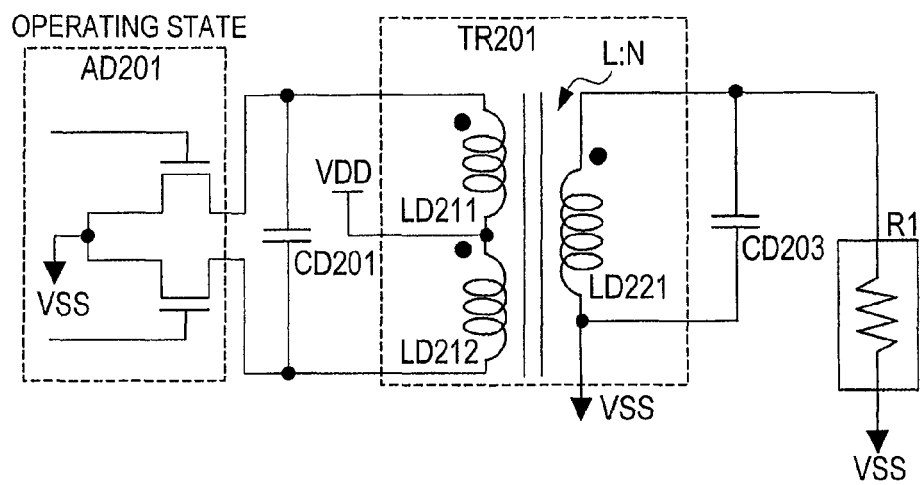
FIG. 13B is a circuit diagram showing a substantial equivalent circuit of the circuit of FIG. 13A.

FIG. 13A is a circuit diagram showing a state of a case where the high-frequency power amplifying device of FIG. 12 is operated in the high output mode. FIG. 13B is a circuit diagram of a substantially equivalent circuit of FIG. 13A. A case of constructing each of the differential amplifiers AD201 and AD202 by a differential pair of MOSFETs will be described as an example. In this case, the gate width of MOSFETs constructing AD201 is larger than that of MOSFETs constructing AD202. As shown in FIG. 13A, in the high output mode, a differential pair of MOSFETs of AD202 are set to the off state. The differential pair becomes an equivalent circuit that "off capacitances" CP203 and CP204 are left between differential output terminals. The switch S201 is controlled to be off. On the other hand, the switch S202 is controlled to be on, and the inductors L203 and L204 are coupled in series between the differential outputs of AD202.

The inductance values of L203 and L204 are set to values to cancel out the sum of admittances of the capacitances CP203 and CP204, the capacitances CD202 and CD204, and the transformer TR202 coupled in parallel to the inductors L203 and L204 as described with reference to FIG. 5. That is, the configuration around AD202 is the configuration of the type 2 of FIG. 5. With the configuration, as shown in FIG. 13A, a broken-line part including AD202 and TR202 is in the high impedance state. In this case, equivalently, as shown in FIG. 13B, the differential amplifier AD202 and the transformer TR202 are extinguished. The differential amplifier AD201 is in the operating state and its output power is supplied to the load R1 via the transformer TR201. In such a manner, the "off capacitances" of the differential amplifier AD202 and the inductance of TR202 do not exert large influence on the operation of the differential amplifier AD201.

In the case of operating the high-frequency power amplifying device of FIG. 12 in the low output mode, although not shown, the operation is opposite to that in FIG. 13A. Specifically, a differential pair of MOSFETs of AD201 are controlled to be off, the switch S201 is controlled to be on, and the switch S202 is controlled to be off. The inductance values of the inductors L201 and L202 are coupled in parallel to them as described with reference to FIG. 5. As described with reference to FIG. 5, the inductance values of L201 and L202 are set to values to cancel out the sum of admittances of the "off capacitance" in AD201, the capacitances CD201 and CD203 for impedance adjustment, and the transformer TR201 coupled in parallel to them.

Circuit Configuration and Operation of High-Frequency Power Amplifying Device in Plural Power Modes (Type 2 (1A))

Figure 14:
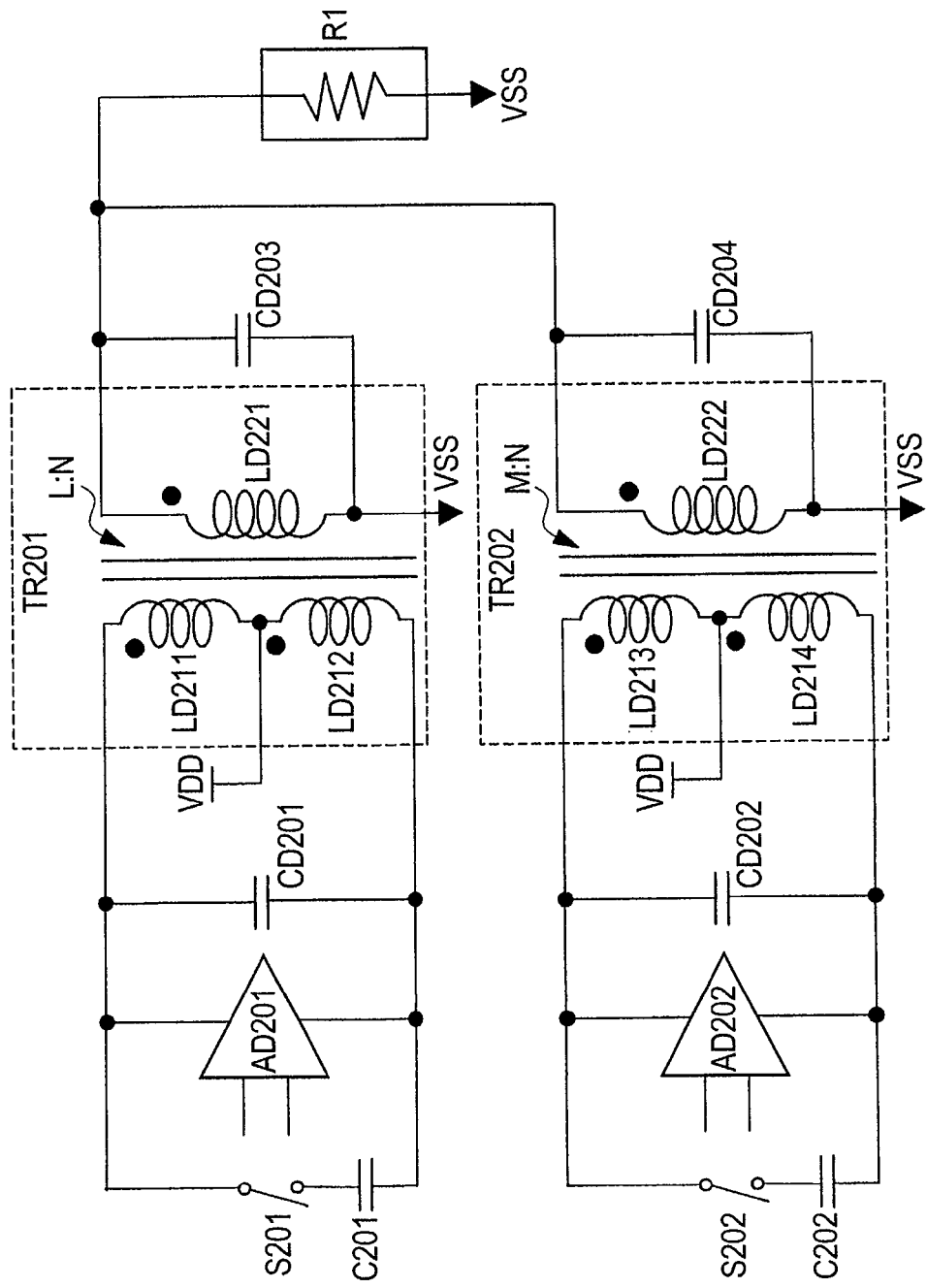
FIG. 14 is a circuit diagram showing a configuration example of a modification of the circuit of FIG. 12.

FIG. 14 is a circuit diagram showing a configuration example as a modification of FIG. 12. As described with reference to FIG. 5, in the configuration example of FIG. 12, there is a case such that the sum of the admittances of the differential amplifier AD202, the capacitance CD202, and the transformer TR202 comes to have the inductance characteristic depending on the balance of the "off capacitance" of AD202, the capacitance CD202, and inductance of the transformer TR202. In such a case, to make the part of AD202 and TR202 have high impedance, it is sufficient to use series coupling between the switch and the capacitance as shown in FIG. 14 in place of series coupling between the switch and the inductor. In FIG. 14, a switch S201 and a capacitance C201 are coupled in series between differential outputs of AD201, and a switch S202 and a capacitance C202 are coupled in series between differential outputs of AD202. The capacitance values of C201 and C202 are set to values to cancel out the sum of admittances of the "off capacitance" of MOSFETs which are in the off state, the capacitances for impedance adjustment (CD201 or CD202), and the transformer (TR201 or TR202). As a result, the part of the differential amplifier in the off state and the transformer coupled to the differential amplifier can have high impedance.

Figure 2:
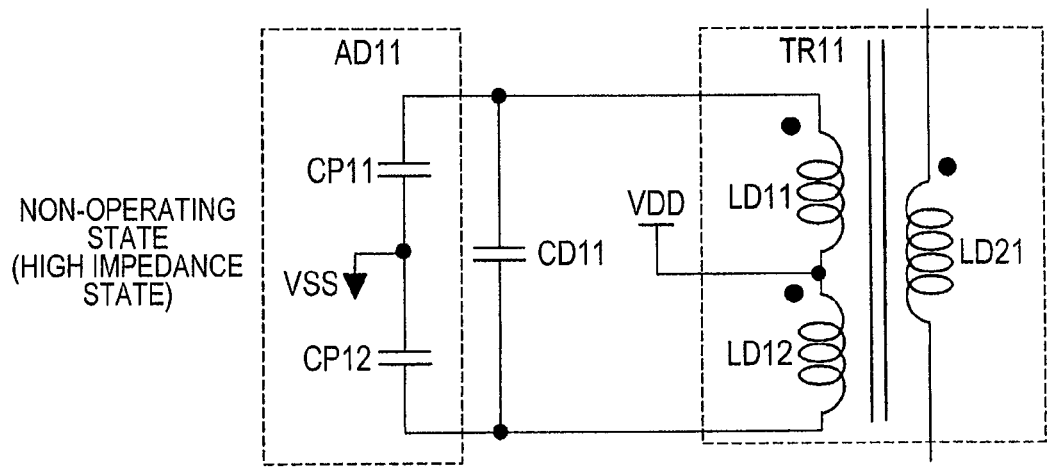
FIG. 2 is a circuit diagram showing an example of an equivalent circuit of a differential amplifier which is controlled in the high-impedance state in association with the non-operating state and a transformer corresponding to the differential amplifier in the high-frequency power amplifying device of FIG. 1.

As obvious from the above description, according to the third embodiment, in both of the high output mode and the low output mode, the influence of the differential amplifier which is in the non-operating state can be reduced as compared with the case of FIG. 2. As a result, the efficiency and gain of the power amplifier in each of the modes can be made higher.

Fourth Embodiment

Circuit Configuration and Operation of High-Frequency Power Amplifying Device in Plural Power Modes (Type 1 [2])

Figure 15:
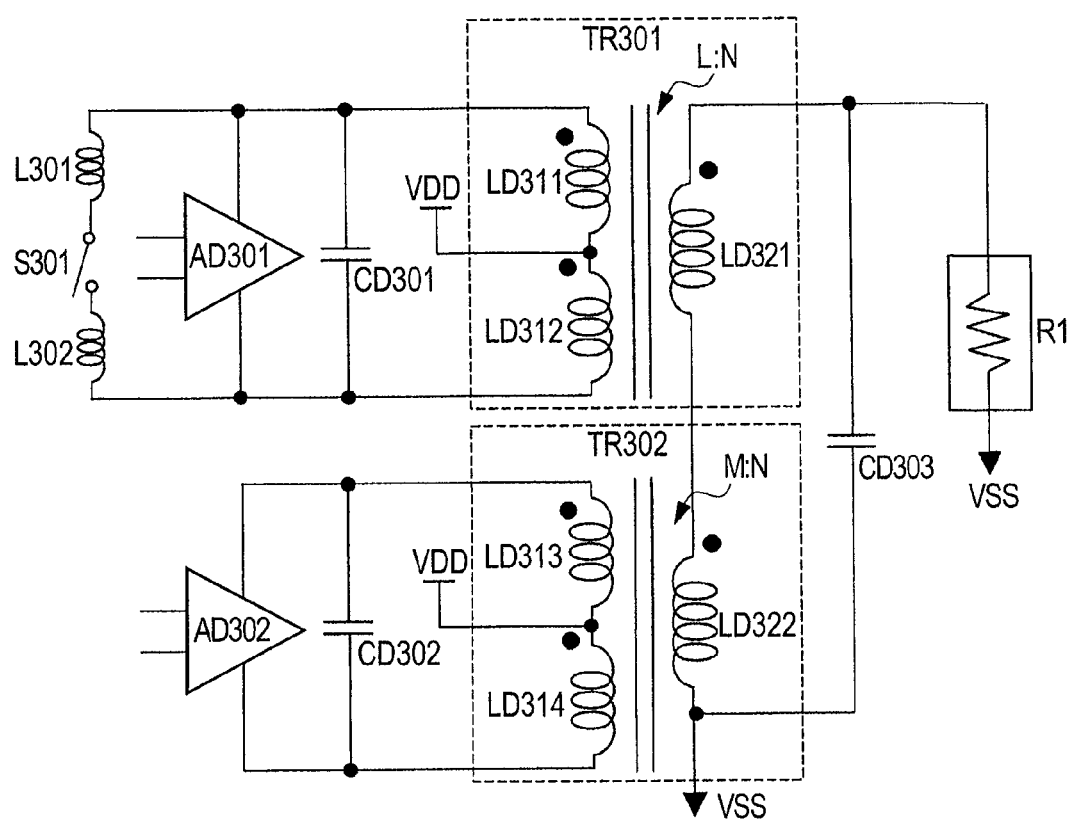
FIG. 15 is a circuit diagram showing an example of the configuration of a high-frequency power amplifying device according to a fourth embodiment of the invention.

FIG. 15 is a circuit diagram showing an example of the configuration of a high-frequency power amplifying device according to a fourth embodiment of the invention. The high-frequency power amplifying device shown in FIG. 15 has two differential amplifiers AD301 and AD302 and two transformers TR301 and TR302. A primary coil of TR301 has a configuration that two coils LD311 and LD312 are coupled in series via a center tap. Similarly, a primary coil of TR302 has a configuration that two coils LD313 and LD314 which are coupled in series via a center tap. To the center tap, the power supply voltage VDD is supplied.

Differential outputs of AD301 are coupled to the primary coils LD311 and LD312 of the transformer TR301 and, further, magnetically coupled to a secondary coil LD321 of TR301. Differential outputs of AD302 are coupled to the primary coils LD313 and LD314 of the transformer TR302 and, further, magnetically coupled to a secondary coil LD322 of TR302. The secondary coils LD321 and LD322 are coupled in series and are coupled between one end of the load R1 and the ground power supply voltage VSS. A capacitance CD303 for impedance adjustment is coupled between both ends of the series coupling of LD321 and LD322. The gate width (or emitter area) of a transistor as a component of AD301 is larger than that of a transistor as a component of AD302.

The turn ratio (L/N) between the primary coil and the secondary coil of the transformer TR301 is lower than the turn ratio (M/N) of the transformer TR302 as the difference between the output impedances of AD301 and AD302 is reflected. A capacitance CD301 is coupled between differential outputs of AD301, to which an inductor L301, a switch S301, and an inductor L302 which are coupled in series are coupled in parallel. A capacitance CD302 is coupled between differential outputs of AD302. The inductors L301 and L302 have the same inductance value. In the high output mode, AD301 is in the operating state, and AD302 is in the non-operating state. In the low output mode, AD302 is in the operating state, and AD301 is in the non-operating state. Transistors as components of the differential amplifiers AD301 and AD302 may be MOSFETs, compound FETs, bipolar transistors, or the like. Each of internal circuits of the differential amplifiers may be a simple differential pair of transistors or a circuit obtained by combining a plurality of transistors to the differential pair.

Figure 16A:
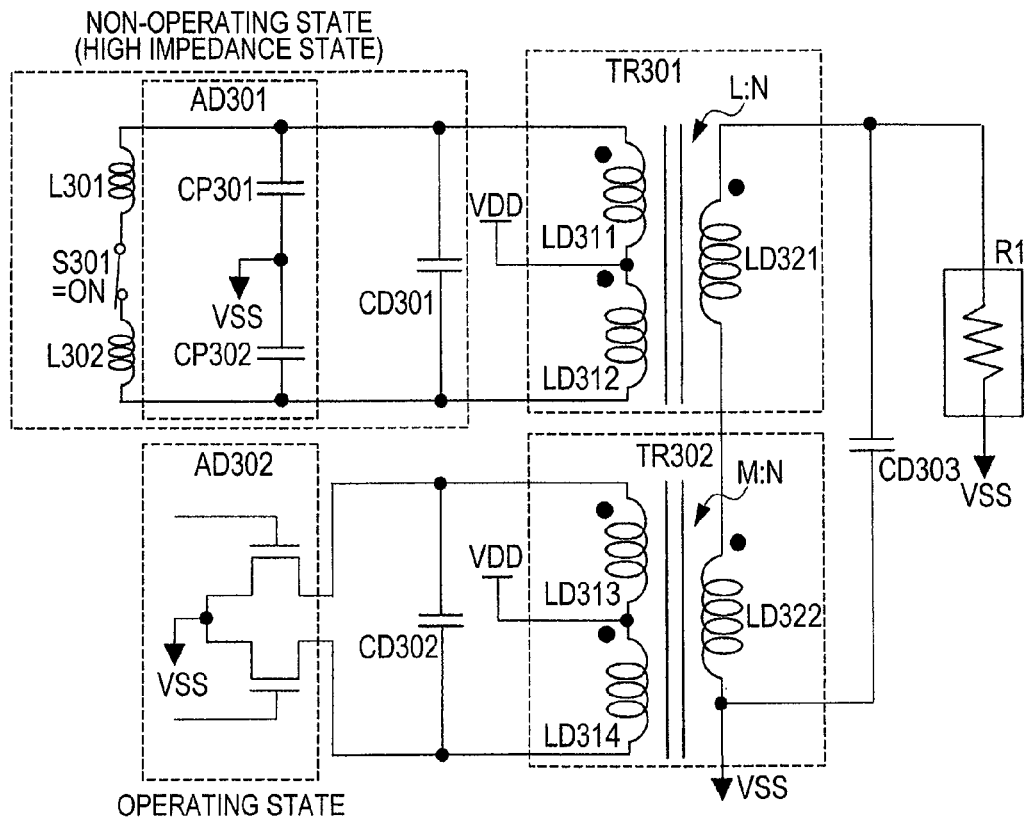
FIG. 16A is a circuit diagram showing a state of the case of operating the high-frequency power amplifying device of FIG. 15 in the low output mode.
Figure 16B:
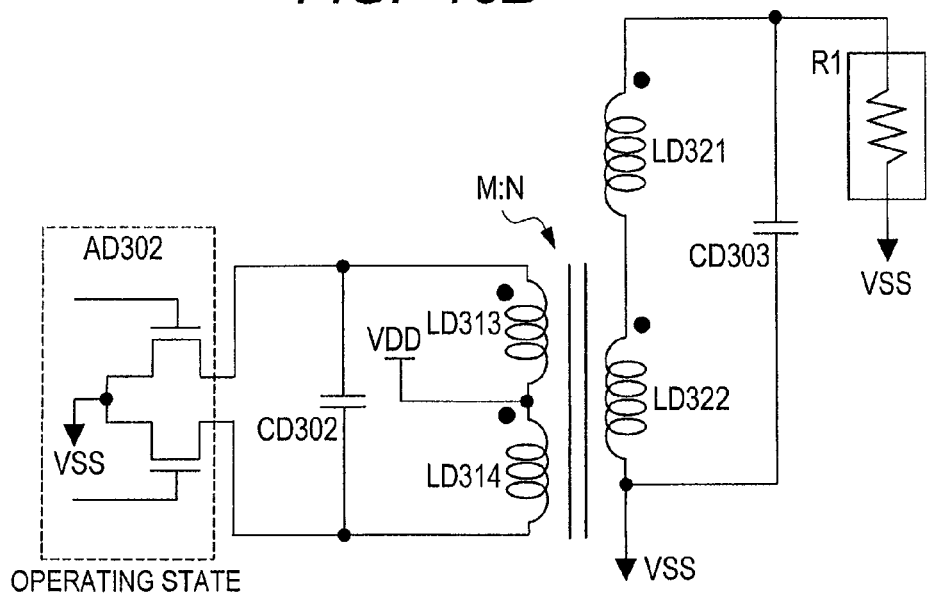
FIG. 16B is a circuit diagram showing a substantial equivalent circuit of the circuit of FIG. 16A.

FIG. 16A is a circuit diagram showing a state of a case where the high-frequency power amplifying device of FIG. 15 is operated in the low output mode. FIG. 16B is a circuit diagram of a substantially equivalent circuit of FIG. 16A. A case of constructing each of the differential amplifiers AD301 and AD302 by a differential pair of MOSFETs will be described as an example. In this case, the gate width of MOSFETs constructing AD301 is larger than that of MOSFETs constructing AD302. In the low output mode, a differential pair of MOSFETs of AD301 is set to the off state. The differential pair becomes an equivalent circuit that "off capacitances" CP303 and CP302 are left between differential output terminals and VSS. The switch S301 is controlled to be on, and the inductors L301 and L302 are coupled in series between the differential outputs.

As described with reference to FIG. 4, the inductance values of L301 and L302 are set to values to cancel out the sum of admittances of the series coupling capacitance of the capacitances CP301 and CP302 and the capacitance CD301 for impedance adjustment, coupled in parallel to L301 and L302. That is, the configuration around AD301 is the configuration of the type 1 of FIG. 4. With the configuration, as shown in FIG. 16A, a broken-line part including AD301 is in the high impedance state. In this case, equivalently, as shown in FIG. 16B, the part of AD301 and the primary coils LD311 and LD312 of the transformer to which AD301 is coupled is extinguished, and only the secondary coil LD321 remains substantially. The differential amplifier AD302 is in the operating state and its output is magnetically coupled to a secondary coil LD322 via primary coils LD313 and LD314 of a transformer TR302 and supplied to the load R1. In such a manner, parasitic capacitance of the differential amplifier AD301 and the CD301 do not exert large influence on the operation of the differential amplifier AD302. However, since the secondary coil LD321 remains, output impedance matching that takes into account the influence of LD321 is necessary.

Figure 17A:
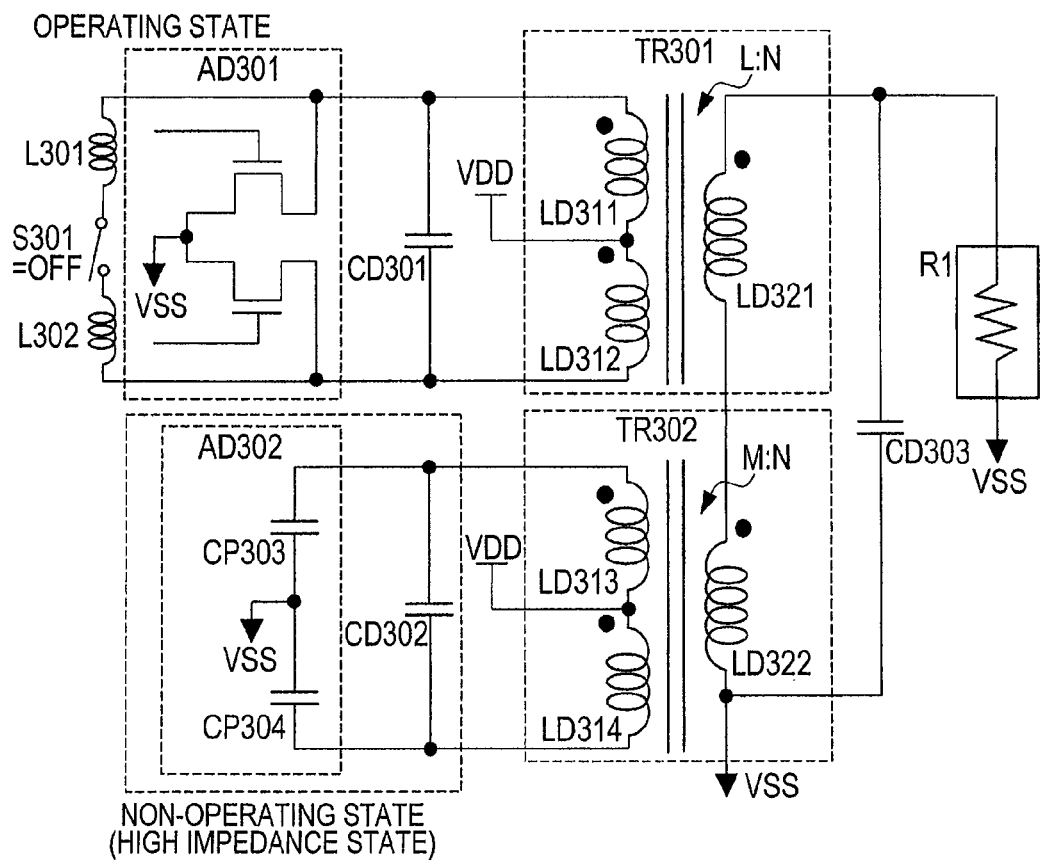
FIG. 17A is a circuit diagram showing a state of the case of operating the high-frequency power amplifying device of FIG. 15 in the high output mode.
Figure 17B:
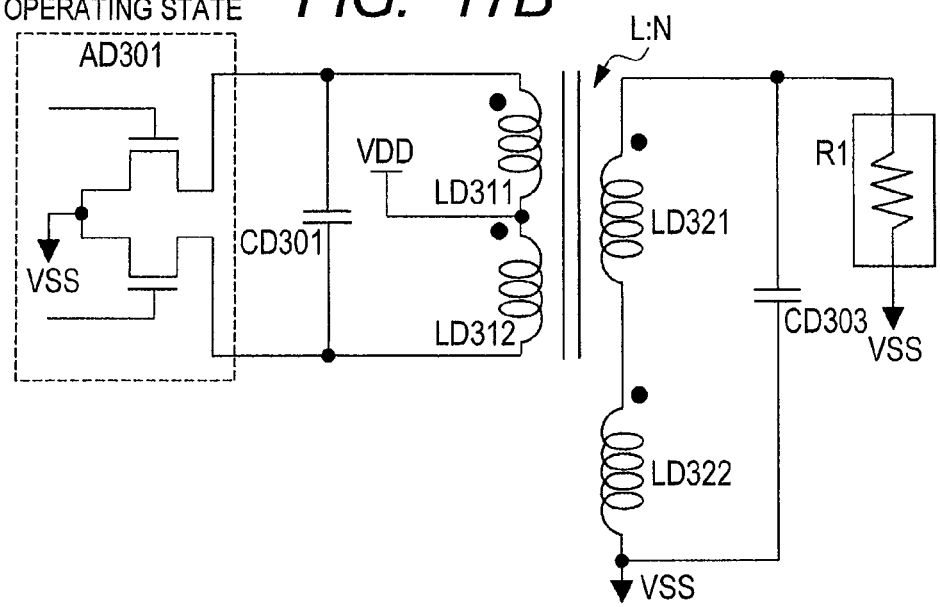
FIG. 17B is a circuit diagram showing a substantial equivalent circuit of FIG. 17A.

FIG. 17A is a circuit diagram showing a state of a case where the high-frequency power amplifying device of FIG. 15 is operated in the high output mode. FIG. 17B is a circuit diagram of a substantially equivalent circuit of FIG. 17A. In the high output mode, a differential pair of MOSFETs of AD302 is set to the off state. The differential pair becomes an equivalent circuit that "off capacitances" CP303 and CP304 are left between differential output terminals and VSS. Since AD302 is a differential amplifier for the low output mode, the "off capacitances" CP303 and CP304 and the capacitance CD302 for impedance adjustment are smaller than the "off capacitances" (CP301 and CP302 in FIG. 16) of AD301 for the high output mode and the capacitance CD301. As a result, as shown in FIG. 17A, the broken line part including the differential amplifier AD302 enters a high impedance state.

As described above, the capacitance values of the "off capacitances" CP303 and CP304 of AD302 and the capacitance CD302 are small, and this part is in the high impedance state. Consequently, as an equivalent circuit, as shown in FIG. 17B, the high-impedance part and the part of the primary coils LD313 and LD314 of the transformer coupled to the high-impedance part are extinguished, and only the secondary coil LD322 remains substantially. The differential amplifier AD302 is in the operating state, and its output is magnetically coupled to a secondary coil LD321 of TR301 via primary coils LD311 and LD312 of a transformer TR301 and supplied to the load R1. In such a manner, the "off capacitance" of the differential amplifier AD302 and the capacitance CD302 do not exert large influence on the operation of the differential amplifier AD301. However, since the secondary coil LD322 remains, output impedance matching that takes into account the influence of LD322 is necessary.

As obvious from the above description, according to the fourth embodiment, in both of the high output mode and the low output mode, the influence of the differential amplifier which is in the non-operating state can be reduced as compared with the case of FIG. 2. As a result, the efficiency and gain of the power amplifier in each of the modes can be made higher. In a manner similar to the case of FIG. 7, the configuration that the impedance correction block MBK1 of FIG. 4 is not provided on the side of AD302 by using the fact that the transistor size of AD302 is small is employed. However, obviously, it is also possible to provide the block.

Fifth Embodiment

Circuit Configuration and Operation of High-Frequency Power Amplifying Device in Plural Power Modes (Type 3[1])

Figure 18:
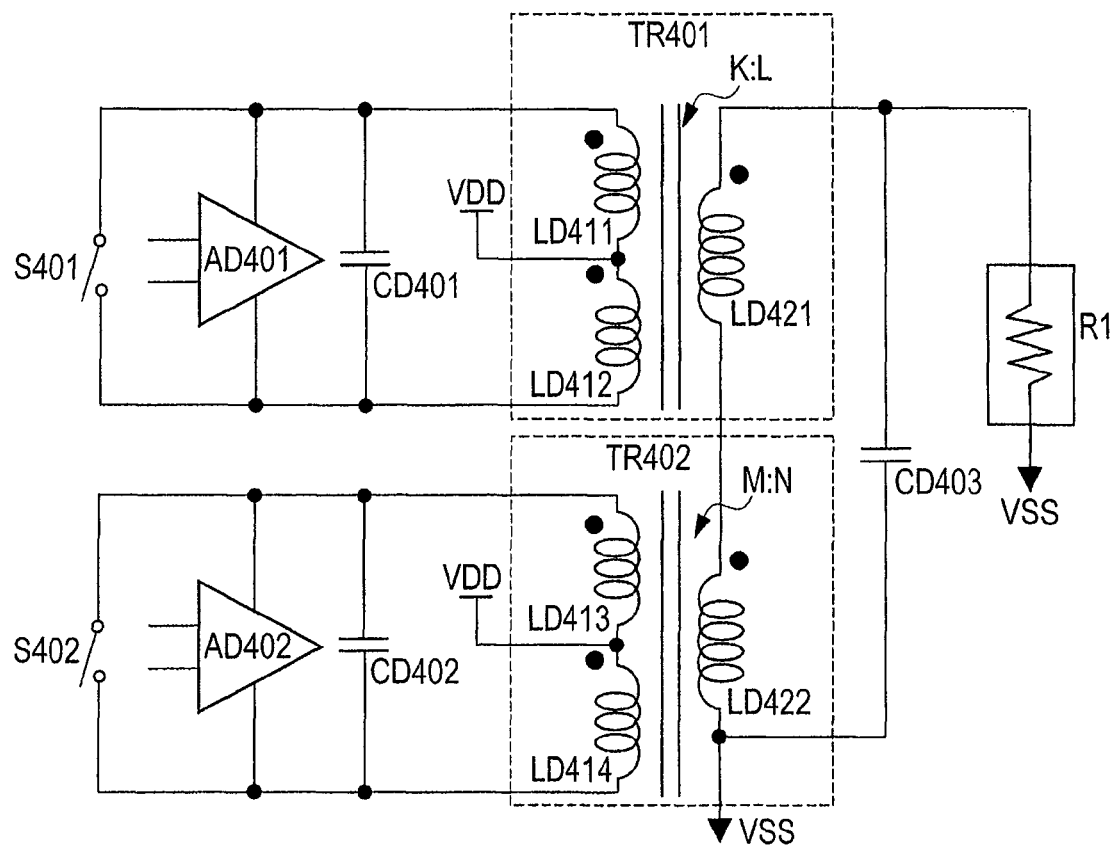
FIG. 18 is a circuit diagram showing an example of the configuration of a high-frequency power amplifying device according to a fifth embodiment of the invention.

FIG. 18 is a circuit diagram showing an example of the configuration of a high-frequency power amplifying device according to a fifth embodiment of the invention. The high-frequency power amplifying device shown in FIG. 18 has two differential amplifiers AD401 and AD402 and two transformers TR401 and TR402. A primary coil of TR401 has a configuration that two coils LD411 and LD412 are coupled in series via a center tap. Similarly, a primary coil of TR402 has a configuration that two coils LD413 and LD414 which are coupled in series via a center tap. To the center tap, the power supply voltage VDD is supplied.

Differential outputs of AD401 are coupled to the primary coils LD411 and LD412 of the transformer TR401 and, further, magnetically coupled to a secondary coil LD421 of TR401. Differential outputs of AD402 are coupled to the primary coils LD413 and LD414 of the transformer TR402 and, further, magnetically coupled to a secondary coil LD422 of TR402. The secondary coils LD421 and LD422 are coupled in series and are coupled between one of the terminals of the load R1 and the ground power supply voltage VSS. A capacitance CD403 for impedance adjustment is coupled between both ends of the series coupling of LD421 and LD422. The gate width (or emitter area) of a transistor as a component of the differential amplifier AD401 is larger than that of a transistor as a component of AD402.

The turn ratio (K/L) between the primary coil and the secondary coil of the transformer TR401 is lower than the turn ratio (M/N) in the transformer TR402 as the difference between the output impedances of AD401 and AD402 is reflected. A capacitance CD401 is coupled between differential outputs of AD401, to which a switch S401 is coupled in parallel. A capacitance CD402 is coupled between differential outputs of AD402, to which a switch S402 is coupled. In the high output mode, AD401 is in the operating state, and AD402 is in the non-operating state. In the low output mode, AD402 is in the operating state, and AD401 is in the non-operating state. Transistors as components of the differential amplifiers AD401 and AD402 may be MOSFETs, compound FETs, bipolar transistors, or the like. Each of internal circuits of the differential amplifiers may be a simple differential pair of transistors or a circuit obtained by combining a plurality of transistors to the differential pair.

Figure 19A:
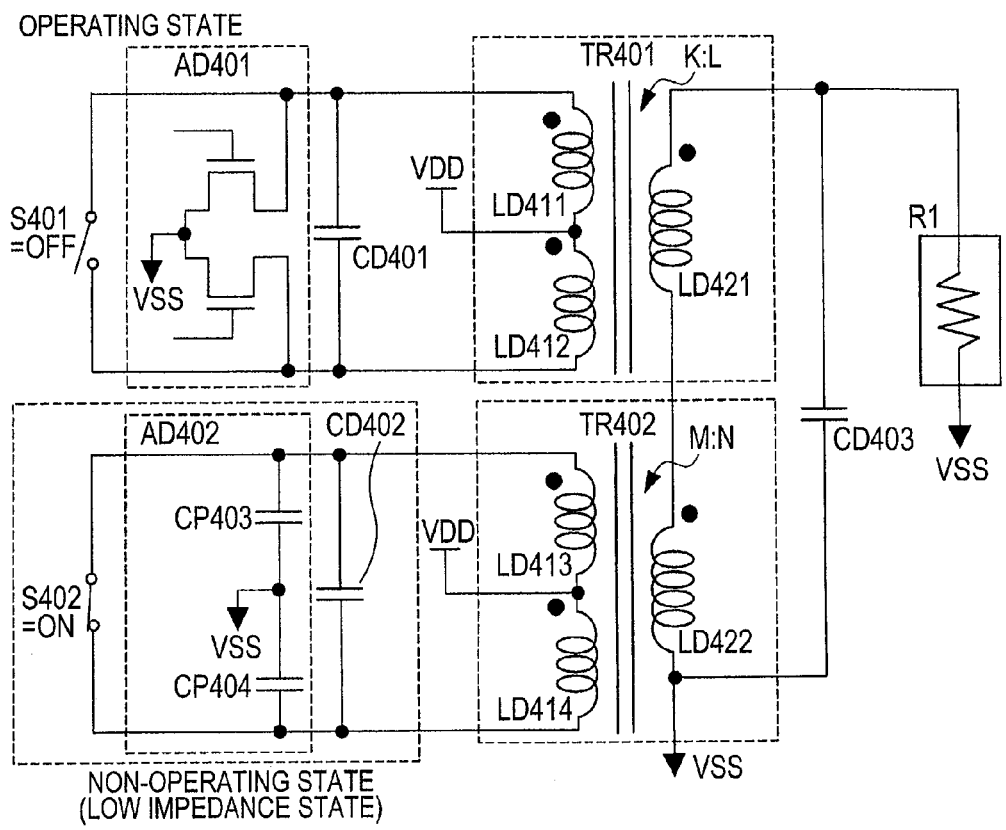
FIG. 19A is a circuit diagram showing a state of the case of operating the high-frequency power amplifying device of FIG. 18 in the high output mode.
Figure 19B:
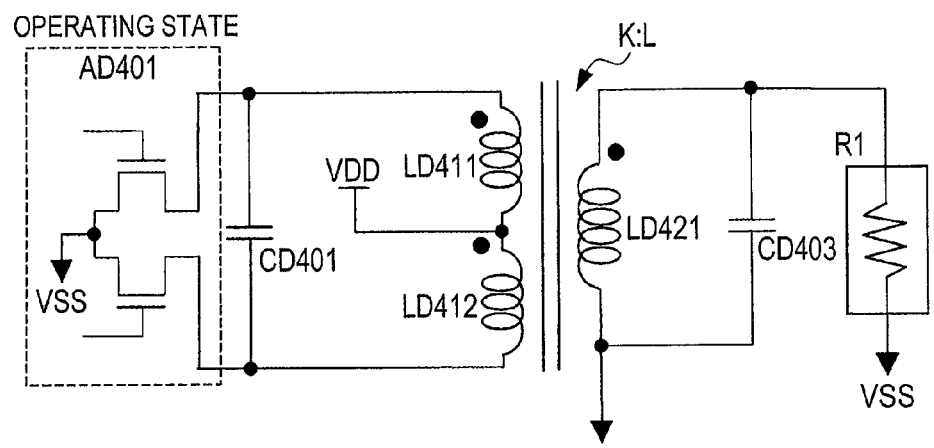
FIG. 19B is a circuit diagram showing a substantial equivalent circuit of the circuit of FIG. 19A.

FIG. 19A is a circuit diagram showing a state of a case where the high-frequency power amplifying device of FIG. 18 is operated in the high output mode. FIG. 19B is a circuit diagram of a substantially equivalent circuit of FIG. 19A. A case of constructing each of the differential amplifiers AD401 and AD402 by a differential pair of MOSFETs will be described as an example. In this case, the gate width of MOSFETs constructing AD401 is larger than that of MOSFETs constructing AD402. In the high output mode, a differential pair of MOSFETs of AD402 is set to the off state. The differential pair becomes an equivalent circuit that "off capacitances" CP403 and CP404 are left between differential output terminals and VSS. The switch S402 is controlled to be on, the switch S401 is controlled to be off, and differential outputs of AD402 are short-circuited. As a result, as shown in FIG. 19A, a broken-line part including AD402 is in the low impedance state. That is, the configuration around AD402 is the configuration of the type 3 of FIG. 6.

In this case, equivalently, as shown in FIG. 19B, when TR402 is ideal and its combined multiplier K=1, the secondary coil LD422 is short-circuited and extinguished from the circuit diagram. The differential amplifier AD401 is in the operating state and its output is magnetically coupled to the secondary coil LD421 of TR401 via primary coils LD411 and LD412 of the transformer TR401 and supplied to the load R1. As described above, the "off capacitance" of the differential amplifier AD402 and the CD402 do not exert large influence on the operation of the differential amplifier AD401.

Further, in the fifth embodiment, in comparison with the case of FIG. 3, the following effect is obtained. That is, since a transistor in the differential amplifier AD402 is off, there is no DC coupling between the power supply voltage VDD coupled to the center tap of the primary coils LD413 and LD414 of the transformer TR402 and VSS. As a result, increase in power consumption caused by through current between VDD and VSS, which can be a problem in the case of FIG. 3, can be prevented. There is also an effect that voltage control of the power supply to prevent the through current becomes unnecessary. Further, as compared with the case of FIG. 17B described in the fourth embodiment, equivalently, the secondary coil (LD422 in FIG. 18 corresponding to LD322 in FIG. 17) disappears. Thus, facilitation of output impedance adjustment can be realized.

Figure 20A:
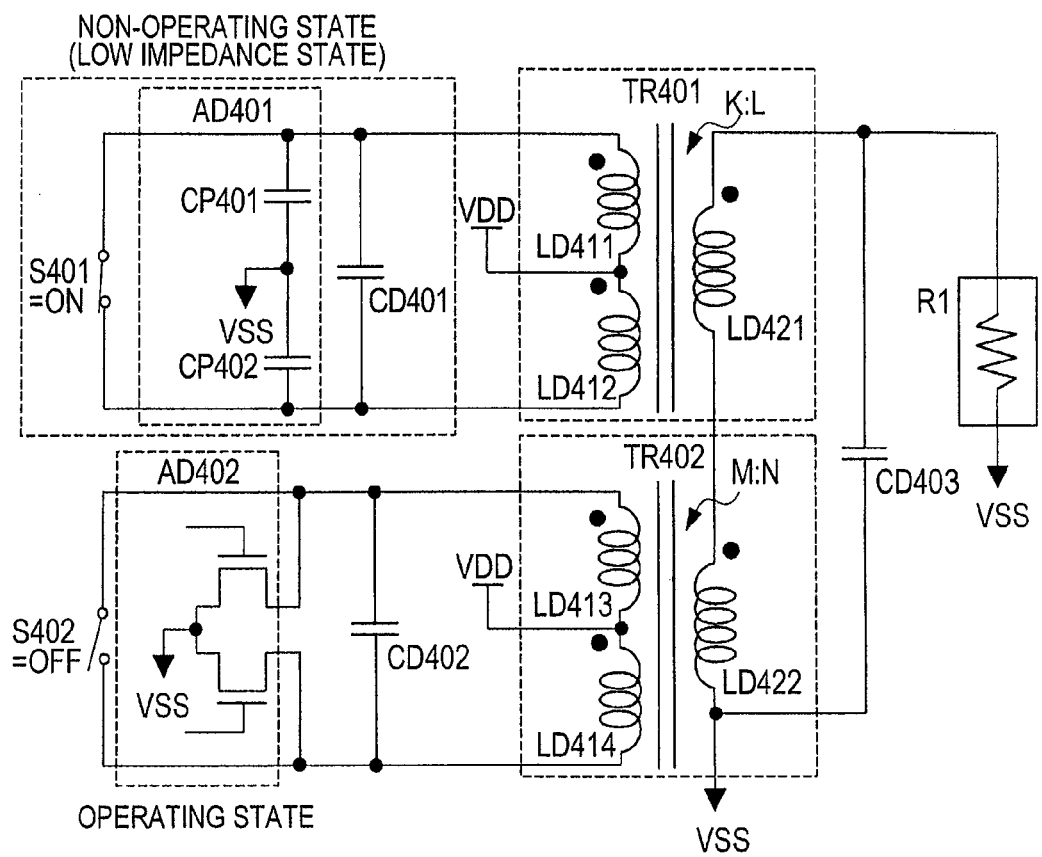
FIG. 20A is a circuit diagram showing a state of the case of operating the high-frequency power amplifying device of FIG. 18 in the low output mode.
Figure 20B:
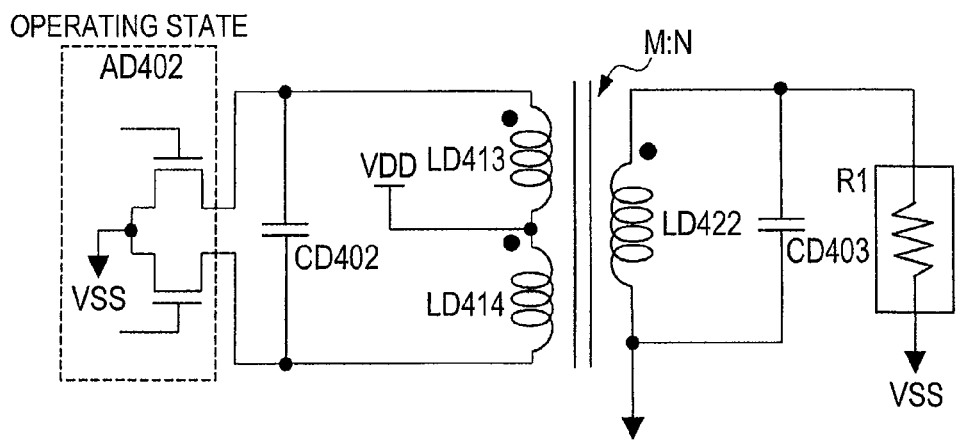
FIG. 20B is a circuit diagram showing a substantial equivalent circuit of FIG. 20A.

FIG. 20A is a circuit diagram showing a state of a case where the high-frequency power amplifying device of FIG. 18 is operated in the low output mode. FIG. 20B is a circuit diagram of a substantially equivalent circuit of FIG. 20A. In the low output mode, a differential pair of MOSFETs of AD401 is set to the off state. The differential pair becomes an equivalent circuit that "off capacitances" CP401 and CP402 are left between differential output terminals and VSS. The switch S401 is controlled to be on, the switch S402 is controlled to be off, and differential outputs of AD401 are short-circuited. As a result, as shown in FIG. 20A, a broken-line part including AD401 is in the low impedance state. That is, the configuration around AD401 is the configuration of the type 3 of FIG. 6 like the part around AD402.

In this case, the differential outputs of the differential amplifier AD401 and both ends of the primary coils LD411 and LD412 of the transformer TR401 to which the differential outputs are coupled are short-circuited. As a result, in the case where TR401 is ideal and its combined multiplier K=1, the secondary coil LD421 is short-circuited and extinguished from the circuit diagram as shown in FIG. 20A. The differential amplifier AD402 is in the operating state and its output is magnetically coupled to the secondary coil LD422 of TR401 via primary coils LD413 and LD414 of the transformer TR402 and supplied to the load R1. As described above, the "off capacitance" of the differential amplifier AD401 and the capacitance CD401 do not exert large influence on the operation of the differential amplifier AD402.

In a manner similar to the above-described high output mode, the transistor in the differential amplifier AD401 is off, so that there is no DC coupling between the power supply voltage VDD coupled to the center tap of the primary coils LD411 and LD412 of the transformer TR401 and VSS. As a result, increase in power consumption accompanying through current which can become a problem in the case of FIG. 3 can be prevented. There is also an effect that voltage control of the power supply to prevent the through current becomes unnecessary. Further, as compared with the case of FIG. 16B, facilitation of output impedance adjustment can be realized.

Layout of High-Frequency Power Amplifying Device in Plural Power Modes (Type 3[1])

Figure 21:
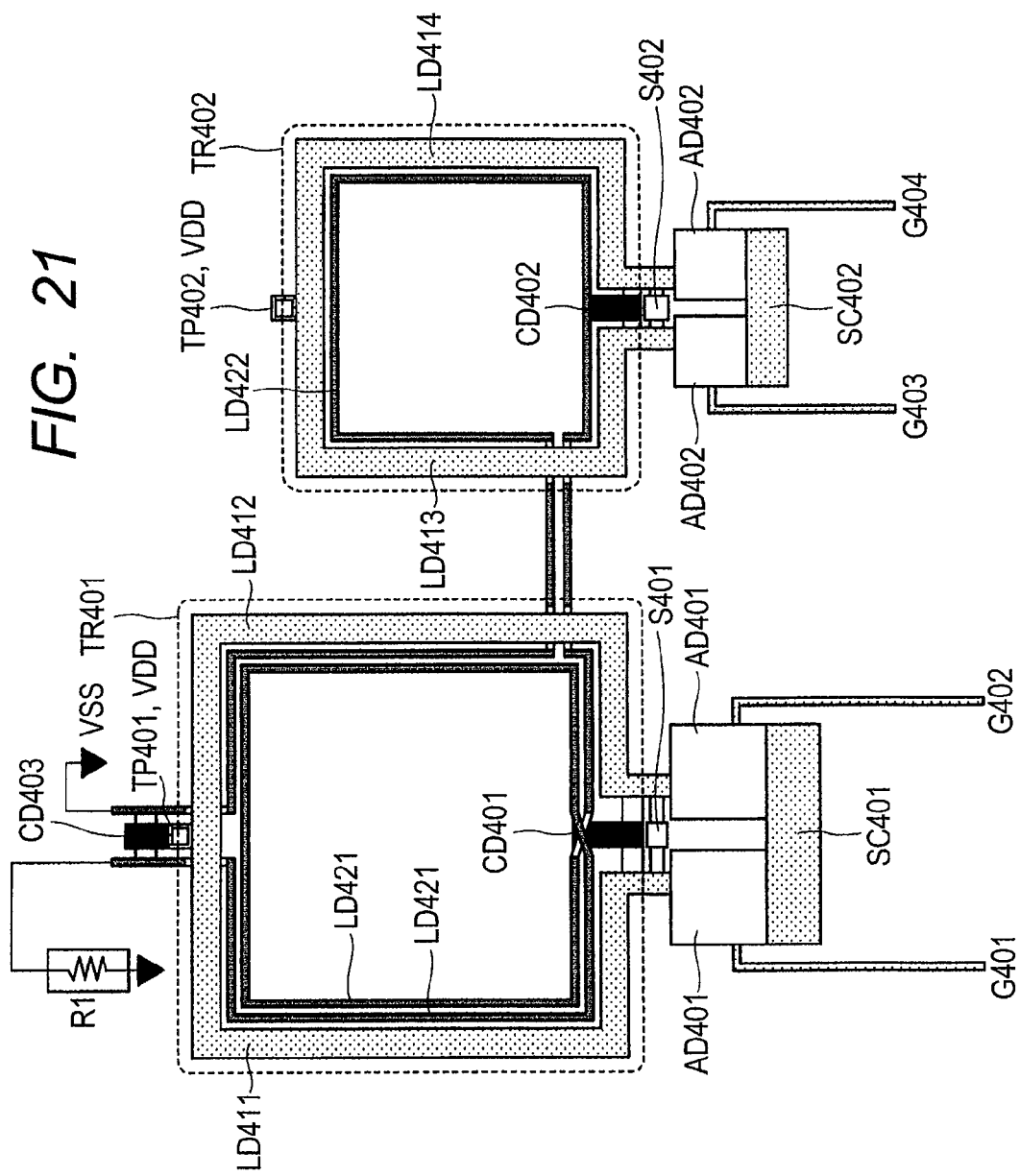
FIG. 21 is a plan view showing a schematic layout configuration example of the high-frequency power amplifying device of FIG. 18.

FIG. 21 is a plan view showing an example of a schematic layout of the high-frequency power amplifying device of FIG. 18. The names of parts to which reference numerals are designated in the diagram are the same as those in FIG. 18. TP401 denotes a center tap of the primary coils LD411 and LD412 of the transformer TR401, and TP402 denotes a center tap of the primary coils LD413 and LD414 of TR402. To the center tap, VDD is supplied. SC401 denotes a common source line of the differential pair of MOSFETs constructing the differential amplifier AD401. SC402 denotes a common source line of the differential pair of MOSFETs constructing the differential amplifier AD402. To the common source line, VSS is supplied. G401 and G402 are gate input lines (differential input lines) of the differential pair of MOSFETs in AD401, and G403 and G404 are gate input lines (differential input lines) of the differential pair of MOSFETs in AD402.

In such a configuration, each of the capacitances CD401, CD402, and CD403 is realized by, for example, the MIM (Metal-Insulator-Metal) structure. The transformer TR401 has a primary coil made by LD411 and LD412 and a secondary coil LD421. The transformer TR402 has a primary coil made by LD413 and LD414 and a secondary coil LD422. Each of the primary coils of both of the transformers has one turn. The primary coil of TR401 has a center tap TP401, and the primary coil of TR402 has a center tap TP402. The secondary coil LD421 of TR401 has two turns, and the secondary coil LD422 of TR402 has one turn. The secondary coils are coupled to each other in series, one end is coupled to VSS, and the other end is coupled to the load R1. Each of the coils is formed by, for example, a metal film wire and realized by a so-called on-chip inductor structure.

The capacitance CD403 is coupled between both ends of the primary coils LD421 and LD422 which are coupled in series. To the differential outputs of AD401, the switch S401, the capacitance CD401, and the primary coil of the transformer TR401 made by LD411 and LD412 are coupled in parallel. To the differential outputs of AD402, the switch S402, the capacitance CD402, and the primary coil of the transformer TR402 made by LD413 and LD414 are coupled in parallel. As described above, the high-frequency power amplifying device of FIG. 18 can be realized by a single semiconductor chip as understood from FIG. 21 and, thus, downsizing of the high-frequency power amplifying device can be realized.

According to the fifth embodiment, in all of the high output mode, the intermediate output mode, and the low output mode, the influence of the differential amplifier which is in the non-operating state can be made smaller than that in the case of FIG. 2, and power consumption can be reduced more than that in the case of FIG. 3. As compared with the cases of FIGS. 16 and 17, facilitation of the output impedance matching can be also realized. As a result of them, as compared with the cases of FIGS. 2 and 3, the efficiency and gain of the power amplifier in each of the modes can be increased.

Sixth Embodiment

Circuit Configuration and Operation of High-Frequency Power Amplifying Device in Plural Power Modes (Type 1 [3])

Figure 22:
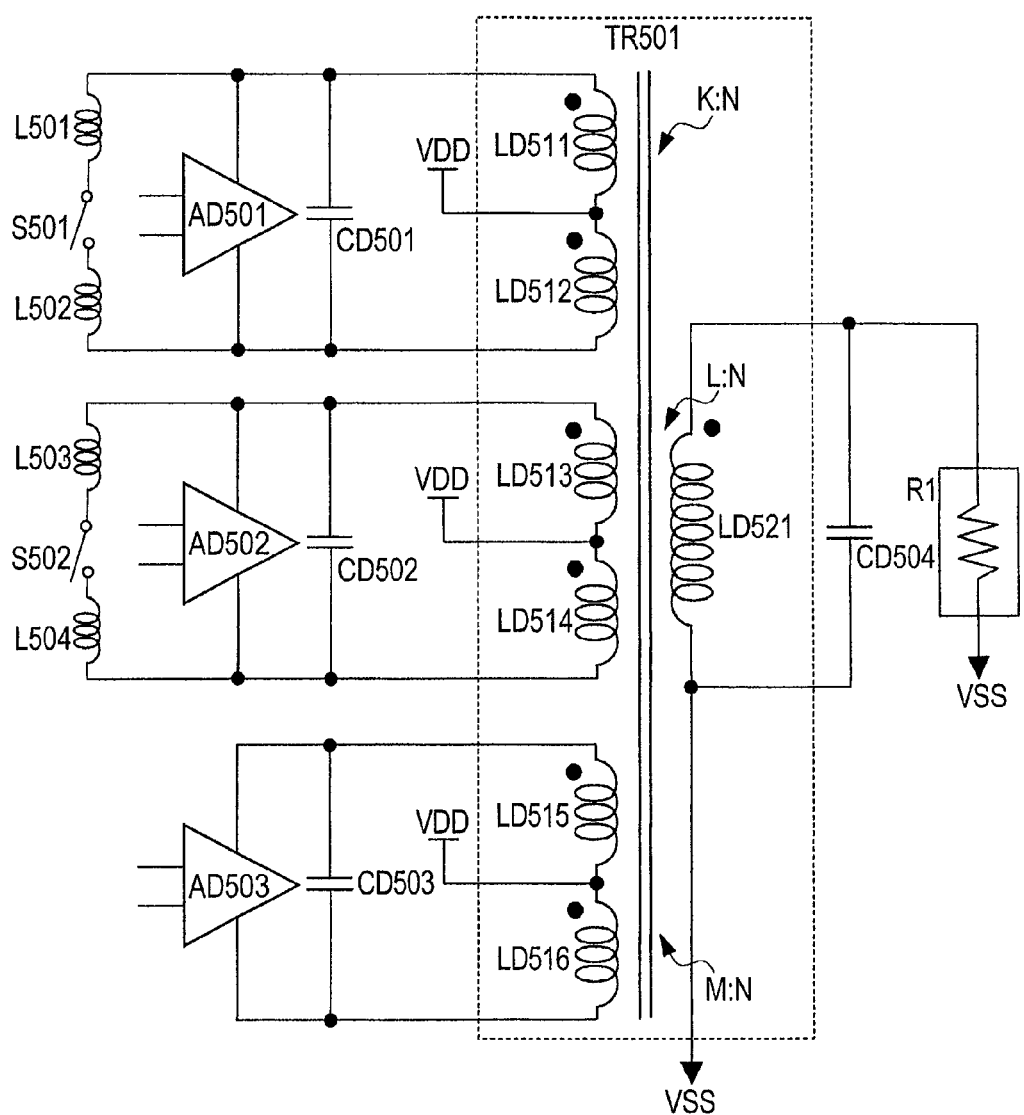
FIG. 22 is a circuit diagram showing an example of the configuration of a high-frequency power amplifying device according to a sixth embodiment of the invention.

FIG. 22 is a circuit diagram showing an example of the configuration of a high-frequency power amplifying device according to a sixth embodiment of the invention. The high-frequency power amplifying device shown in FIG. 22 has three differential amplifiers AD501, AD502, and AD503 and a transformer TR501 made by three primary coils and one secondary coil. The configuration example of FIG. 22 is different from that of FIG. 7 described in the second embodiment with respect to the point that the number of differential amplifiers is increased by one. The differential amplifiers AD501, AD502, and AD503 are for the high output mode, the intermediate output mode, and the low output mode, respectively. One of the three primary coils in the transformer TR501 is constructed by two coils LD511 and LD512, one of them is constructed by two coils LD513 and LD514, and the remaining one is also constructed by two coils LD515 and LD516. LD511 is coupled in series to LD512 via a center tap. Similarly, LD513 is coupled to LD514 via a center tap, and LD515 is coupled to LD516 via a center tap. To each of the center taps, the power supply voltage VDD is supplied.

The three primary coils of TR501 are magnetically coupled to the common secondary coil LD521. Each of the differential amplifiers AD501, AD502, and AD503 is constructed by, for example, a differential pair of MOSFETs, and the gate widths of the differential amplifiers have the relation of AD501>AD502>AD503. Differential outputs of AD501 are coupled to the primary coils LD511 and LD512, differential outputs of AD502 are coupled to the primary coils LD513 and LD514, and differential outputs of AD503 are coupled to the primary coils LD515 and LD516. The turn ratio K/N between the primary coils LD511 and LD512 and the secondary coil LD521, the turn ratio L/N of the primary coils LD513 and LD514 and the secondary coil LD521, and the turn ratio M/N of the primary coils LD515 and LD516 and the secondary coil LD521 satisfy the relation of K/N≤L/N≤M/N in which the differences among the output impedances of AD501, AD502, and AD503 are reflected.

A capacitance CD501 is coupled between differential outputs of. AD501, a capacitance CD502 is coupled between differential outputs of AD502, and a capacitance CD503 is coupled between differential outputs of AD503. An inductor L501, a switch S501, and an inductor L502 are coupled in series also between the differential outputs of AD501. Similarly, an inductor L503, a switch S502, and an inductor L504 are coupled in series also between the differential outputs of AD502. The inductors L501 and L502 have the same inductance value and, similarly, the inductors L503 and L504 have the same inductance value. One end of the secondary coil LD521 is coupled to VSS, and the other end is coupled to the load R1. A capacitance CD504 is coupled between both ends of LD521.

In the high output mode, the switch S501 is off, the switch S502 is on, AD502 and AD503 are in the non-operating state (transistors are off), and AD501 is in the operating state. In the intermediate output mode, the switch S501 is on, the switch S502 is off, AD501 and AD503 are in the non-operating state (transistors are off), and AD502 is in the operating state. In the low output mode, both of the switches S501 and 5502 are on, AD501 and AD502 are in the non-operating state (transistors are off), and AD503 is in the operating state. The inductance values of L501, L502, L503, and L504 are set to values to cancel out the sum of admittances of the capacitances of the MOSFETs which are off and the capacitance for impedance adjustment as described with reference to FIG. 4 (type 1). Therefore, in a manner similar to the case of FIG. 7, the "off capacitance" of the differential amplifiers for the other modes and the capacitance for impedance adjustment in the non-operating state do not exert large influence on the operation of the differential amplifiers for each of the modes.

According to the sixth embodiment, in all of the high output mode, the intermediate output mode, and the low output mode, as compared with the above-described case of FIG. 2, the influence of the differential amplifier which is in the non-operating state can be reduced. As a result, the efficiency and gain of the power amplifier in each of the modes can be increased more. In a manner similar to the case of FIG. 7, using the fact that the transistor size of AD503 is small, the configuration that the impedance correction block MBK1 of FIG. 4 is not provided on the side of AD503 is employed. However, obviously, the block can be also provided.

Seventh Embodiment

Circuit Configuration and Operation of High-Frequency Power Amplifying Device in Plural Power Modes (Type 1 [4])

Figure 23:
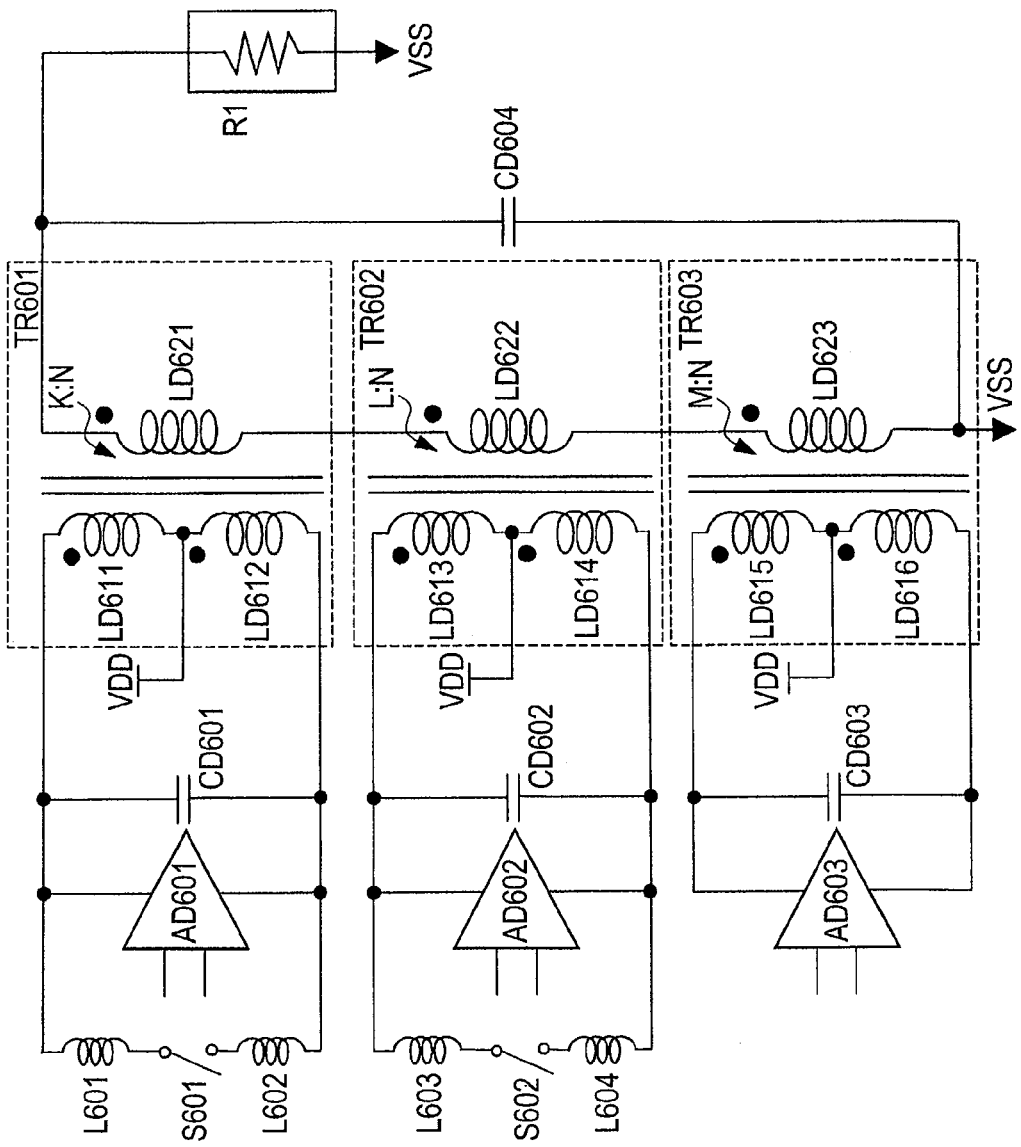
FIG. 23 is a circuit diagram showing an example of the configuration of a high-frequency power amplifying device according to a seventh embodiment of the invention.

FIG. 23 is a circuit diagram showing an example of the configuration of a high-frequency power amplifying device according to a seventh embodiment of the invention. The high-frequency power amplifying device shown in FIG. 23 has three differential amplifiers AD601, AD602, and AD603 and three transformers TR601, TR602, and TR603. The configuration example of FIG. 23 is different from that of FIG. 15 described in the fourth embodiment with respect to the point that the number of differential amplifiers is increased by one. The differential amplifiers AD601, AD602, and AD603 are for the high output mode, the intermediate output mode, and the low output mode, respectively. A primary coil of TR601 is constructed by two coils LD611 and LD612 which are coupled in series via a center tap. Similarly, a primary coil of TR602 is constructed by two coils LD613 and LD614 which are coupled in series via a center tap. A primary coil of TR603 is constructed by two coils LD615 and LD616 which are coupled in series via a center tap. To each of the center taps, the power supply voltage VDD is supplied.

Each of the differential amplifiers AD601, AD602, and AD603 is constructed by, for example, a differential pair of MOSFETs, and the gate widths of the differential amplifiers have the relation of AD601>AD602>AD603. Differential outputs of AD601 are coupled to the primary coils LD611 and LD612 of the transformer TR601 and magnetically coupled to a secondary coil LD621 of TR601. Differential outputs of AD602 are coupled to the primary coils LD613 and LD614 of the transformer TR602 and magnetically coupled to a secondary coil LD622 of TR602. Differential outputs of AD603 are coupled to the primary coils LD615 and LD616 of the transformer TR603 and magnetically coupled to a secondary coil LD623 of TR603.

The turn ratio (K/N) between the primary coils and the secondary coil of TR601, the turn ratio (L/N) of the primary coils and the secondary coil of TR602, and the turn ratio (M/N) of the primary coils and the secondary coil of TR603 satisfy the relation of K/N≤L/N≤M/N in which the differences among the output impedances of AD601, AD602, and AD603 are reflected. The secondary coils LD621, LD622, and LD623 of TR601, TR602, and TR603 are coupled in series, one end of the series coupling is coupled to the ground power supply voltage VSS and the other end is coupled to the load R1. A capacitance CD604 is coupled to both ends of the series coupling of LD621, LD622, and LD623. A capacitance CD601 is coupled between differential outputs of AD601, a capacitance CD602 is coupled between differential outputs of AD602, and a capacitance CD603 is coupled between differential outputs of AD603. Between the differential outputs of AD601, an inductor L601, a switch S601, and an inductor L602 are also coupled in series. Similarly, between the differential outputs of AD602, an inductor L603, a switch S602, an inductor L604 are coupled in series. The inductors L601 and L602 have the same inductance value, and the inductors L603 and L604 have the same inductance value.

In the high output mode, the switch S601 is off, the switch S602 is on, AD602 and AD603 are in the non-operating state (transistors are off), and AD601 is in the operating state. In the intermediate output mode, the switch S601 is on, the switch S602 is off, AD601 and AD603 are in the non-operating state (transistors are off), and AD602 is in the operating state. In the low output mode, both of the switches 5601 and S602 are on, AD601 and AD602 are in the non-operating state (transistors are off), and AD603 is in the operating state. The inductance values of L601, L602, L603, and L604 are set to values to cancel out the sum of admittances of the capacitances of the MOSFETs which are off and the capacitance for impedance adjustment as described with reference to FIG. 4 (type 1). Therefore, in a manner similar to the case of FIG. 15, the "off capacitance" of the differential amplifiers for the other modes and the capacitance for impedance adjustment in the non-operating state do not exert large influence on the operation of the differential amplifiers for each of the modes.

According to the seventh embodiment, in all of the high output mode, the intermediate output mode, and the low output mode, as compared with the above-described case of FIG. 2, the influence of the differential amplifier which is in the non-operating state can be reduced. As a result, the efficiency and gain of the power amplifier in each of the modes can be increased more. In a manner similar to the case of FIG.

7, using the fact that the transistor size of AD603 is small, the configuration that the impedance correction block MBK1 of FIG. 4 is not provided on the side of AD603 is employed. However, obviously, the block can be also provided.

Eighth Embodiment

Circuit Configuration and Operation of High-Frequency Power Amplifying Device in Plural Power Modes (Type 3[2])

Figure 24:
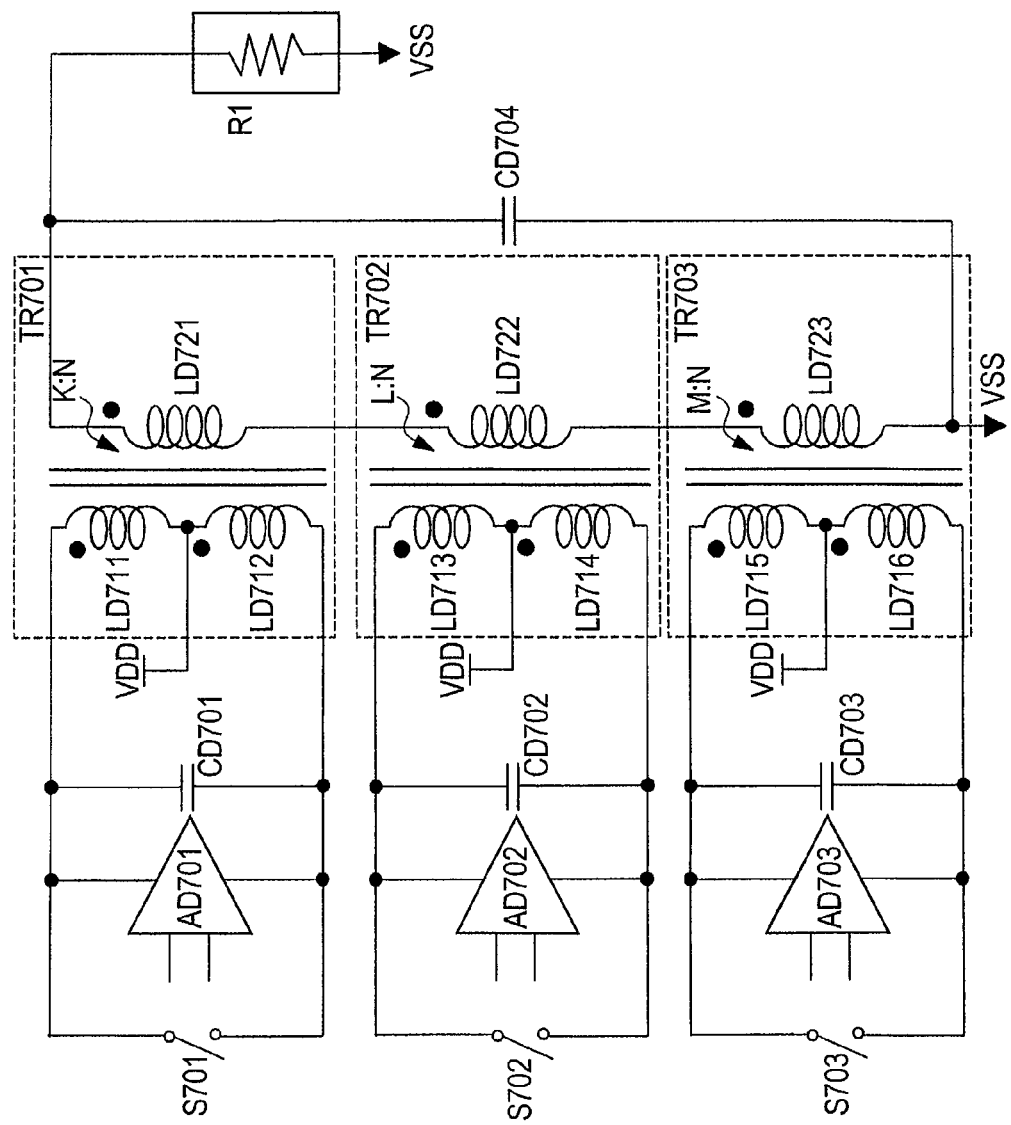
FIG. 24 is a circuit diagram showing an example of the configuration of a high-frequency power amplifying device according to an eighth embodiment of the invention.

FIG. 24 is a circuit diagram showing an example of the configuration of a high-frequency power amplifying device according to an eighth embodiment of the invention. The high-frequency power amplifying device shown in FIG. 24 has three differential amplifiers AD701, AD702, and AD703 and three transformers TR701, TR702, and TR703. The configuration example of FIG. 24 is different from that of FIG. 18 described in the fifth embodiment with respect to the point that the number of differential amplifiers is increased by one. The differential amplifiers AD701, AD702, and AD703 are for the high output mode, the intermediate output mode, and the low output mode, respectively. A primary coil of TR701 is constructed by two coils LD711 and LD712 which are coupled in series via a center tap. Similarly, a primary coil of TR702 is constructed by two coils LD713 and LD714 which are coupled in series via a center tap. A primary coil of TR703 is constructed by two coils LD715 and LD716 which are coupled in series via a center tap. To each of the center taps, the power supply voltage VDD is supplied.

Each of the differential amplifiers AD701, AD702, and AD703 is constructed by, for example, a differential pair of MOSFETs, and the gate widths of the differential amplifiers have the relation of AD701>AD702>AD703. Differential outputs of AD701 are coupled to the primary coils LD711 and LD712 of the transformer TR701 and magnetically coupled to a secondary coil LD721 of TR701. Differential outputs of AD702 are coupled to the primary coils LD713 and LD714 of the transformer TR702 and magnetically coupled to a secondary coil LD722 of TR702. Differential outputs of AD703 are coupled to the primary coils LD715 and LD716 of the transformer TR703 and magnetically coupled to a secondary coil LD723 of TR703. The turn ratio (K/N) between the primary coils and the secondary coil of TR701, the turn ratio (L/N) of the primary coils and the secondary coil of TR702, and the turn ratio (M/N) of the primary coils and the secondary coil of TR703 satisfy the relation of K/N≤L/N≤M/N in which the differences among the output impedances of AD701, AD702, and AD703 are reflected.

The secondary coils LD721, LD722, and LD723 of the transformers TR701, TR702, and TR703 are coupled in series, one end of the series coupling is coupled to the ground power supply voltage VSS and the other end is coupled to the load R1. A capacitance CD704 is coupled to both ends of the series coupling of LD721, LD722, and LD723. A capacitance CD701 is coupled between differential outputs of AD701, a capacitance CD702 is coupled between differential outputs of AD702, and a capacitance CD703 is coupled between differential outputs of AD703. Between the differential outputs of AD701, a switch S701 is also coupled. Similarly, between the differential outputs of AD702, a switch S702 is also coupled. Between the differential outputs of AD703, a switch S703 is also coupled.

In the high output mode, the switch S701 is off, the switches S702 and S703 are on, AD702 and AD703 are in the non-operating state (transistors are off), and AD701 is in the operating state. In the intermediate output mode, the switch S702 is off, the switches S701 and S703 are on, AD701 and AD703 are in the non-operating state (transistors are off), and AD702 is in the operating state. In the low output mode, the switch S703 is off, the switches S701 and S702 are on, AD701 and AD702 are in the non-operating state (transistors are off), and AD703 is in the operating state. By such an operation, in a manner similar to the cases of FIG. 18 and the like, the "off capacitance" of the differential amplifiers for the other modes and the capacitance for impedance adjustment in the non-operating state do not exert large influence on the operation of the differential amplifiers for the respective modes.

According to the eighth embodiment, in all of the high output mode, the intermediate output mode, and the low output mode, as compared with the above-described case of FIG. 2, the influence of the differential amplifier which is in the non-operating state can be reduced. The power consumption can be reduced more than the case of FIG. 3. In addition, as described also with reference to FIG. 18 and the like, facilitation of output impedance matching can be also realized. As a result, the efficiency and gain of the power amplifier in each of the modes can be increased more than the case of FIGS. 2 and 3.

Ninth Embodiment

Circuit Configuration and Operation of High-Frequency Power Amplifying Device in Plural Power Modes (Type 1 [5])

Figure 25:
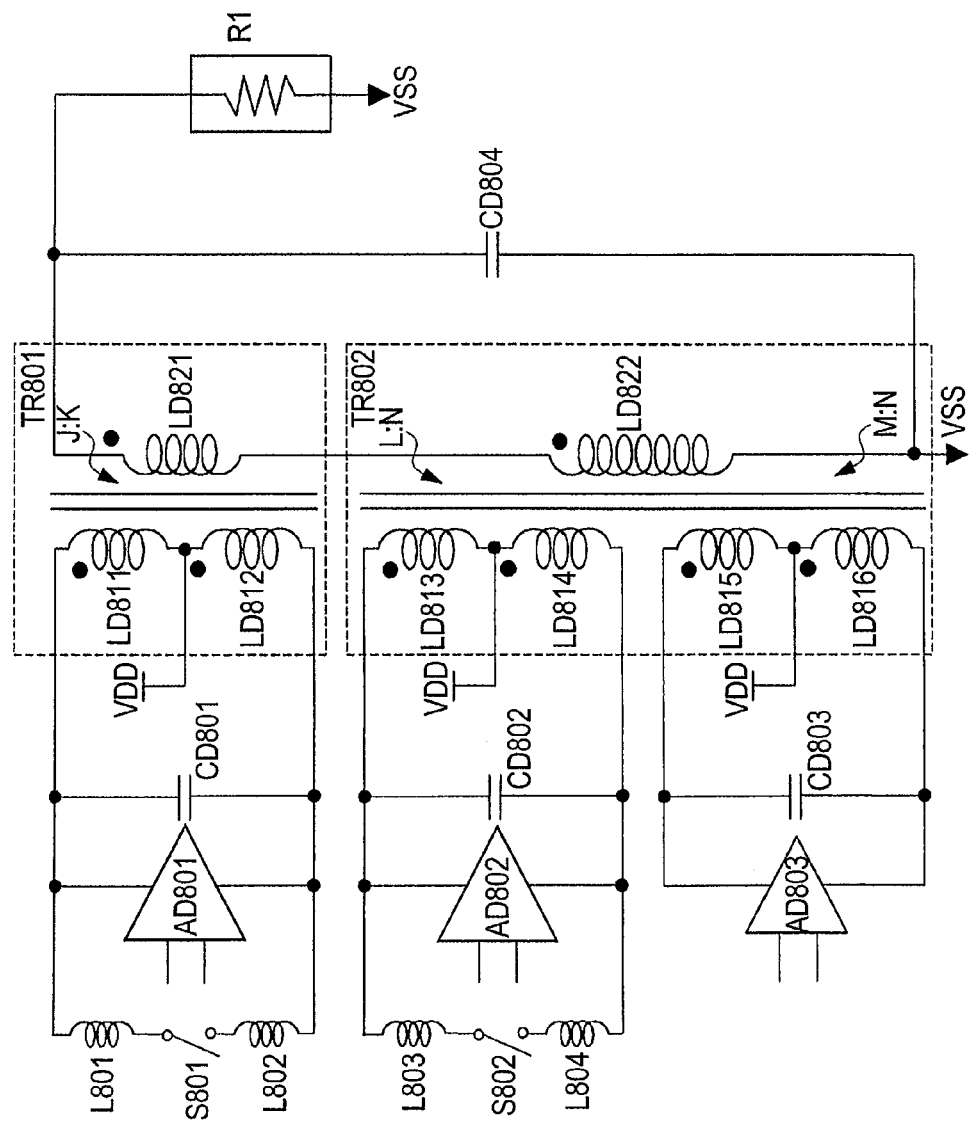
FIG. 25 is a circuit diagram showing an example of the configuration of a high-frequency power amplifying device according to a ninth embodiment of the invention.

FIG. 25 is a circuit diagram showing an example of the configuration of a high-frequency power amplifying device according to a ninth embodiment of the invention. The high-frequency power amplifying device shown in FIG. 25 has three differential amplifiers AD801, AD802, and AD803 and two transformers TR801 and TR802. TR801 has one primary coil and one secondary coil, and TR802 has two primary coils and one secondary coil. The primary coil of TR801 has a configuration that two coils LD811 and LD812 are coupled in series via a center tap, and is magnetically coupled to a secondary coil LD821. One of the two primary coils of TR802 has a configuration that two coils LD813 and LD814 are coupled in series via a center tap, and the other primary coil has a configuration that two coils LD815 and LD816 are coupled in series via a center tap. The two primary coils of TR802 are magnetically coupled to a common secondary coil LD822. The power supply voltage VDD is supplied to the center taps.

The differential amplifiers AD801, AD802, and AD803 are for the high output mode, the intermediate output mode, and the low output mode, respectively. Each of the differential amplifiers AD801, AD802, and AD803 is constructed by, for example, a differential pair of MOSFETs, and the gate widths of the differential amplifiers have the relation of AD801>AD802>AD803. Differential outputs of AD801 are coupled to the primary coils LD811 and LD812 of TR801 and magnetically coupled to the secondary coil LD821 of TR801. Differential outputs of AD802 are coupled to one of the primary coils, LD813 and LD814 of TR802, differential outputs of AD803 are coupled to the other primary coil, LD815 and LD816 of TR802, and the two primary coils are magnetically coupled in parallel to the secondary coil LD822. The turn ratio (J/K) between the primary coil and the secondary coil of TR801, the turn ratio (L/N) as one of the turn ratios of the primary coils and the secondary coil of TR802, and the other turn ratio (M/N) satisfy the relation of J/K≤L/N≤M/N in which the differences among the output impedances of AD801, AD802, and AD803 are reflected.

The secondary coils LD821 and LD822 of the transformers TR801 and TR802 are coupled to each other in series, one end of the series coupling is coupled to the ground power supply voltage VSS, and the other end is coupled to the load R1. A capacitance CD804 is coupled to both ends of the series coupling of LD821 and LD822. A capacitance CD801 is coupled between differential outputs of AD801, a capacitance CD802 is coupled between differential outputs of AD802, and a capacitance CD803 is coupled between differential outputs of AD803. Between the differential outputs of AD801, an inductor L801, a switch S801, and an inductor L802 are coupled in series. Similarly, between the differential outputs of AD802, an inductor L803, a switch S802, and an inductor L804 are coupled in series.

In the high output mode, the switch S801 is off, the switch S802 is on, AD802 and AD803 are in the non-operating state (transistors are off), and AD801 is in the operating state. In the intermediate output mode, the switch S801 is on, the switch S802 is off, AD801 and AD803 are in the non-operating state (transistors are off), and AD802 is in the operating state. In the low output mode, both of the switches S801 and 5802 are on, AD801 and AD802 are in the non-operating state (transistors are off), and AD803 is in the operating state. The inductance values of L801, L802, L803, and L804 are set to cancel out the sum of admittances of the capacitance of the MOSFETs which are off and the capacitance for impedance adjustment as described with reference to FIG. 4 (type 1). Consequently, as described with reference to FIG. 4 and the like, the "off capacitance" of the differential amplifiers for the other modes and the capacitance for impedance adjustment in the non-operating state do not exert large influence on the operation of the differential amplifiers for the respective modes.

According to the ninth embodiment, in all of the high output mode, the intermediate output mode, and the low output mode, as compared with the above-described case of FIG. 2, the influence of the differential amplifier which is in the non-operating state can be reduced. As a result, the efficiency and gain of the power amplifier in each of the modes can be increased more. In a manner similar to the case of FIG. 7, using the fact that the transistor size of AD803 is small, the configuration that the impedance correction block MBK1 as shown in FIG. 4 is not provided on the side of AD803 is employed. However, obviously, the block can be also provided.

Tenth Embodiment

Circuit Configuration and Operation of High-Frequency Power Amplifying Device in Plural Power Modes (Type 1 [6])

Figure 26:
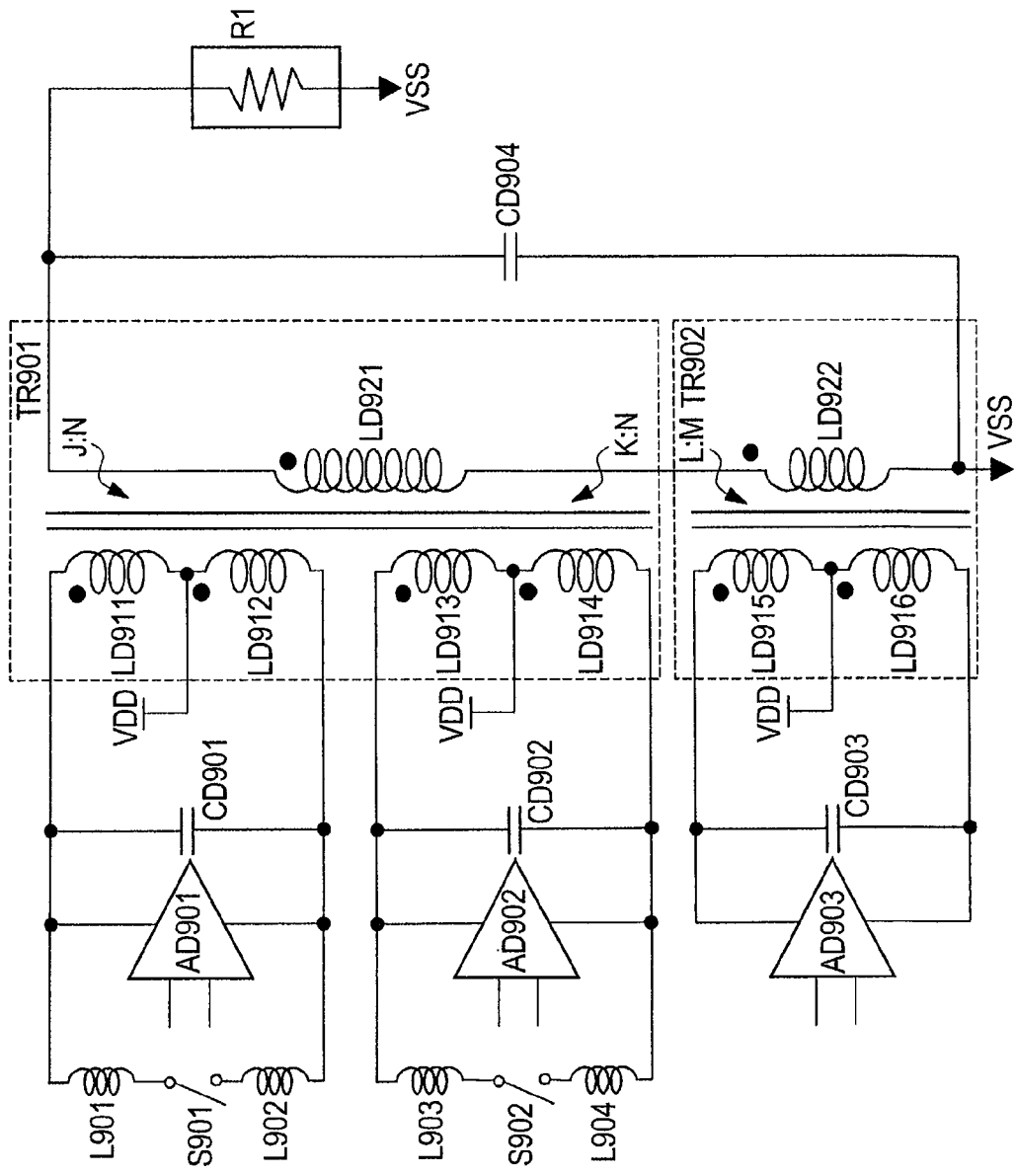
FIG. 26 is a circuit diagram showing an example of the configuration of a high-frequency power amplifying device according to a tenth embodiment of the invention.

FIG. 26 is a circuit diagram showing an example of the configuration of a high-frequency power amplifying device according to a tenth embodiment of the invention. The high-frequency power amplifying device shown in FIG. 26 has three differential amplifiers AD901, AD902, and AD903 and two transformers TR901 and TR902. TR901 has two primary coils and one secondary coil, and TR902 has one primary coil and one secondary coil. One of the two primary coils of TR901 has a configuration that two coils LD911 and LD912 are coupled in series via a center tap, and the other primary coil has a configuration that two coils LD913 and LD914 are coupled in series via a center tap. The two primary coils of TR901 are magnetically coupled to a common secondary coil LD921. The primary coil of TR902 has a configuration that two coils LD915 and LD916 are coupled in series via a center tap and is magnetically coupled to a secondary coil LD922. The power supply voltage VDD is supplied to the center taps.

The differential amplifiers AD901, AD902, and AD903 are for the high output mode, the intermediate output mode, and the low output mode, respectively. Each of the differential amplifiers AD901, AD902, and AD903 is constructed by, for example, a differential pair of MOSFETs, and the gate widths of the differential amplifiers have the relation of AD901>AD902>AD903. Differential outputs of AD901 are coupled to one of the primary coils, LD911 and LD912 of TR901, differential outputs of AD902 are coupled to the other primary coil LD913 and LD914, and the two primary coils are magnetically coupled in parallel to the secondary coil LD921. Differential outputs of AD903 are coupled to the primary coil made by LD915 and LD916 of TR902 and magnetically coupled to the secondary coil LD922. The turn ratio (J/N) as one of the turn ratios between the primary coils and the secondary coil of TR901, the other turn ratio (K/N), and the turn ratio (L/M) of the primary coil and the secondary coil of TR902 have the relation of $J/N \leq K/N \leq L/M$ in which the differences among the output impedances of AD901, AD902, and AD903 are reflected.

The secondary coils LD921 and LD922 of the transformers TR901 and TR902 are coupled to each other in series, one end of the series coupling is coupled to the ground power supply voltage VSS, and the other end is coupled to the load R1. A capacitance CD904 is coupled to both ends of the series coupling of LD921 and LD922. A capacitance CD901 is coupled between differential outputs of AD901, a capacitance CD902 is coupled between differential outputs of AD902, and a capacitance CD903 is coupled between differential outputs of AD903. Between the differential outputs of AD901, an inductor L901, a switch S901, and an inductor L902 are coupled in series. Similarly, between the differential outputs of AD902, an inductor L903, a switch S902, and an inductor L904 are coupled in series.

In the high output mode, the switch S901 is off, the switch S902 is on, AD902 and AD903 are in the non-operating state (transistors are off), and AD901 is in the operating state. In the intermediate output mode, the switch S901 is on, the switch S902 is off, AD901 and AD903 are in the non-operating state (transistors are off), and AD902 is in the operating state. In the low output mode, both of the switches S901 and 5902 are on, AD901 and AD902 are in the non-operating state (transistors are off), and AD903 is in the operating state. The inductance values of L901, L902, L903, and L904 are set to values which cancel out the sum of admittances of the capacitance of the MOSFETs which are off and the capacitance for impedance adjustment as described with reference to FIG. 4. Consequently, as described with reference to FIG. 4 and the like, the "off capacitance" of the differential amplifiers for the other modes and the capacitance for impedance adjustment in the non-operating state do not exert large influence on the operation of the differential amplifiers for the respective modes.

As described above, according to the tenth embodiment, in all of the high output mode, the intermediate output mode, and the low output mode, as compared with the above-described case of FIG. 2, the influence of the differential amplifier which is in the non-operating state can be reduced. As a result, the efficiency and gain of the power amplifier in each of the modes can be increased more. In a manner similar to the case of FIG. 7, using the fact that the transistor size of AD903 is small, the configuration that the impedance correction block MBK1 in FIG. 4 is not provided on the side of AD903 is employed. However, obviously, the block can be also provided.

Eleventh Embodiment

Circuit Configuration and Operation of High-Frequency Power Amplifying Device in Plural Power Modes (Type 1+Type 3 [1])

Figure 27:
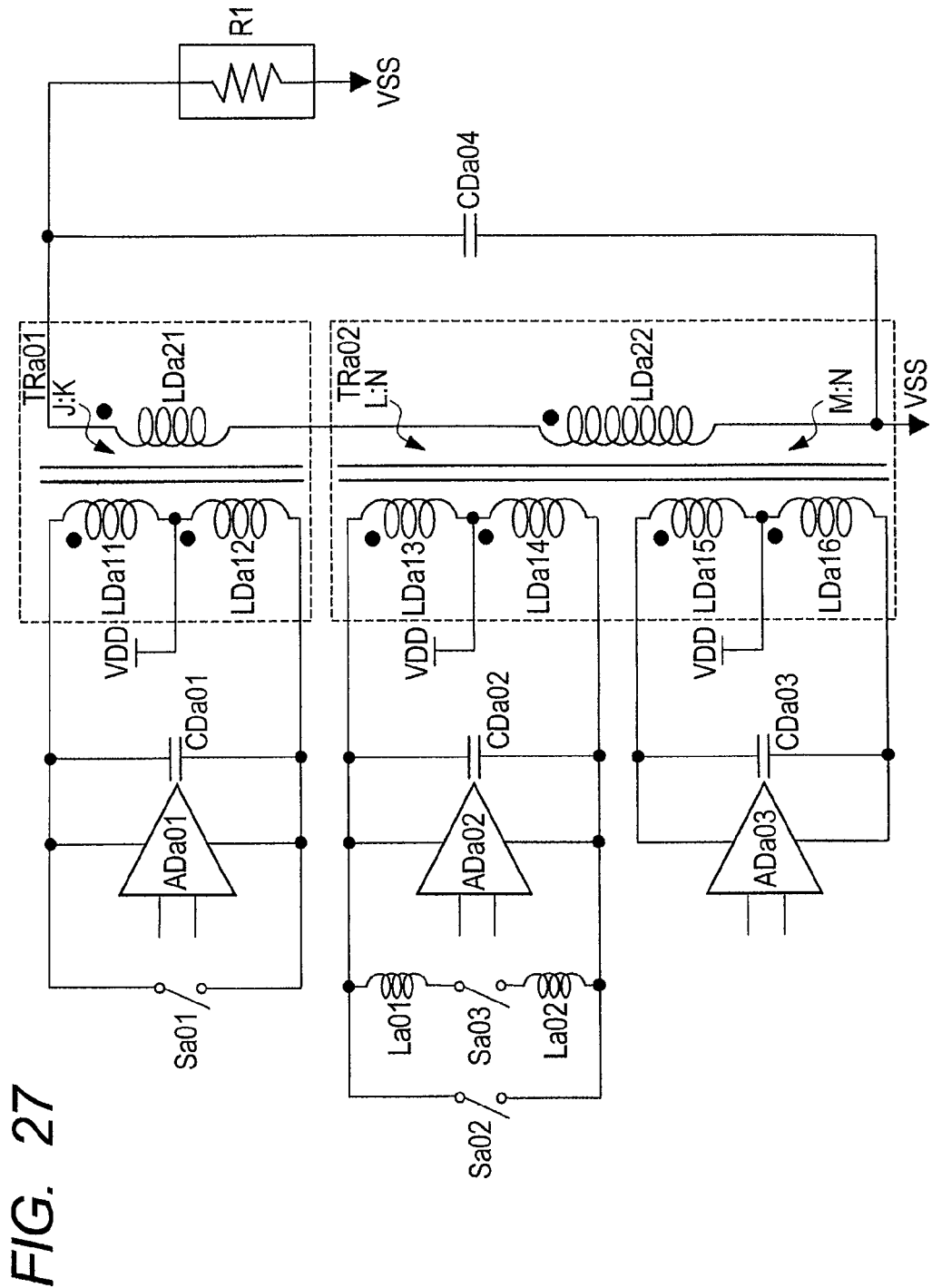
FIG. 27 is a circuit diagram showing an example of the configuration of a high-frequency power amplifying device according to an eleventh embodiment of the invention.

FIG. 27 is a circuit diagram showing an example of the configuration of a high-frequency power amplifying device according to an eleventh embodiment of the invention. The high-frequency power amplifying device shown in FIG. 27 is a modification of the configuration example of FIG. 25 described in the ninth embodiment. The high-frequency power amplifying device has three differential amplifiers ADa01, ADa02, and ADa03 and two transformers TRa01 and TRa02 TRa01 has one primary coil and one secondary coil, and TRa02 has two primary coils and one secondary coil. The primary coil of TRa01 has a configuration that two coils LDa11 and LDa12 are coupled in series via a center tap and magnetically coupled to a secondary coil LDa21. One of the two primary coils of TRa02 has a configuration that two coils LDa13 and LDa14 are coupled in series via a center tap. The other primary coil has a configuration that two coils LDa15 and LDa16 are coupled in series via a center tap. The two primary coils of TRa02 are magnetically coupled to a common secondary coil LDa22. The power supply voltage VDD is supplied to the center taps.

The differential amplifiers ADa01, ADa02, and ADa03 are for the high output mode, the intermediate output mode, and the low output mode, respectively. Each of the differential amplifiers ADa01, ADa02, and ADa03 is constructed by, for example, a differential pair of MOSFETs, and the gate widths of the differential amplifiers have the relation of ADa01>ADa02>ADa03. Differential outputs of ADa01 are coupled to the primary coil made by LDa11 and LDa12 of TRa01 and are magnetically coupled to the secondary coil LDa21 of TRa01. Differential outputs of ADa02 are coupled to one of the primary coils, which is made by LDa13 and LDa14, of TRa02. Differential outputs of ADa03 are coupled to the other primary coil made by LDa15 and LDa16 of TRa02. The two primary coils are magnetically coupled in parallel to the secondary coil LDa22. The turn ratio (J/K) between the primary coil and the secondary coil of TRa01, the turn ratio (L/N) as one of turn ratios of the primary coils and the secondary coil of TRa02, and the other turn ratio (M/N) have the relation of J/K≤L/N≤M/N in which the differences among the output impedances of ADa01, ADa02, and ADa03 are reflected.

The secondary coils LDa21 and LDa22 of the transformers TRa01 and TRa02 are coupled to each other in series, one end of the series coupling is coupled to the ground power supply voltage VSS, and the other end is coupled to the load R1. A capacitance CDa04 is coupled to both ends of the series coupling of LDa21 and LDa22. A capacitance CDa01 is coupled between differential outputs of ADa01, a capacitance CDa02 is coupled between differential outputs of ADa02, and a capacitance CDa03 is coupled between differential outputs of ADa03. Different from the configuration example of FIG. 25, between the differential outputs of ADa01, a switch Sa01 is coupled. Between the differential outputs of ADa02, a series coupling circuit made by an inductor La01, a switch Sa03, and an inductor La02 and a switch Sa02 are coupled in parallel.

In the high output mode, the switch Sa01 is off, the switch Sa02 is on, ADa02 and ADa03 are in the non-operating state (transistors are off), and ADa01 is in the operating state. In this state, the switch Sa03 may be on or, in some cases, off. That is, in this mode, the part around ADa02 has the configuration of type 3 of FIG. 6. Accordingly, in the case where the combined multiplier K=1, it can be regarded that the secondary coil LDa22 of TRa02 is short-circuited. In the intermediate output mode, the switch Sa01 is on, the switches Sa02 and Sa03 are off, ADa01 and ADa03 are in the non-operating state (transistors are off), and ADa02 is in the operating state. That is, in this mode, the configuration around ADa01 is the configuration of type 3 of FIG. 6. Accordingly, in the case where the combined multiplier K=1, it can be regarded that the secondary coil LDa21 of TRa01 is short-circuited.

In the low output mode, both of the switches Sa01 and Sa03 are on, ADa01 and ADa02 are in the non-operating state (transistors are off), and ADa03 is in the operating state. The inductance values of La01 and La02 are set to values which cancel out the sum of admittances of the capacitance of the MOSFETs which are off and the capacitance for impedance adjustment as described with reference to FIG. 4 (type 1). In such a manner, in this mode, the part around ADa01 has the configuration of type 3 of FIG. 6 and the part around ADa02 has the configuration of type 1 of FIG. 4. Consequently, it can be equivalently regarded that LDa21 is short-circuited and one of the primary coils, made by LDa13 and LDa14, does not exist. As described with reference to FIG. 4, therefore, the "off capacitance" of the differential amplifiers for the other modes and the capacitance for impedance adjustment in the non-operating state do not exert large influence on the operation of the differential amplifiers for the other modes. As described with reference to FIG. 6, the problem of power consumption does not also occur. Further, control can be performed properly to regard that the secondary coils LDa21 and LDa22 are short-circuited. Thus, as described with reference to FIG. 18 and the like, facilitation of output impedance matching can be realized.

As described above, according to the eleven embodiment, in all of the high output mode, the intermediate output mode, and the low output mode, the influence of the differential amplifier which is in the non-operating state can be reduced more than that in the case of FIG. 2 and the power consumption can be reduced more than that in the case of FIG. 3. In addition, as also described with reference to FIG. 18 and the like, facilitation of output impedance matching can be also realized. As a result, the efficiency and gain of the power amplifier in each of the modes can be increased more than that of the cases of FIGS. 2 and 3.

Twelfth Embodiment

Circuit Configuration and Operation of High-Frequency Power Amplifying Device in Plural Power Modes (type 1+type 3 [2])

Figure 28:
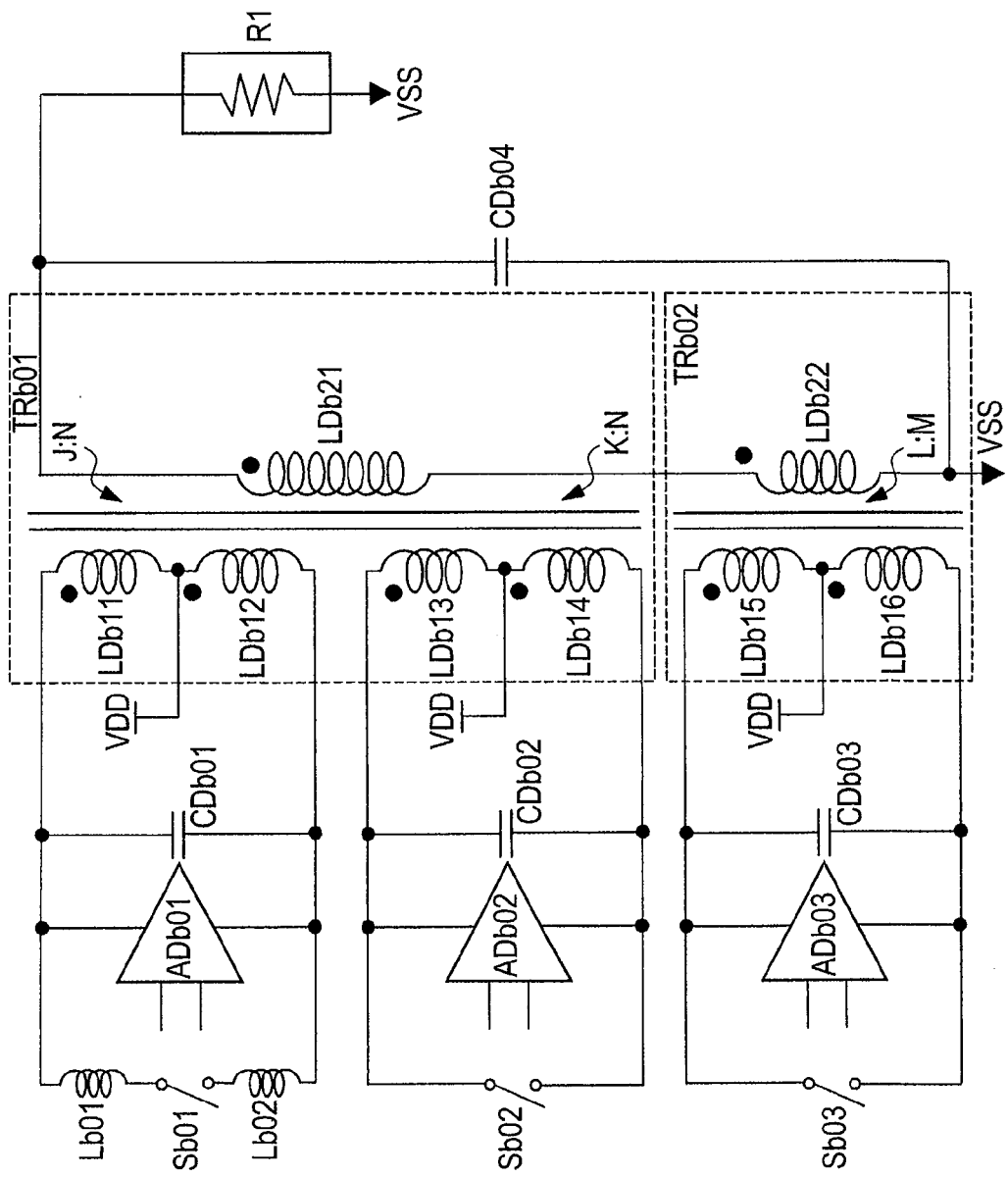
FIG. 28 is a circuit diagram showing an example of the configuration of a high-frequency power amplifying device according to a twelfth embodiment of the invention.

FIG. 28 is a circuit diagram showing an example of the configuration of a high-frequency power amplifying device according to a twelfth embodiment of the invention. The high-frequency power amplifying device shown in FIG. 28 is a modification of the configuration example of FIG. 26 described in the tenth embodiment. The high-frequency power amplifying device has three differential amplifiers ADb01, ADb02, and ADb03 and two transformers TRb01 and TRb02. TRb01 has two primary coils and one secondary coil, and TRb02 has one primary coil and one secondary coil.

One of the primary coils of TRb01 has a configuration that two coils LDb11 and LDb12 are coupled in series via a center tap, and the other primary coil has a configuration that two coils LDb13 and LDb14 are coupled in series via a center tap. The two primary coils of TRb01 are magnetically coupled to a common secondary coil LDb21. The primary coil of TRb02 has a configuration that two coils LDb15 and LDb16 are coupled in series via a center tap and is magnetically coupled to LDb22. The power supply voltage VDD is supplied to the center taps.

The differential amplifiers ADb01, ADb02, and ADb03 are for the high output mode, the intermediate output mode, and the low output mode, respectively. Each of the differential amplifiers ADb01, ADb02, and ADb03 is constructed by, for example, a differential pair of MOSFETs, and the gate widths of the differential amplifiers have the relation of ADb01>ADb02>ADb03. Differential outputs of ADb01 are coupled to one of the primary coils, made by LDb11 and LDb12, of TRb01, differential outputs of ADb02 are coupled to the other primary coil made by LDb13 and LDb14 of TRb01, and the two primary coils are magnetically coupled in parallel to the secondary coil LDb21. Differential outputs of ADb03 are coupled to the primary coil made by LDb15 and LDb16, of TRb02 and are magnetically coupled to the secondary coil LDb22. The turn ratio (J/N) as one of turn ratios between the primary coils and the secondary coil of TRb01, the other turn ratio (K/N), and the turn ratio (L/M) of the primary coil and the secondary coil of TRb02 have the relation of J/N≤K/N≤L/M in which the differences among the output impedances of ADb01, ADb02, and ADb03 are reflected.

The secondary coils LDb21 and LDb22 of the transformers TRb01 and TRb02 are coupled to each other in series, one end of the series coupling is coupled to the ground power supply voltage VSS, and the other end is coupled to the load R1. A capacitance CDb01 is coupled between the differential outputs of ADb01, a capacitance CDb02 is coupled between the differential outputs of ADb02, and a capacitance CDb03 is coupled between the differential outputs of ADb03. Further, between the differential outputs of ADb01, an inductor Lb01, a switch Sb01, and an inductor Lb02 are coupled in series. On the other hand, different from the configuration example of FIG. 26, between the differential outputs of ADb02, a switch Sb02 is coupled. Between the differential outputs of ADb03, a switch Sb03 is coupled.

In the high output mode, the switches Sb01 and Sb02 are off, the switch Sb02 is on, ADb02 and ADb03 are in the non-operating state (transistors are off), and ADb01 is in the operating state. That is, in this mode, the part around ADb03 has the configuration of type 3 of FIG. 6. Accordingly, in the case where the combined multiplier K=1, it can be regarded that the secondary coil LDb22 of TRb02 is short-circuited. With respect to ADb02, it is assumed that the transistor size in the ADb02 is small to a certain degree and the impedance seen from LDb13 and LDb14 of the primary coil to ADb02 side is sufficiently high. In this case, it can be regarded that LDb13 and LDb14 of the primary coil do not exist substantially.

In the intermediate output mode, the switches Sb01 and Sb03 are on, the switch Sb02 is off, ADb01 and ADb03 are in the non-operating state (transistors are off), and ADb02 is in the operating state. That is, in this mode, the part around ADb03 has the configuration of type 3 of FIG. 6 and, accordingly, it can be regarded that the secondary coil LDb22 of TRb02 is short-circuited. The inductance values of Lb01 and Lb02 are set to values which cancel out the sum of admittances of the capacitance of the MOSFETs which are off and the capacitance for impedance adjustment as described with reference to FIG. 4 (type 1). It can be therefore regarded that the primary coil made by LDb11 and LDb12 does not exist equivalently.

In the low output mode, the switch Sb02 is on, the switch Sb03 is off, ADb01 and ADb02 are in the non-operating state (transistors are off), and ADb03 is in the operating state. The switch Sb01 may be on or, in some cases, off. That is, in this mode, the part around ADb01 has the configuration of type 3 of FIG. 6 and, accordingly, it can be regarded that the secondary coil LDb21 of TRb01 is short-circuited. Consequently, as described with reference to FIG. 4, the "off capacitance" of the differential amplifiers for the other modes and the capacitance for impedance adjustment in the non-operating state do not exert large influence on the operation of the differential amplifiers for the modes. As described with reference to FIG. 6, the problem of power consumption does not also occur. Further, control can be performed properly to regard that the secondary coils LDb21 and LDb22 are short-circuited. Thus, as described with reference to FIG. 18 and the like, facilitation of output impedance matching can be realized.

As described above, according to the twelfth embodiment, in all of the high output mode, the intermediate output mode, and the low output mode, the influence of the differential amplifier which is in the non-operating state can be reduced more than that in the case of FIG. 2 and the power consumption can be reduced more than that in the case of FIG. 3. In addition, as also described with reference to FIG. 18 and the like, facilitation of output impedance matching can be also realized. As a result, the efficiency and gain of the power amplifier in each of the modes can be increased more than that of the cases of FIGS. 2 and 3.

Layout of High-Frequency Power Amplifying Device in Plural Power Modes (type 1+type 3 [2])

Figure 29:
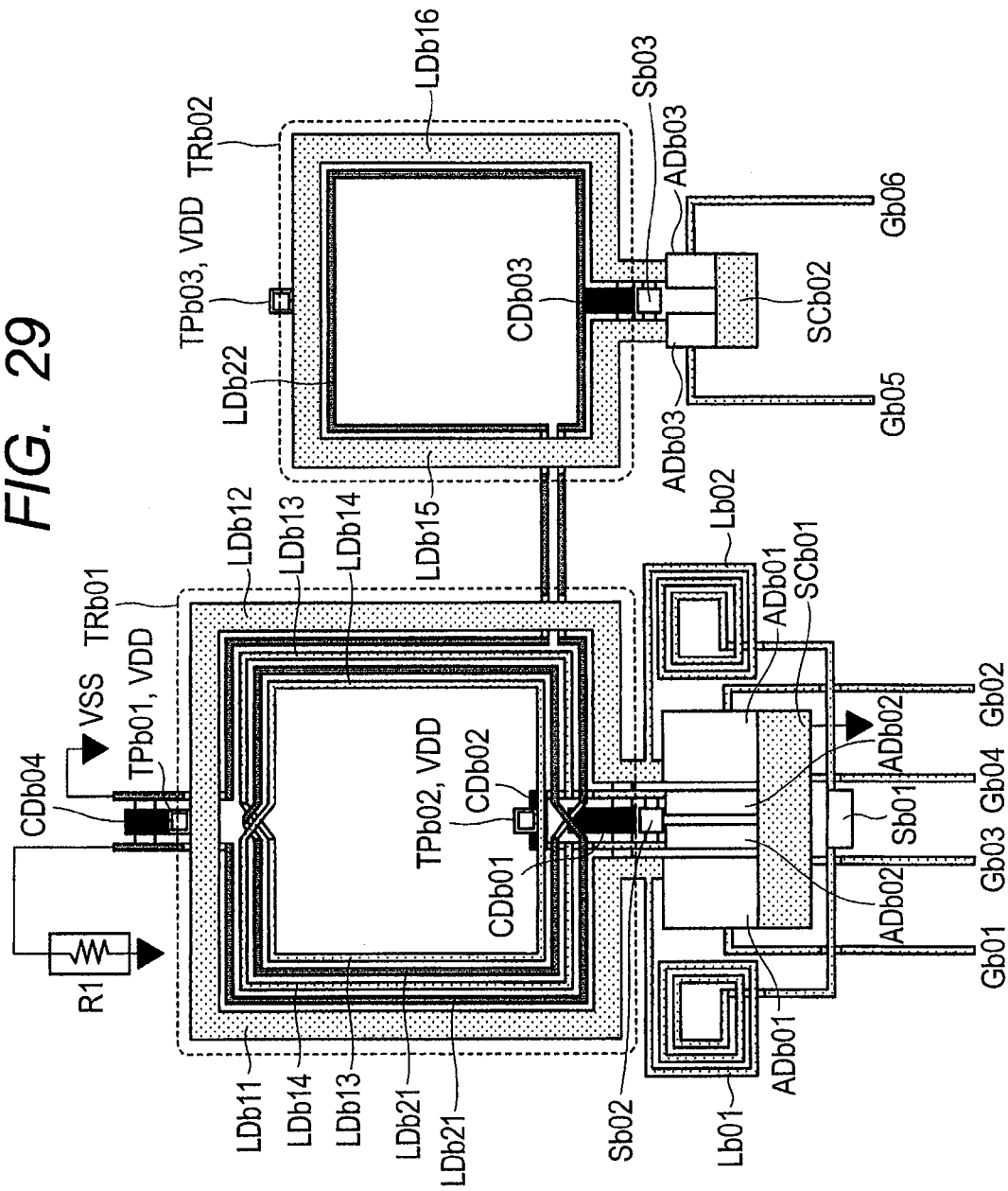
FIG. 29 is a plan view showing a schematic layout configuration example of the high-frequency power amplifying device of FIG. 28.

FIG. 29 is a plan view showing a schematic layout example of the high-frequency power amplifying device of FIG. 28. The names of parts to which reference numerals are designated in the diagram are the same as those in FIG. 28. TPb01 denotes a center tap of one of the primary coils, made by LDb11 and LDb12, of the transformer TRb01, and TPb02 denotes a center tap of the other primary coil made by LDb13 and LDb14 of TRb01. TPb03 denotes a center tap of the primary coil made by LDb15 and LDb16 of the transformer TRb02. To the center tap, VDD is supplied. SCb01 denotes a common source line of the differential pair of MOSFETs constructing the differential amplifiers ADb01 and ADb02, and SCb02 denotes a common source line of the differential pair of MOSFETs constructing the differential amplifier Adb03. VSS is supplied to the common source line. Gb01 and Gb02 are gate input lines (differential input lines) of the differential pair of MOSFETs in ADb01, Gb03 and Gb04 are gate input lines (differential input lines) of the differential pair of MOSFETs in ADb02, and Gb05 and Gb06 are gate input lines (differential input lines) of the differential pair of MOSFETs in Adb03.

In such a configuration, each of the capacitances CDb01, CDb02, CDb03, and CDb04 is realized by, for example, the MIM (Metal-Insulator-Metal) structure. The transformer TRb01 has a primary coil made by LDb11 and LDb12, the other primary coil made by LDb13 and LDb14, and the secondary coil LDb21. The two primary coils are disposed in parallel in proximity of the common secondary coil LDb21 and are magnetically coupled to LDb21. The primary coil made by LDb11 and LDb12 has one turn, and the primary coil made by LDb13 and LDb14 has two turns. The transformer TRb02 has a primary coil made by LDb15 and LDb16 and a secondary coil LDb22. The primary coil made by LDb15 and LDb16 is disposed in proximity of the secondary coil LDb22 and is magnetically coupled to LDb22. Each of the primary coil made by LDb15 and LDb16 and the secondary coil LDb22 has one turn. In the example, the turn ratios (K/N) and (L/M) in FIG. 28 are the same and, according to the differences in output impedances of ADb02 and ADb03, for example, the capacitance values of CDb02 and CDb03 are adjusted.

The secondary coil LDb21 of TRb01 and the secondary coil LDb22 of TRb02 are coupled in series, one end of the series coupling is coupled to VSS, and the other end is coupled to the load R1. A capacitance CDb04 is coupled between both ends of the series coupling of LDb21 and LDb22. Between the differential outputs of ADb01, the inductor Lb01, the switch Sb01, and the inductor Lb02 are coupled in series. Between the differential outputs of ADb01, the capacitance CDb01 and one of the primary coils, which is made by LDb11 and LDb12 of TRb01 are coupled in parallel. Between the differential outputs of ADb02, the switch Sb02 and the capacitance CDb02 are coupled in parallel and, further, the other primary coil of TRb01, which is made by LDb13 and LDb14 is coupled in parallel. Between the differential outputs of ADb03, the capacitance CDb03 and the primary coil of TRb02, which is made by LDb15 and LDb16 are coupled in parallel. Each of the coils is formed by, for example, a metal film line and realized by a so-called on-chip inductor structure. As described above, as understood from FIG. 29, the high-frequency power amplifying device of FIG. 28 can be realized by a single semiconductor chip. Therefore, downsizing of the high-frequency power amplifying device can be realized.

Thirteenth Embodiment

Figure 30:
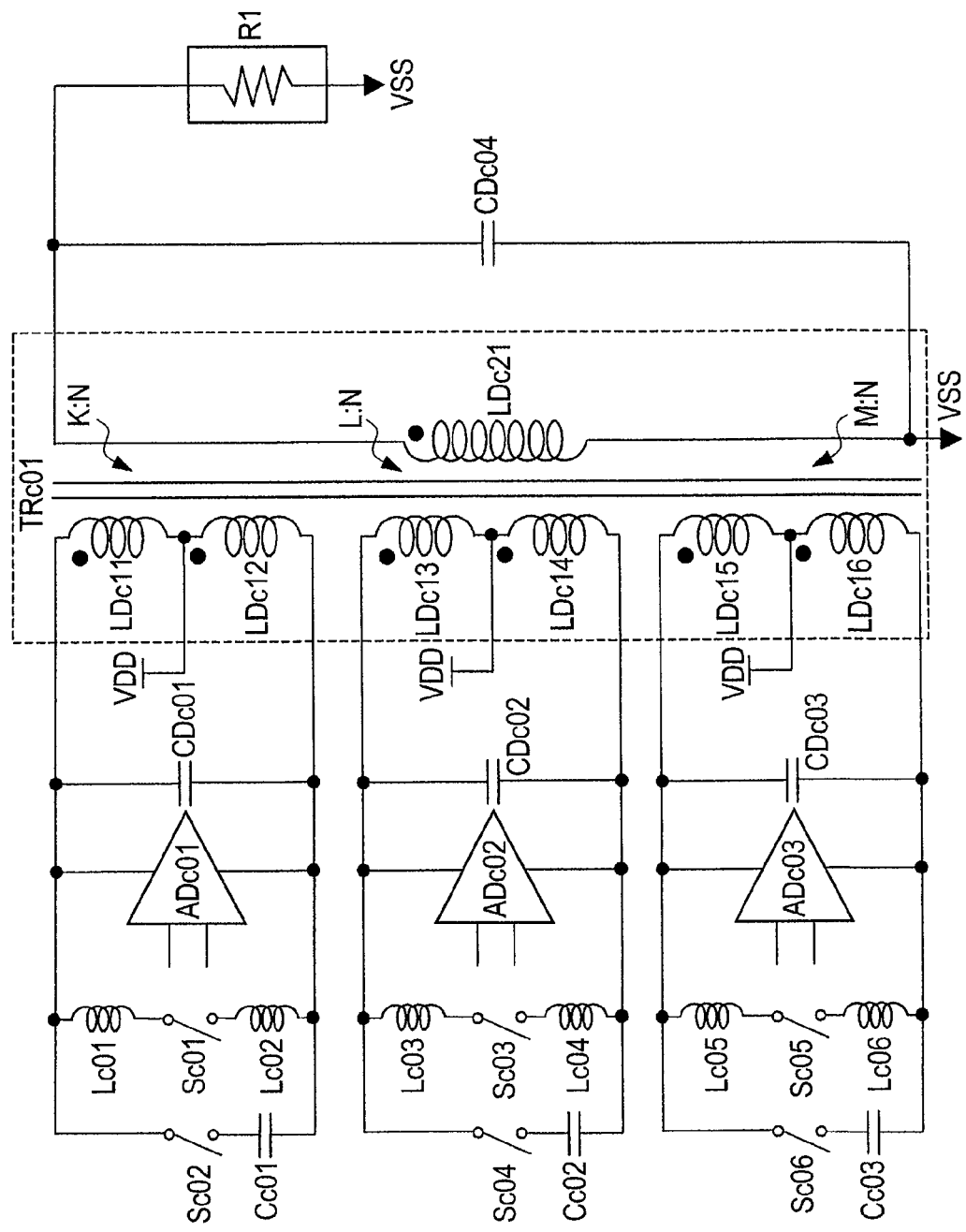
FIG. 30 is a circuit diagram showing an example of the configuration of a high-frequency power amplifying device according to a thirteenth embodiment of the invention.

Circuit Configuration and Operation of High-Frequency Power Amplifying Device of Plural-Band Type FIG. 30 is a circuit diagram showing an example of the configuration of a high-frequency power amplifying device according to a thirteenth embodiment of the invention. The high-frequency power amplifying device shown in FIG. 30 has three differential amplifiers ADc01, ADc02, and ADc03 and a transformer TRc01 made by three primary coils and one secondary coil. In the foregoing embodiments, the high-frequency power amplifying devices of the plural power modes, which switch the operation/non-operation of a plurality of differential amplifiers in accordance with the differences of output levels have been described. In the thirteenth embodiment, a high-frequency power amplifying device of the plural-band type of switching the operation/non-operation of a plurality of differential amplifiers in accordance with the signal frequencies will be described.

The differential amplifiers ADc01, ADc02, and ADc03 are for band 1, band 2, and band 3 (frequency bands: band 1<band 2<band 3). One of the three primary coils of the transformer TRc01 has a configuration that two coils LDc11 and LDc12 are coupled in series via a center tap. Another one of the three primary coils of TRc01 has a configuration that two coils LDc13 and LDc14 are coupled in series via a center tap. The remaining primary coil has a configuration that two coils LDc15 and LDc16 are coupled in series via a center tap. The three primary coils are magnetically coupled to a common secondary coil LDc21 of TRc01. To the center taps, the power supply voltage VDD is supplied.

Each of the differential amplifiers ADc01, ADc02, and ADc03 is constructed by, for example, a differential pair of MOSFETs. Differential outputs of ADc01 are coupled to the primary coil made by LDc11 and LDc12, differential outputs of ADc02 are coupled to the primary coil made by LDc13 and LDc14, and differential outputs of ADc03 are coupled to the primary coil made by LDc15 and LDc16. The turn ratio between the primary coil made by LDc11 and LDc12 and the secondary coil LDc21 is expressed as K/N, the turn ratio between the primary coil made by LDc13 and LDc14 and the secondary coil LDc21 is expressed as L/N, and the turn ratio of the primary coil made by LDc15 and LDc16 and the secondary coil LDc21 is expressed as M/N. A capacitance CDc01 is coupled between differential outputs of ADc01, a capacitance CDc02 is coupled between differential outputs of ADc02, and a capacitance CDc03 is coupled between differential outputs of ADc03.

Further, an inductor Lc01, a switch Sc01, and an inductor Lc02 are coupled in series between the differential outputs of ADc01 and, to the series coupling, a series coupling circuit of a switch Sc02 and a capacitance Cc01 is coupled in parallel. An inductor Lc03, a switch Sc03, and an inductor Lc04 are coupled in series also between the differential outputs of ADc02 and, to the series coupling, a series coupling circuit of a switch Sc04 and a capacitance Cc02 is coupled in parallel. An inductor Lc05, a switch Sc05, and an inductor Lc06 are coupled in series also between the differential outputs of ADc03 and, to the series coupling, a series coupling circuit of a switch Sc06 and a capacitance Cc03 is coupled in parallel. The inductors Lc01 and Lc02 have the same inductance value, the inductors Lc03 and Lc04 have the same inductance value, and the inductors Lc05 and Lc06 have the same inductance value. One end of the secondary coil LDc21 is coupled to the ground power supply voltage VSS, and the other end is coupled to the load R1. A capacitance CDc04 is coupled between both ends of LDc21.

In the band-1 operation mode, the switches Sc01 and Sc02 are off, Sc03 is on, Sc04 is off, Sc05 is on, and Sc06 is off. The differential amplifiers ADc02 and ADc03 are in the non-operating state (transistors are off), and ADc01 is in the operating state. In the frequency band of the band 1, the inductance values of Lc03 and Lc04 are set to values to cancel out the sum of admittances of the capacitance of ADc02 which is in the non-operating state and the capacitance CDc02 for impedance adjustment as described with reference to FIG. 4 (type 1). Similarly, in the frequency band of the band 1, the inductance values of Lc05 and Lc06 are set to values to cancel out the sum of admittances of the capacitance of ADc03 which is in the non-operating state and the capacitance CDc03 for impedance adjustment.

In the band-2 operation mode, the switch Sc01 is on, Sc02 is off, Sc03 and Sc04 are off, Sc05 and Sc06 are on, the differential amplifiers ADc01 and ADc03 are in the non-operating state (transistors are off), and ADc02 is in the operating state. In the frequency band of the band 2, the inductance values of Lc01 and Lc02 are set to values to cancel out the sum of admittances of the capacitance of ADc01 which is in the non-operating state and the capacitance CDc01 for impedance adjustment. In the frequency band of the band 2, the capacitance value of Cc03 is set so that the admittance in the case where Lc05/Lc06 and Cc03 are coupled in parallel cancels out the sum of admittances of the capacitance of ADc03 which is in the non-operating state and the capacitance CDc03 for impedance adjustment. That is, since the inductance values of Lc05 and Lc06 are set using the case of the band 1 as a reference as described above, in the case of the band 2 (in the case where the frequency band increases), the inductor component increases only by the amount. The increase amount of the inductor component is compensated by Cc03.

In the band-3 operation mode, the switches Sc01, Sc02, Sc03 and Sc04 are on, Sc05 and Sc06 are off, the differential amplifiers ADc01 and ADc02 are in the non-operating state (transistors are off), and ADc03 is in the operating state. In the frequency band of the band 3, the capacitance value of Cc01 is set so that the admittance in the case where Lc01/Lc02 and Cc03 are coupled in parallel cancels out the sum of admittances of the capacitance of ADc01 which is in the non-operating state and the capacitance CDc01 for impedance adjustment. In the frequency band of the band 3, the capacitance value of Cc02 is set so that the admittance in the case where Lc03/Lc04 and Cc02 are coupled in parallel cancels out the sum of admittances of the capacitance of ADc02 which is in the non-operating state and the capacitance CDc02 for impedance adjustment.

That is, since the inductance values of Lc01 and Lc02 are set using the case of the band 2 as a reference as described above, in the case of the band 3 (in the case where the frequency band increases), the inductance component increases only by the amount. The increase amount of the inductor component is compensated by Cc01. Similarly, since the inductance value of Lc03/Lc04 is set using the case of the band 1 as a reference as described above, in the case of the band 3 (in the case where the frequency band increases), the inductance component increases only by the amount. Consequently, the increase amount of the inductance component is compensated by Cc02. As a result, as described with reference to FIG. 4, on the operation of the differential amplifiers for each of the bands, the capacitance of the differential amplifiers for the other bands which are in the non-operating state and the capacitance for impedance adjustment do not exert large influence.

According to the thirteenth embodiment, in all of the three bands, as compared with the above-described case of FIG. 2, the influence of the differential amplifiers which are in the non-operating state can be reduced. As a result, the efficiency and gain of the power amplifier in each of the bands can be made higher. By compensating a fluctuation accompanying the frequency band of the inductance component in the impedance correction block MBK1 of FIG. 4 by properly adding a capacitance component, the influence of the differential amplifiers which are in the non-operating state can be reduced more. Although the configuration that each of the inductance values is set using the band on the lower frequency side as a reference and, in the case where the band is changed to the band on the higher frequency side, compensation is made with the capacitance component is employed, for example, each of the inductance values can be set using the band on the higher frequency side as a reference. In this case, when the band is changed to the band on the lower frequency side, an insufficient inductance component is compensated with another inductance component. However, since the circuit area of the inductor is usually larger than that of the capacitance, from the viewpoint of circuit area, it is desirable to use the configuration of compensating the capacitance component as shown in FIG. 30.

Fourteenth Embodiment

Switch Configuration [1] of Impedance Correction Block

Figure 31:
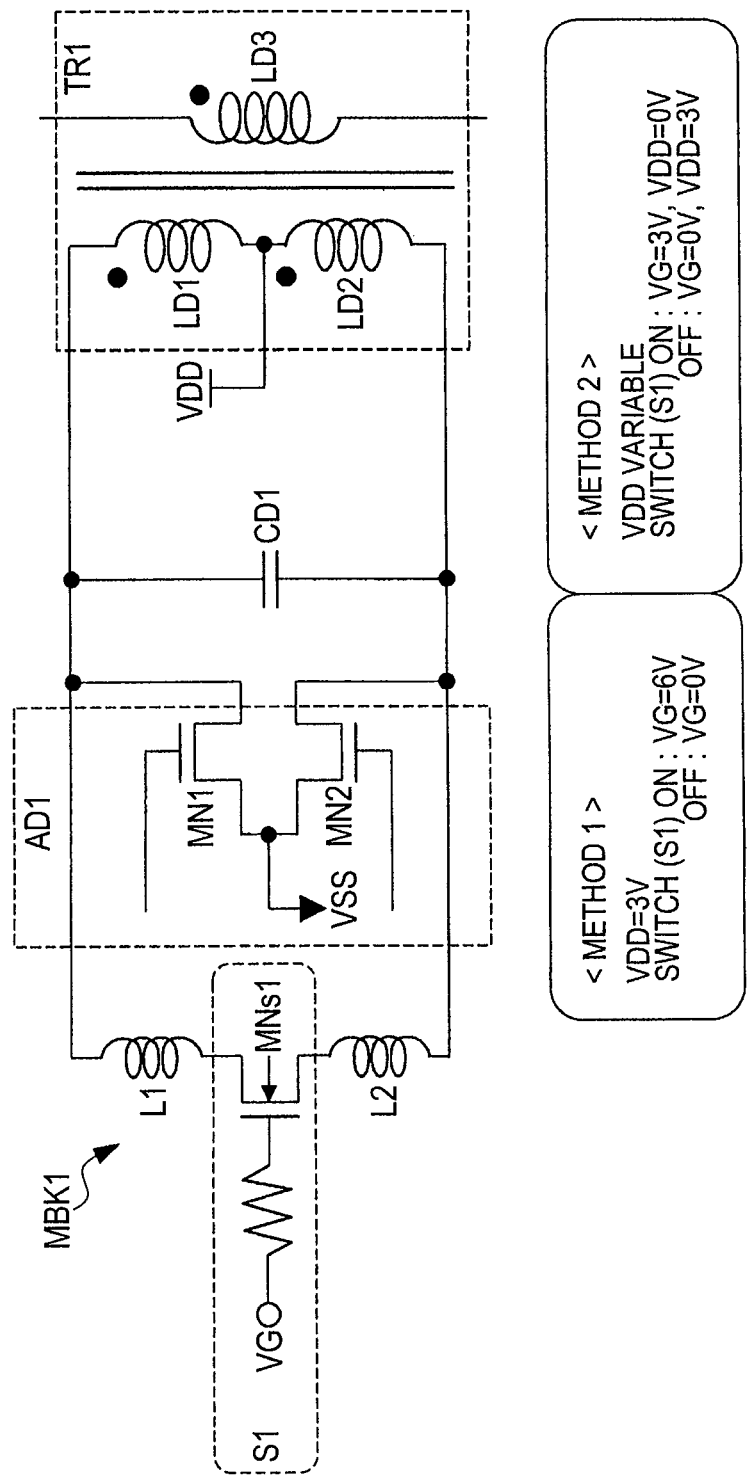
FIG. 31 is a circuit diagram showing an example of the configuration of a switch in an impedance correction block included in a high-frequency power amplifying device according to a fourteenth embodiment of the invention.

FIG. 31 is a circuit diagram showing a configuration example of a switch in an impedance correction block included in a high-frequency power amplifying device according to a fourteenth embodiment of the present invention. FIG. 31 shows an example in which, using FIG. 4 as an example, a differential amplifier AD1 is constructed by a differential pair of NMOS transistors MN1 and MN2, and a switch S1 in an impedance correction block MBK1 is constructed by an NMOS transistor MNs1 whose source-drain path is coupled between an end of an inductor L1 and an end of an inductor L2. A bias voltage VG is applied to the gate of MNs1.

In such a configuration example, there are two methods of controlling the on/off state of MNs1 by the bias voltage VG. In a first control method, a fixed power supply voltage VDD (for example, 3V) is supplied to the center tap of primary coils LD1 and LD2 of a transformer TR1. When MNs1 is on, for example, 6V is applied as the bias voltage VG. When MNs1 is off, for example, 0V is applied as the gate voltage VG. To the source and drain of MNs1, VDD is applied via the primary coils LD1 and LD2 and the inductors L1 and L2. By the first control method, VDD may be fixed and an effect that the control is easy is obtained. However, voltage higher than VDD has to be supplied as the bias voltage VG, and a circuit for supplying the voltage may be required.

In a second control method, the power supply voltage VDD to be supplied to the center tap is variable. When MNs1 is on, for example, 3V is applied as the bias voltage VG. For example, 0V is applied as VDD. When MNs1 is off, for example, 0V is applied as VG. For example, 3V is applied as VDD. By the second control method, an effect that a circuit for supplying voltage higher than VDD is unnecessary is obtained. However, a circuit for making VDD variable may be required.

Switch Configuration [2] of Impedance Correction Block

Figure 32:
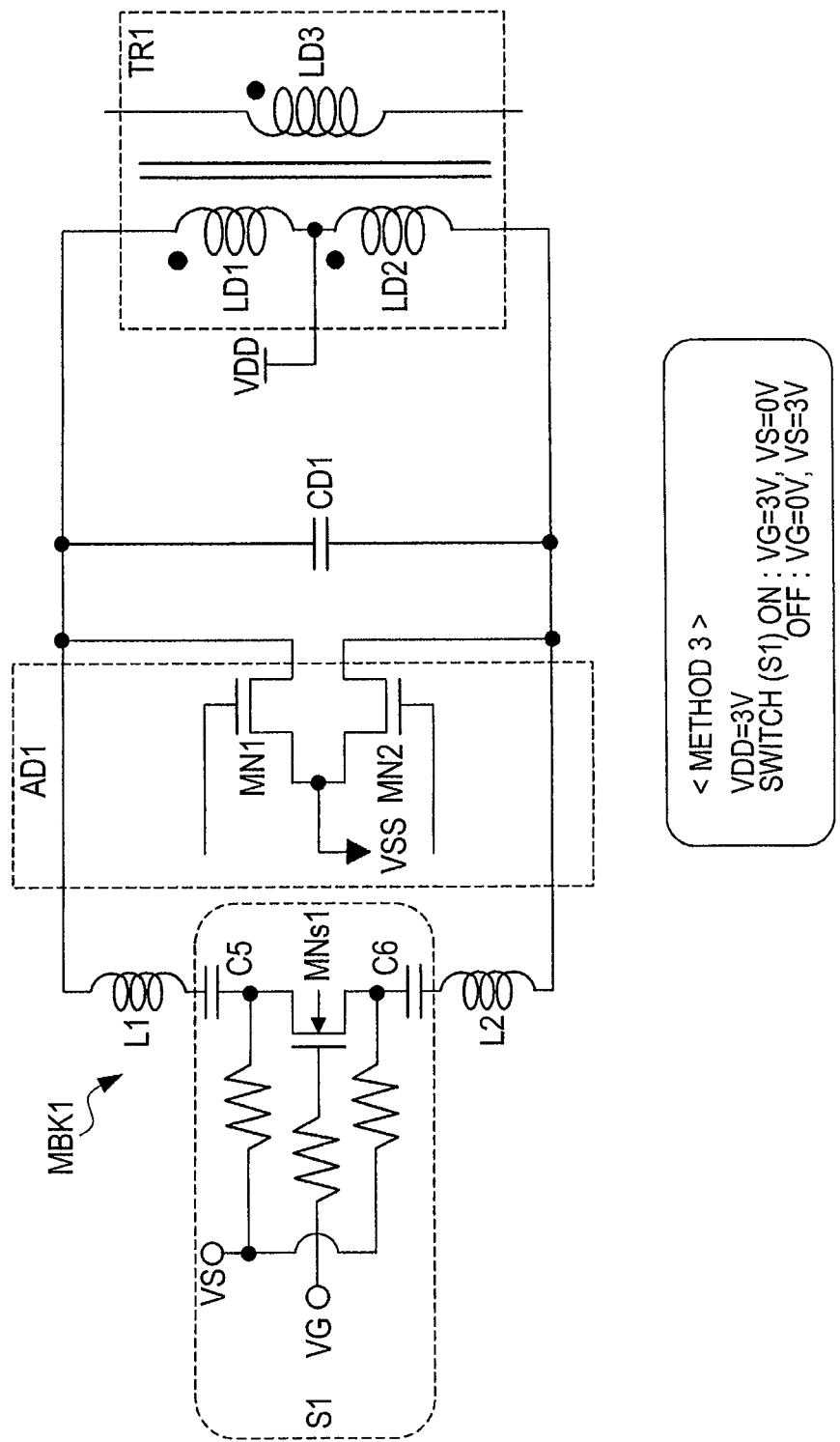
FIG. 32 is a circuit diagram showing another example of the configuration of the switch in the impedance correction block included in the high-frequency power amplifying device according to the fourteenth embodiment of the invention.

FIG. 32 is a circuit diagram showing another configuration example of the switch in the impedance correction block included in the high-frequency power amplifying device according to the fourteenth embodiment of the present invention. Different from FIG. 31, in FIG. 32, a capacitance C5 is coupled between one of the source and drain of the NMOS transistor MNs1 and one end of the inductor L1, and a capacitance C6 is coupled between the other one of the source and drain of MNs1 and one end of the inductor L2. The capacitances C5 and C6 are provided for interrupting DC coupling. Further, a line is led from the source and drain of MNs1 and source voltage VS is applied to the line.

In such a configuration example, when MNs1 is on, for example, 3V is applied as the bias voltage VG and 0V is applied as the source voltage VS. When MNs1 is off, for example, 0V is applied as VG and 3V is applied as VS. This third control method produces an effect that a circuit for supplying voltage higher than the power supply voltage VDD and a circuit for making VDD variable are unnecessary. However, to highly maintain the effect of turn-on/off of the switch, it is desirable to make the capacitance values of the capacitances C5 and C6 large, and the area occupied by the capacitances C5 and C6 may increase. Each of the capacitances C5 and C6 is realized by, for example, the MIM (Metal-Insulator-Metal) structure.

By using the configuration of the switch and the control method as described above, the switch can be realized on a semiconductor chip on which a differential amplifier and the like are formed. For the realization, a proper control method is selected from the above-described first to third control methods in accordance with a request. Although the configuration of the type 1 of FIG. 4 has been described as an example, switch configurations and control methods similar to FIGS. 31 and 32 can be applied also to the configuration of the type 2 of FIG. 5 and the configuration of the type 3 of FIG. 6. Obviously, the switch configurations and the control methods are not limited to the first to third control methods but can be properly changed using, for example, a PMOS transistor.

Fifteenth Embodiment

Configuration [1] of Wireless Communication System

Figure 33:
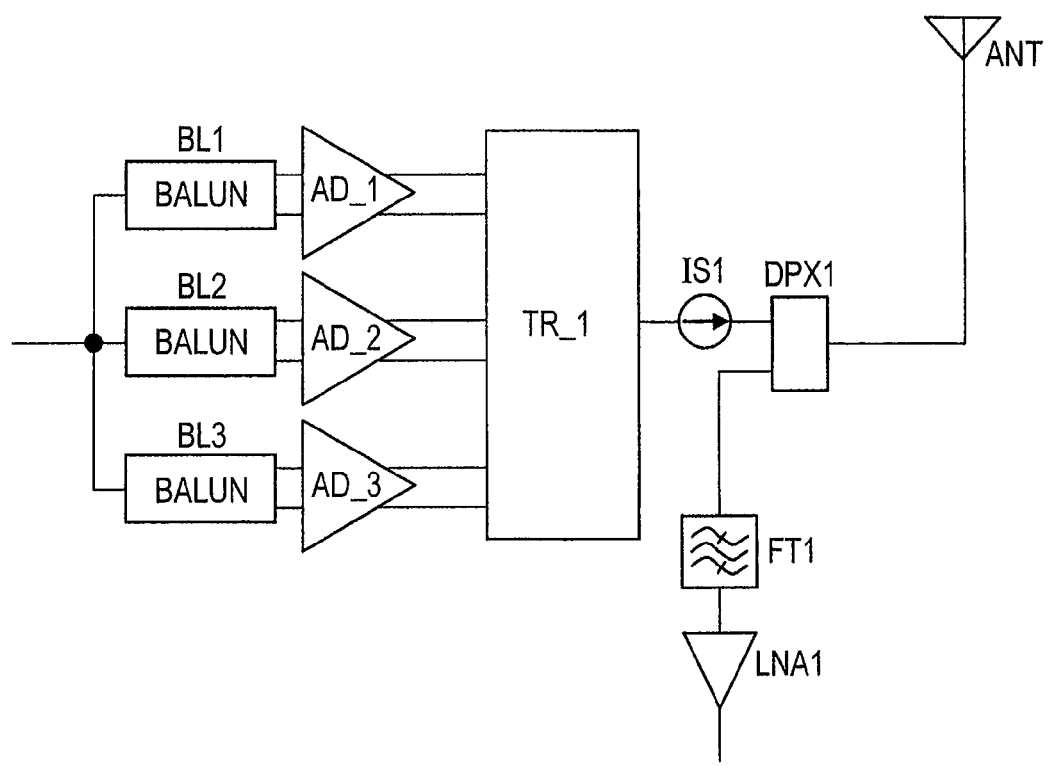
FIG. 33 is a block diagram showing an example of the configuration of a wireless communication system to which a high-frequency power amplifying device according to a fifteenth embodiment of the invention is applied.

FIG. 33 is a block diagram showing a configuration example of a wireless communication system to which a high-frequency power amplifying device according to a fifteenth embodiment of the invention is applied. FIG. 33 shows a configuration example of a transmitting and receiving part including an antenna in the wireless communication system adapted to three power modes by a single band. Shown in FIG. 33 are input baluns BL1, BL2, and BL3, differential amplifiers AD_1, AD_2, and AD_3, a transformer TR_1, an isolator IS1, a duplexer DPX1, a band pass filter FT1, a low-noise amplifier LNA1, and an antenna ANT.

To the part made by the differential amplifiers AD_1 to AD_3 and the transformer TR_1, the high-frequency power amplifying device as described in the sixth to twelfth embodiments is applied. As described in each of the embodiments, power in any of the high output mode, the intermediate output mode, and the low output mode is output from the transformer TR_1, and the output power is transmitted via the isolator IS1, the duplexer DPX1, and the antenna ANT. On the other hand, waves received by the antenna ANT are transmitted via the duplexer DPX1 and the band pass filter FT1 and amplified by the low noise amplifier LNA1.

Configuration [2] of Wireless Communication System

Figure 34:
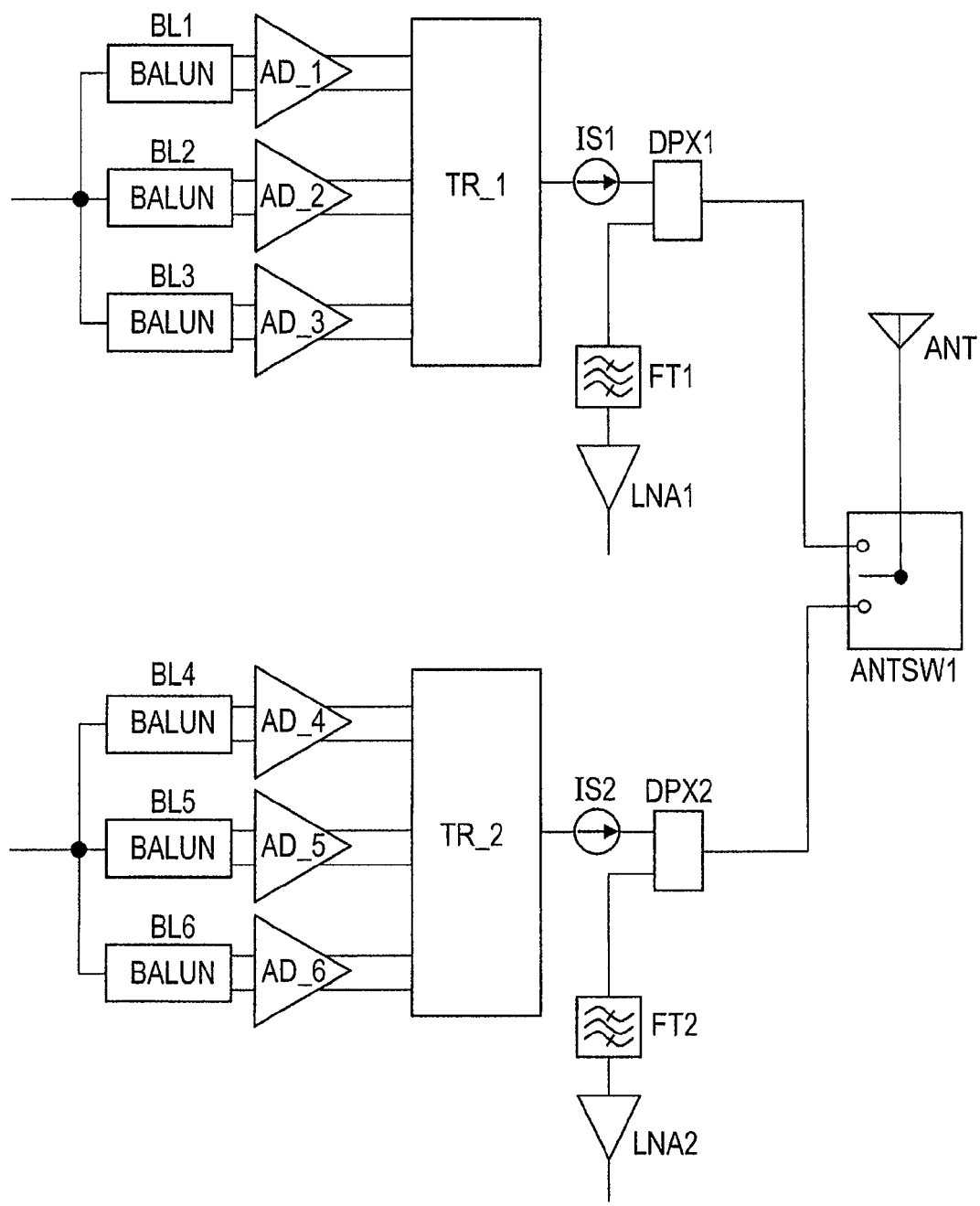
FIG. 34 is a block diagram showing another example of the configuration of a wireless communication system to which the high-frequency power amplifying device according to a fifteenth embodiment of the invention is applied.

FIG. 34 is a block diagram showing another configuration example of the wireless communication system to which the high-frequency power amplifying device according to the fifteenth embodiment of the invention is applied. FIG. 34 shows a configuration example of a transmitting and receiving part including an antenna in the wireless communication system adapted to three power modes in each of two bands. Shown in FIG. 34 are input baluns BL1 to BL6, differential amplifiers AD_1 to AD_6, transformers TR_1 and TR_2, isolators IS1 and IS2, duplexers DPX1 and DPX2, band pass filters FT1 and FT2, low-noise amplifiers LNA1 and LNA2, an antenna ANT, and an antenna switch ANTSW1.

To each of the part made by the differential amplifiers AD_1 to AD_3 and the transformer TR_1 and the part made by the differential amplifiers AD_4 to AD_6 and the transformer TR_2, the high-frequency power amplifying device as described in the sixth to twelfth embodiments is applied. The part made by AD_1 to AD_3 and TR_1 is for the band 1, and the part made by AD_4 to AD_6 and TR_2 is for the band 2. The antenna switch ANTSW1 couples any one of the duplexers DPX1 and DPX2 to the antenna ANT, thereby switching the bands. The flow of transmission/reception signals in each of the bands is similar to that in the case of FIG. 33.

Configuration [3] of Wireless Communication System

Figure 35:
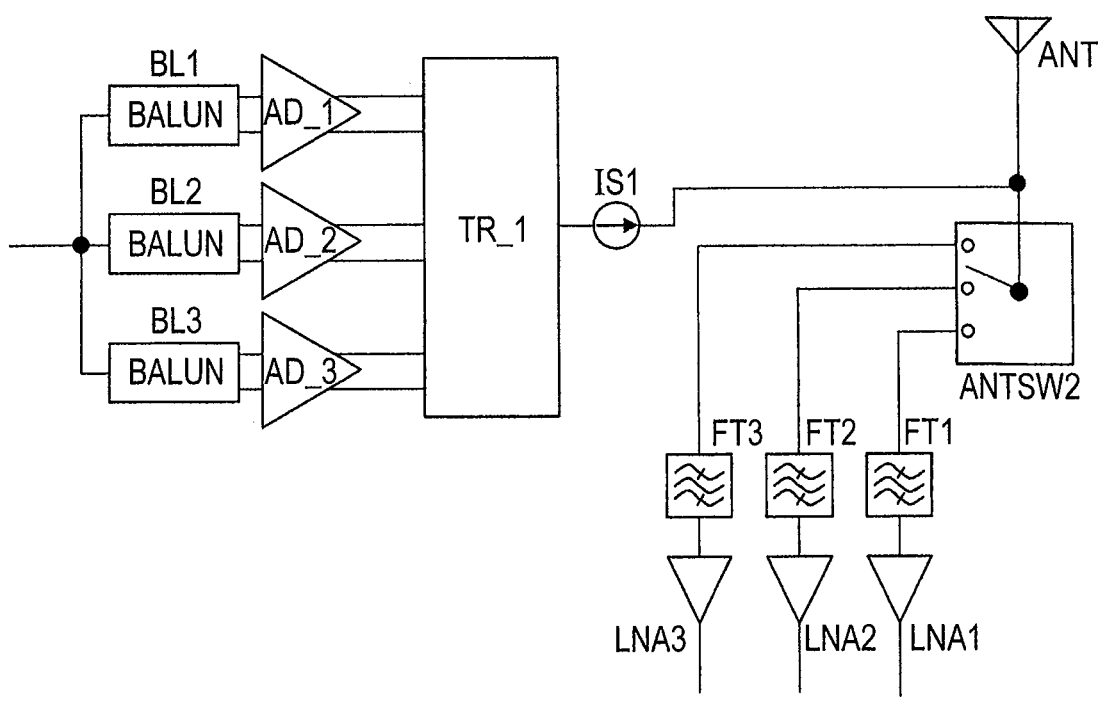
FIG. 35 is a block diagram showing further another example of the configuration of a wireless communication system to which the high-frequency power amplifying device according to the fifteenth embodiment of the invention is applied.

FIG. 35 is a block diagram showing further another configuration example of the wireless communication system to which the high-frequency power amplifying device according to the fifteenth embodiment of the invention is applied. FIG. 35 shows a configuration example of a transmitting and receiving part including an antenna in the wireless communication system adapted to three power modes. Shown in FIG. 35 are input baluns BL1 to BL3, differential amplifiers AD_1 to AD_3, a transformer TR_1, an isolator IS1, band pass filters FT1 to FT3, low-noise amplifiers LNA1 to LNA3, an antenna ANT, and an antenna switch ANTSW2.

To the part made by the differential amplifiers AD_1 to AD_3 and the transformer TR_1, a high-frequency power amplifying device as described in the thirteenth embodiment is applied. As described in the thirteenth embodiment, power in any of the bands 1 to 3 is output from TR_1 and transmitted via the isolator IS1 and the antenna ANT. A path of waves received by ANT is selected by the antenna switch ANTSW2 according to any of the bands 1 to 3. The wave is transmitted via any of the band pass filters FT1 to FT3 in accordance with the path and amplified in any of the low noise amplifiers LNA1 to LNA3.

As described above, by using the high-frequency power amplifying device according to the embodiment, in the wireless communication system adapted to the plural bands and/ or the plural power modes as shown in FIGS. 33 to 35, power can be transmitted at high efficiency toward the antenna. By using the transformer, the number of parts in the wireless communication system can be reduced, and the size of the wireless communication system can be reduced.

Although the present invention achieved by the inventors herein has been concretely described above on the basis of the embodiments, the invention is not limited to the foregoing embodiments but can be variously changed without departing from its gist.

For example, although the configuration examples of the typified high-frequency power amplifying devices using the types 1 to 3 have been described, obviously, the invention is not limited to the examples but a high-frequency power amplifying device different from the above-described devices can be also constructed by using at least one of the types 1 to 3. For example, it is also possible to form a configuration in which the types 2 and 3 are combined by employing a configuration obtained by coupling LD621 in parallel to the series coupling of LD622 and LD623 in FIG. 23, applying the function of type 2 to AD601, and providing each of AD602 and AD603 with both of the functions of the types 2 and 3. For example, using a configuration as shown in FIG. 24, a plurality of bands as described with reference to FIG. 30 can be also realized. Further, the high-frequency power amplifying device according to the present invention can be applied to various wireless communication systems including a cell phone, a wireless LAN, the Bluetooth (registered trademark), and UWB (Ultra Wide Band).

The characteristic configurations obtained by the high-frequency power amplifying devices of the foregoing embodiments will be summarized as follows.

(1) The high-frequency power amplifying device according to the embodiments has first to n-th (n is an integer of two or larger) differential amplifiers and a first transformer, the first transformer has first to n-th primary coils to which outputs of the first to n-th differential amplifiers are coupled and a first secondary coil to which the primary coils are magnetically coupled, and an inductor element and a switch element are coupled in series between differential outputs of at least one of the differential amplifiers (FIGS. 4, 7, 22 and so on).

(2) The high-frequency power amplifying device according to the embodiments has first to n-th (n is an integer of two or larger) differential amplifiers and a first transformer, the first transformer has first to n-th primary coils to which outputs of the first to n-th differential amplifiers are coupled and a first secondary coil to which the primary coils are magnetically coupled, an inductor element and a switch element are coupled in series between differential outputs of at least one of the differential amplifiers and, in parallel to the series coupling, a capacitance and a switch element are coupled in series (FIGS. 4, 10 and so on).

(3) The high-frequency power amplifying device according to the embodiments has first to n-th (n is an integer of two or larger) differential amplifiers and first to n-th transformers, outputs of the first to n-th differential amplifiers are coupled to primary coils of the first to n-th transformers, secondary coils of the first to n-th transformers are coupled in parallel, and an inductor and a switch element are coupled in series between differential outputs of at least one of the differential amplifiers (FIGS. 5, 12 and so on).

(4) The high-frequency power amplifying device according to the embodiments has first to n-th (n is an integer of two or larger) differential amplifiers and first to n-th transformers, outputs of the first to n-th differential amplifiers are coupled to primary coils of the first to n-th transformers, secondary coils of the first to n-th transformers are coupled in parallel, and a capacitance and a switch element are coupled in series between differential outputs of at least one of the differential amplifiers (FIGS. 5, 12, 14 and so on).

(5) The high-frequency power amplifying device according to the embodiments has first to n-th (n is an integer of two or larger) differential amplifiers and first to n-th transformers, outputs of the first to n-th differential amplifiers are coupled to primary coils of the first to n-th transformers, secondary coils of the first to n-th transformers are coupled in series, and an inductor and a switch element are coupled in series between differential outputs of at least one of the differential amplifiers (FIGS. 15, 23 and so on).

(6) The high-frequency power amplifying device according to the embodiments has first to n-th (n is an integer of two or larger) differential amplifiers and first to n-th transformers, outputs of the first to n-th differential amplifiers are coupled to primary coils of the first to n-th transformers, secondary coils of the first to n-th transformers are coupled in series, an inductor and a switch element are coupled in series between differential outputs of at least one of the differential amplifiers and, in parallel to the series coupling, a capacitance and a switch element are coupled in series (FIGS. 4, 15, 23 and so on).

(7) The high-frequency power amplifying device according to the embodiments has first to n-th (n is an integer of two or larger) differential amplifiers and first to n-th transformers, outputs of the first to n-th differential amplifiers are coupled to primary coils of the first to n-th transformers, secondary coils of the first to n-th transformers are coupled in series, and a switch element is coupled between differential outputs of at least one of the differential amplifiers (FIGS. 6, 18, 24 and so on).

(8) The high-frequency power amplifying device according to the embodiments has first to (m+n)th (each of m and n is an integer of one or larger) differential amplifiers and first to (n+1)th transformers, the first transformer has first to m-th primary coils to which outputs of the first to m-th differential amplifiers are coupled and a first secondary coil to which the primary coils are magnetically coupled, outputs of (n pieces of) the (m+1) to (m+n)th differential amplifiers are coupled to the primary coils of the second to (n+1)th transformers, respectively, the secondary coils of the first to (n+1)th transformers are coupled in parallel, and an inductor and a switch element are coupled in series between differential outputs of at least one of the first to (m+n)th differential amplifiers. This corresponds to a configuration obtained by, for example, changing the coupling between LD821 and LD822 in FIG. 25 to parallel coupling.

(9) The high-frequency power amplifying device according to the embodiments has first to (m+n)th (each of m and n is an integer of one or larger) differential amplifiers and first to (n+1)th transformers, the first transformer has first to m-th primary coils to which outputs of the first to m-th differential amplifiers are coupled and a first secondary coil to which the primary coils are magnetically coupled, outputs of (n pieces of) the (m+1) to (m+n)th differential amplifiers are coupled to the primary coils of the second to (n+1)th transformers, respectively, the secondary coils of the first to (n+1)th transformers are coupled in series, and an inductor and a switch element are coupled in series between differential outputs of at least one of the first to m-th differential amplifiers (FIGS. 25 to 28 and the like).

(10) In the configuration of the high-frequency power amplifying device according to the embodiment in (9), an inductor and a switch element are coupled in series between differential outputs of at least one of the (m+1) to (m+n)th differential amplifiers.

(11) In the configuration of the high-frequency power amplifying device according to the embodiment in (9), a switch element is coupled between differential outputs of at least one of the first to (m+n)th differential amplifiers.

(12) In the configuration of the high-frequency power amplifying device according to the embodiment in (9), a switch element is coupled between differential outputs of at least one of the (m+1)th to (m+n)th differential amplifiers.

(13) The high-frequency power amplifying device according to the embodiments has first to (m+n)th (each of m and n is an integer of one or larger) differential amplifiers and first and second transformers, the first transformer has first to m-th primary coils to which outputs of the first to m-th differential amplifiers are coupled and a first secondary coil to which the primary coils are magnetically coupled, the second transformer has (m+1)th to (m+n)th primary coils to which outputs of (n pieces of) the (m+1)th to (m+n)th differential amplifiers are coupled and a second secondary coil to which the primary coils are magnetically coupled, the secondary coils of the first and second transformers are coupled in parallel, and an inductor and a switch element are coupled in series between differential outputs of at least one of the first to (m+n)th differential amplifiers. This corresponds to a configuration obtained by, for example, providing two pieces of the configuration of FIG. 7 and coupling two primary coils in the configurations in parallel.

(14) The high-frequency power amplifying device according to the embodiments has first to (m+n)th (each of m and n is an integer of one or larger) differential amplifiers and first and second transformers, the first transformer has first to m-th primary coils to which outputs of the first to m-th differential amplifiers are coupled and a first secondary coil to which the primary coils are magnetically coupled, the second transformer has (m+1)th to (m+n)th primary coils to which outputs of (n pieces of) the (m+1)th to (m+n)th differential amplifiers are coupled and a second secondary coil to which the primary coils are magnetically coupled, the secondary coils of the first and second transformers are coupled in series, and an inductor and a switch element are coupled in series between differential outputs of at least one of the first to (m+n)th differential amplifiers. This corresponds to a configuration obtained by, for example, providing two pieces of the configuration of FIG. 7 and coupling two secondary coils in the configurations in series.

(15) In the configuration of the high-frequency power amplifying device according to the embodiment in (14), a switch element is coupled between differential outputs of at least one of the first to (m+n)th differential amplifiers.

(16) A high-frequency power amplifying device according to the embodiment has a plurality of differential amplifiers and a transformer including a primary coil to which outputs of the differential amplifiers are coupled, and an inductor and a switch element are coupled in series between differential outputs of at least, one of the differential amplifiers.

(17) A high-frequency power amplifying device according to the embodiment has a plurality of differential amplifiers and a transformer including a primary coil to which outputs of the differential amplifiers are coupled, and a capacitance and a switch element are coupled in series between differential outputs of at least one of the differential amplifiers.

(18) A high-frequency power amplifying device according to the embodiment has a plurality of differential amplifiers and a transformer including a primary coil to which outputs of the differential amplifiers are coupled, and a switch element is coupled between differential outputs of at least one of the differential amplifiers.

(19) In the configurations (1) to (18) of the high-frequency power amplifying device according to the embodiments, a switch element is made by an FET, a capacitance is coupled between one of differential outputs of the differential amplifier and one of a source and a drain of the FET, a capacitance is coupled between the other differential output and the other one of the source and the drain, and DC coupling between the FET and the differential outputs is interrupted (FIG. 32).

(20) In the configurations (1) to (18) of the high-frequency power amplifying device according to the embodiments, a switch element is made by an FET, power supply voltage which is supplied to a primary coil in a transformer is variable, in the case of turning off the switch coupled between the differential outputs of the differential amplifier, the power supply voltage is controlled to be high and, in the case of turning on the switch coupled between the differential outputs of the differential amplifier, the power supply voltage is controlled to be low (FIG. 31).

(21) In the configurations (1) to (18) of the high-frequency power amplifying device according to the embodiments, the differential amplifiers output signals of different power levels.

(22) In the configurations (1) to (18) of the high-frequency power amplifying device according to the embodiments, the differential amplifiers output signals of different frequencies.

(23) In the configurations (1) to (22) of the high-frequency power amplifying device according to the embodiments, only one of a plurality of differential amplifiers is in an operating state, the others are set in a non-operating state, a switch coupled between differential outputs of the differential amplifier in the operating state is controlled to be off, a transistor of the differential amplifier in the non-operating state is controlled to be off, and a switch coupled between differential outputs of the differential amplifier which is in the non-operating state is controlled to be on.

What is claimed is:

1. A high-frequency power amplifying device comprising:
    a first primary coil coupled between a first node A and a first node B;
    a first secondary coil which is magnetically coupled to the first primary coil;
    a first differential amplifier using the first node A and the first node B as differential output nodes and including transistors of a differential pair; and
    a first reactance element and a first switch coupled in series between the first node A and the first node B,
    wherein the first switch is controlled to be on when the first differential amplifier is controlled in a non-operating state, and the first switch is controlled to be off when the first differential amplifier is controlled in an operating state.

2. The high-frequency power amplifying device according to claim 1, wherein the transistors of the differential pair of the first differential amplifier are equivalently expressed as "off capacitance" when the first differential amplifier is controlled in the non-operating state, and the first reactance element is set to a reactance value so that a circuit formed when the first differential amplifier side expressed as the "off capacitance" is seen from both ends of the first primary coil at the time the first differential amplifier is controlled in the non-operating state looks like a parallel resonance circuit.

3. The high-frequency power amplifying device according to claim 2, wherein the first reactance element has a first inductor element A coupled between the first node A and one end of the first switch and a first inductor element B coupled between the first node B and the other end of the first switch.

4. The high-frequency power amplifying device according to claim 3, wherein power supply voltage is supplied to a midpoint of the first primary coil, the first switch has a transistor for switch, the high-frequency power amplifying device further comprises a first DC cut capacitance A inserted between one end of the transistor for switch and the first inductor element A, and a first DC cut capacitance B inserted between the other end of the transistor for switch and the first inductor element B, and the transistor for switch is controlled to be on/off by applying the power supply voltage and ground power supply voltage to a control input node of the transistor for switch and one end and the other end of the transistor for switch.

5. The high-frequency power amplifying device according to claim 2, further comprising:
    a second primary coil coupled between the second node A and the second node B and magnetically coupled to the first secondary coil; and
    a second differential amplifier using the second node A and the second node B as differential output nodes and including transistors of a differential pair,
    wherein size of the transistors in the differential pair of the second differential amplifier is smaller than that of the transistors in the differential pair of the first differential amplifier.

6. The high-frequency power amplifying device according to claim 5, further comprising a second reactance element and a second switch coupled in series between the second node A and the second node B, wherein the second switch is controlled to be on when the second differential amplifier is controlled in the non-operating state, the second switch is controlled to be off when the second differential amplifier is controlled in the operating state, the transistors of the differential pair of the second differential amplifier are equivalently expressed as "off capacitance" when the second differential amplifier is controlled in the non-operating state, and the second reactance element is set to a reactance value so that a circuit formed when the second differential amplifier side expressed as the "off capacitance" is seen from both ends of the second primary coil at the time the second differential amplifier is controlled in the non-operating state looks like a parallel resonance circuit.

7. The high-frequency power amplifying device according to claim 2, further comprising a third primary coil coupled between a third node A and a third node B and magnetically coupled to the first secondary coil;
    a third differential amplifier using the third node A and the third node B as differential output nodes and including transistors of a differential pair; and
    a third reactance element and a third switch coupled in series between the third node A and the third node B,
    wherein the first differential amplifier amplifies an input signal in a first frequency band, the third differential amplifier amplifies an input signal in a second frequency band different from the first frequency band, the third switch is controlled to be on when the third differential amplifier is controlled in a non-operating state and the third switch is controlled to be off when the third differential amplifier is controlled in an operating state, the transistors of the differential pair of the third differential amplifier are equivalently expressed as "off capacitance" when the third differential amplifier is controlled in the non-operating state, the third reactance element is set to a reactance value so that a circuit formed when the third differential amplifier side expressed as the "off capacitance" is seen from both ends of the third primary coil at the time the third differential amplifier is controlled in the non-operating state looks like a parallel resonance circuit, and the first reactance element is set to a reactance value so that a circuit formed when the first differential amplifier side expressed as the "off capacitance" is seen from both ends of the first primary coil at the time the first differential amplifier is controlled in the non-operating state looks like a parallel resonance circuit.

8. The high-frequency power amplifying device according to claim 2, wherein the first reactance element has second inductor elements A and B and a first capacitive element, the first switch has a first switch A and a first switch B, the second inductor element A is coupled between the first node A and one end of the first switch A, the second inductor element B is coupled between the first node B and the other end of the first switch A, the first capacitive element and the first switch B are coupled in series between the first node A and the first node B, the first switches A and B are controlled to be on when the first differential amplifier is controlled in the non-operating state and, the first switches A and B are controlled to be off when the first differential amplifier is controlled in the operating state.

9. The high-frequency power amplifying device according to claim 1, wherein the transistors of the differential pair of the first differential amplifier are equivalently expressed as "off capacitance" when the first differential amplifier is controlled in the non-operating state, and the first reactance element is set to a reactance value so that a circuit formed when the first second coil side is seen from both ends of the first secondary coil at the time the first differential amplifier is controlled in the non-operating state looks like a parallel resonance circuit.

10. The high-frequency power amplifying device according to claim 9, further comprising:
a fourth primary coil coupled between a fourth node A and a fourth node B;
a second secondary coil magnetically coupled to the fourth primary coil and coupled in parallel to the first secondary coil;
a fourth differential amplifier using the fourth node A and the fourth node B as differential output nodes and including transistors of a differential pair; and
a fourth reactance element and a fourth switch coupled in series between the fourth node A and the fourth node B,
wherein the fourth switch is controlled to be on when the fourth differential amplifier is controlled in a non-operating state, the fourth switch is controlled to be off when the fourth differential amplifier is controlled in an operating state,
the transistors of the differential pair of the fourth differential amplifier are equivalently expressed as "off capacitance" when the fourth differential amplifier is controlled in the non-operating state, and
the fourth reactance element is set to a reactance value so that a circuit formed when the second secondary coil side is seen from both ends of the second secondary coil at the time the fourth differential amplifier is controlled in the non-operating state looks like a parallel resonance circuit.

11. The high-frequency power amplifying device according to claim 1, wherein the high-frequency power amplifying device is formed on a single semiconductor chip.

12. A high-frequency power amplifying device comprising:
a first primary coil coupled between a first node A and a first node B and having a midpoint to which power supply voltage is supplied;
a first secondary coil which is magnetically coupled to the first primary coil;
a first differential amplifier using the first node A and the first node B as differential output nodes and including transistors of a differential pair; and
a first switch coupled between the first node A and the first node B,
wherein the first switch is controlled to be on when the first differential amplifier is controlled in a non-operating state, the first switch is controlled to be off when the first differential amplifier is controlled in an operating state, and
the transistors of the differential pair of the first differential amplifier are controlled to be off when the first differential amplifier is controlled in the non-operating state.

13. The high-frequency power amplifying device according to claim 12, further comprising:
a second primary coil coupled between a second node A and a second node B;
a second secondary coil magnetically coupled to the second primary coil and coupled in series to the first secondary coil;
a second differential amplifier using the second node A and the second node B as differential output nodes and including transistors of a differential pair; and
a second switch coupled between the second node A and the second node B,
wherein the second switch is controlled to be on when the second differential amplifier is controlled in the non-operating state, the second switch is controlled to be off when the second differential amplifier is controlled in the operating state, and
the transistors of the differential pair of the second differential amplifier are controlled to be off when the second differential amplifier is controlled in the non-operating state.

14. The high-frequency power amplifying device according to claim 13, wherein the high-frequency power amplifying device is formed on a single semiconductor chip.

15. A high-frequency power amplifying device comprising:
first to N-th (N denotes an integer of two or larger) differential amplifiers each including transistors of a differential pair;
first to N-th primary coils; and
a transformer including one or more secondary coils magnetically coupled to the first to N-th primary coils,
wherein a K-th (K=1, . . . , N) primary coil is coupled between differential output nodes of a K-th differential amplifier, and
a reactance element and a switch are coupled in series between differential output nodes of at least one differential amplifier in the first to N-th differential amplifiers.

16. The high-frequency power amplifying device according to claim 15,
wherein size of the transistors of the differential pair included in each of the first to N-th differential amplifiers varies among the first to N-th differential amplifiers, the differential amplifier having the smallest transistor size in the first to N-th differential amplifiers does not have the reactance element and the switch, and the differential amplifier having the largest transistor size in the first to N-th differential amplifiers has the reactance element and the switch.

17. The high-frequency power amplifying device according to claim 15, wherein in the first to N-th differential amplifiers, frequency bands of input signals are different from one another.

* * * * *